(12) United States Patent
Bromberger

(10) Patent No.: US 8,441,326 B1
(45) Date of Patent: May 14, 2013

(54) METHOD FOR DESIGNING AN ELECTRONIC CIRCUIT

(71) Applicant: Christoph Bromberger, Blaustein (DE)

(72) Inventor: Christoph Bromberger, Blaustein (DE)

( * ) Notice: Subject to any disclaimer, the term of this patent is extended or adjusted under 35 U.S.C. 154(b) by 0 days.

(21) Appl. No.: 13/660,732

(22) Filed: Oct. 25, 2012

Related U.S. Application Data

(63) Continuation of application No. PCT/EP2011/002074, filed on Apr. 24, 2011.

(30) Foreign Application Priority Data

Apr. 25, 2010 (DE) ...................... 10 2010 018 274.5

(51) Int. Cl.
*H03H 7/38* (2006.01)

(52) U.S. Cl.
USPC .......................................................... 333/32

(58) Field of Classification Search ................. 333/32, 333/33, 17.3
See application file for complete search history.

(56) References Cited

PUBLICATIONS

Gupta, "Escher's Art, Smith chart and hyperbolic geometry," IEEE Microwave Magazine, vol. 7, No. 5, pp. 66-76 (Oct. 1, 2006).
Bolinder, "Geometric-Analytic Theory of Transition Electrical Engineering," Proceedings of the IRE, vol. 46, No. 6, pp. 1124-1129 (Jun. 1, 1959).
Mittra et al., "An Impedance Transformation of a Two-Port Network," IRE, IEEE Transactions on Microwave Theory and Techniques, vol. 6, No. 1, pp. 13-19 (Jan. 1, 1962).
Dettmann et al., "Comparison of a Single-Ended Class AB, a Balance and a Doherty Power Amplifier," Microwave Conference Proceedings, APMC, vol. 2, pp. 1-4 (Dec. 4, 2005).
Jarnicki et al., Invariant Distances and Metrics in Complex Analysis—revisited, p. 7 (Feb. 2004).
Peters et al., Hyperbolische Geometrie, pp. 1-10 (Sep. 3, 2003).
Doherty, "A New High Efficiency Power Amplifier for Modulated Waves," Proc. of the IRE, vol. 24, No. 9, pp. 1163-1182 (Sep. 1936).
Raab et al., "Power Amplifiers and Transmitters for RF and Microwave," IEEE Trans. On Microwave Theory and Tech., vol. 50, No. 3, pp. 814-826 (Mar. 2002).
Kim et al., "The Doherty Power Amplifier," IEEE Microwave Magazine, pp. 42-50 (Oct. 2006).
Sweeney, "Practical Magic," IEEE Microwave Magazine, pp. 73-82 (Apr. 2008).
Pick, "Über eine Eigenschaft der konformen Abbildung kreisformer Bereiche" (On a property of conformal maping of circular regions), Mathematische Annalen, vol. 77, pp. 1-6 (1916).
Ferus, "Komplexe Analysis," pp. 18-26 (2008).

*Primary Examiner* — Stephen Jones
(74) *Attorney, Agent, or Firm* — Muncy, Geissler, Olds & Lowe, PLLC

(57) ABSTRACT

An electronic circuit and method for designing an electronic circuit is provided that includes a first source element, a second source element, a first matching network, and a second matching network. The first matching network and the second matching network are designed by means of a method using the Poincaré distance, in which the second source element is designed to output a signal with a center frequency, in which the load has a load impedance, in which the second matching network has line-like series elements that carry the signal. The line-like series elements only have line impedances less than the load impedance or a sum of the electrical lengths of the line-like series elements, each of which has a line impedance greater than the load impedance, is less than one quarter of a wavelength associated with the signal.

16 Claims, 12 Drawing Sheets

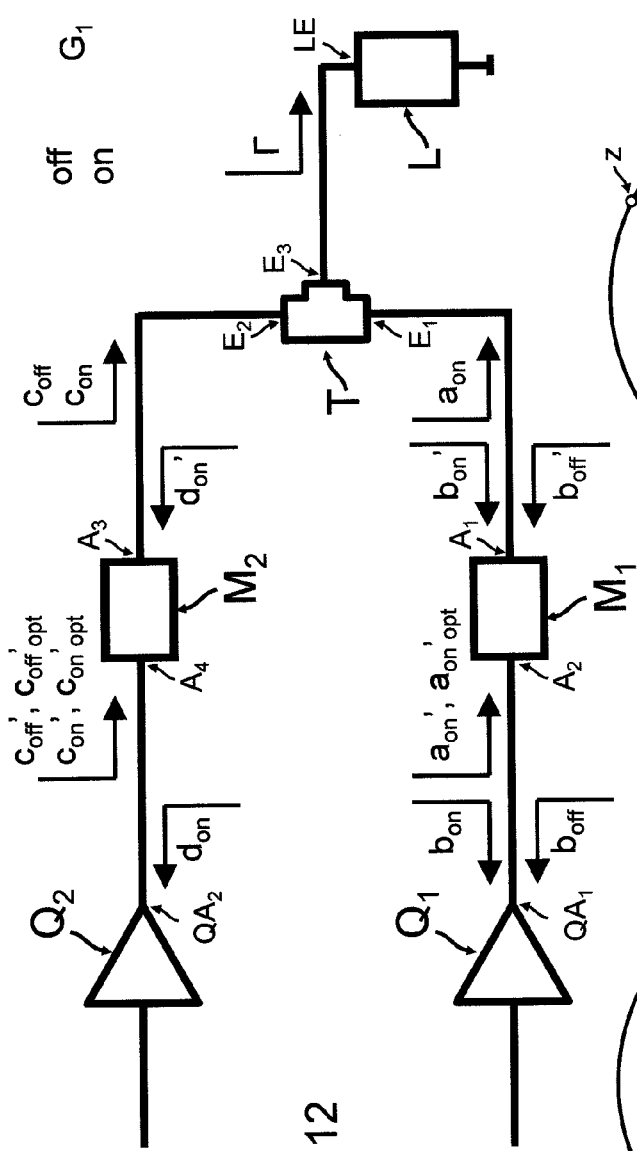
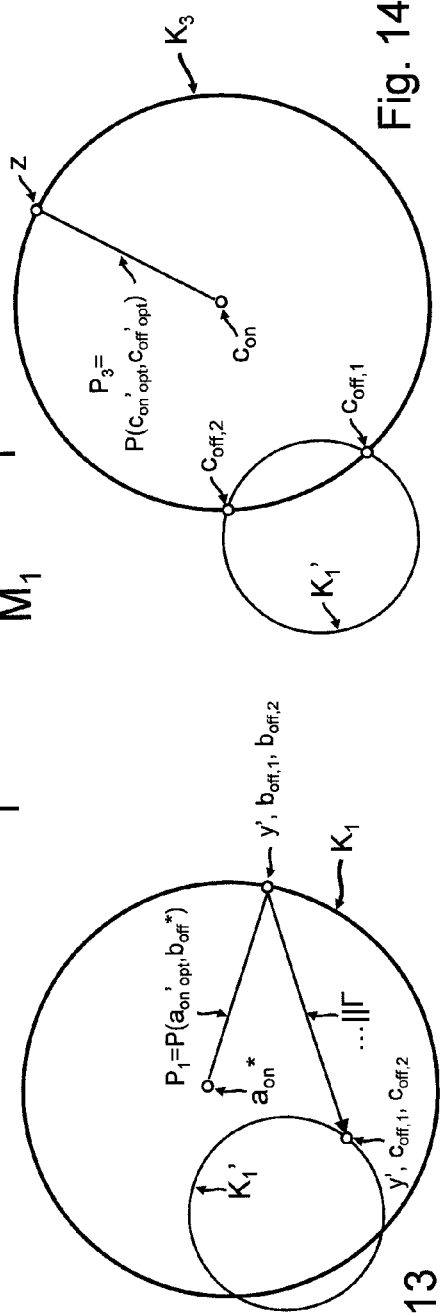
Fig. 12
Fig. 13
Fig. 14

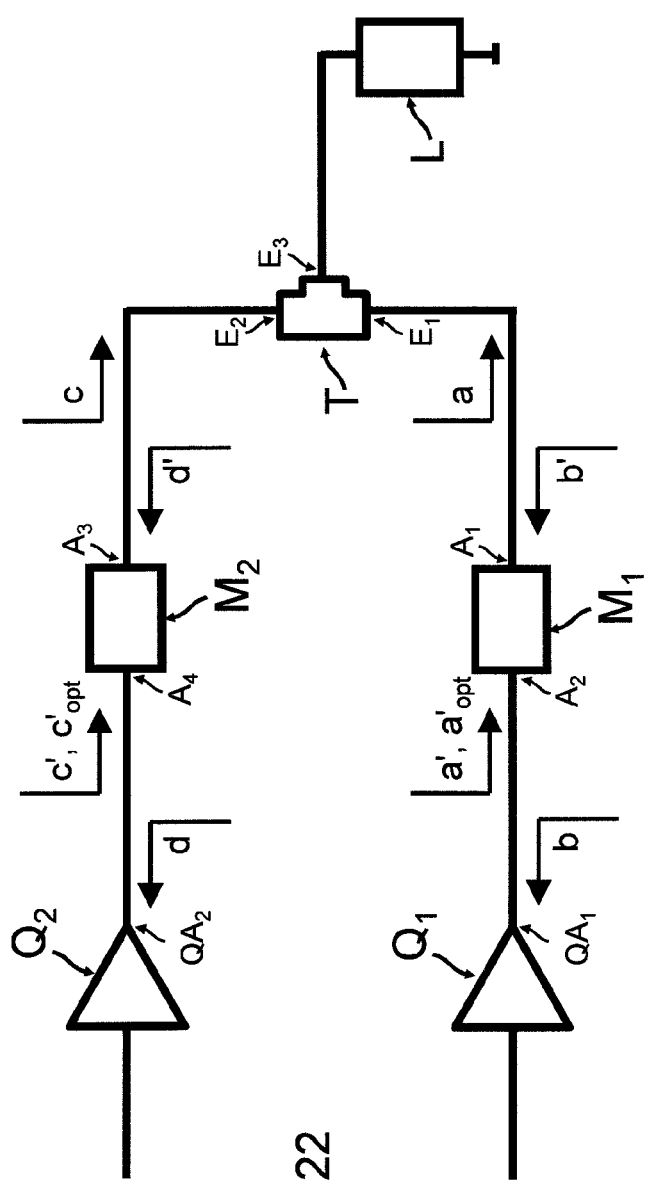
Fig. 22
Fig. 24
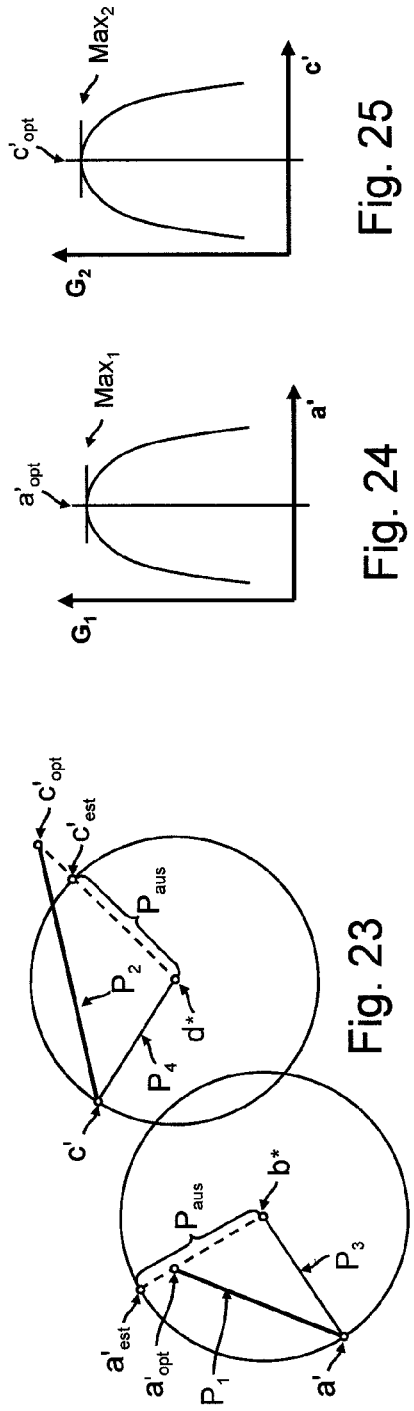
Fig. 25
Fig. 23

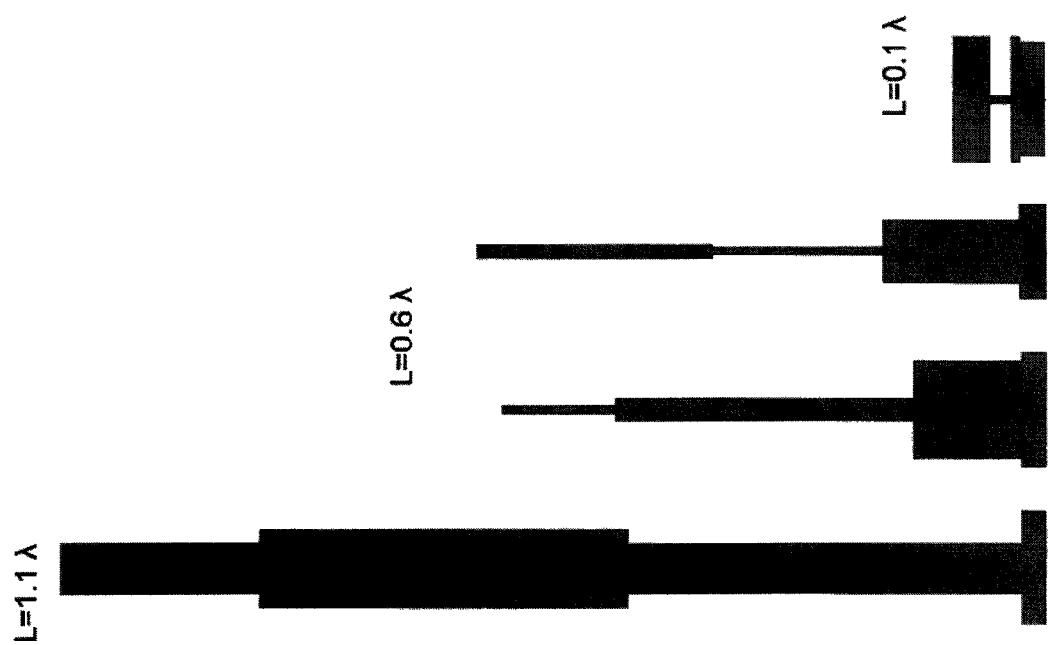

METHOD FOR DESIGNING AN ELECTRONIC CIRCUIT

This nonprovisional application is a continuation of International Application No. PCT/EP2011/002074, which was filed on Apr. 24, 2011, and which claims priority to German Patent Application No. DE 10 2010 018 274.5, which was filed in Germany on Apr. 25, 2010, and which are both herein incorporated by reference.

BACKGROUND OF THE INVENTION

1. Field of the Invention

The present invention concerns a method for designing an electronic circuit with a matching network.

2. Description of the Background Art

The fundamentals of conformal mapping of circular regions are known from "Über eine Eigenschaft der konformen Abbildung kreisförmiger Bereiche" (On a property of conformal mapping of circular regions), Georg Pick, Mathematische Annalen, Vol. 77, 1916, pages 1-6. The Poincaré disk model is known from sources such as, e.g., "Hyperbolische Geometrie" (Hyperbolic geometry), T. Peters, pages 6 and 7, Sep. 3, 2003. The Poincaré distance is known from "Invariant Distances and Metrics in Complex Analysis—revisited," M. Jarnicki, P. Pflug, page 7, February 2004. In addition, the Möbius transformation is known from the lecture notes "Komplexe Analysis," Prof. Dr. Dirk Ferus, 2008, pages 18 to 26. The Möbius transformation is used in Smith charts for high-frequency engineering, for instance. The operation of matching networks in circuits in high-frequency engineering can be represented graphically using the Smith chart.

Matching networks can be used in a Doherty power amplifier, for example. A Doherty power amplifier is known from, e.g., "The Doherty Power Amplifier," Bumman K. et al, IEEE Microwave Magazine, pages 42-50, October 2006, or "Practical Magic," R. Sweeney, IEEE Microwave Magazine, pages 73-82, April 2008, or "Power Amplifiers and Transmitters for RF and Microwave," F. H. Raab et al, IEEE Transactions on Microwave Theory and Techniques, Vol. 50, No. 3, pages 814-826, March 2002, or "A New High Efficiency Power Amplifier for Modulated Waves," W. H. Doherty, Proceedings of the Institute of Radio Engineers, Vol. 24, No. 9, pages 1163-1182, September 1936.

SUMMARY OF THE INVENTION

It is an object of the invention to improve a method for designing an electronic circuit to the greatest extent possible.

According to an embodiment, a method is provided for designing an electronic circuit to optimize a first parameter of the circuit. The first parameter of the circuit is, for example, an S-parameter, or a small-signal noise figure, or an effective input reflection factor, or an effective output reflection factor, or an effective output resistance, or a Rollett stability factor, or a power gain, or an nth order intermodulation product, or an nth order harmonic distortion, or a distortion factor, or an efficiency of the power gain, or a noise figure, or a compression point, or a compression gain, or a compression of the power gain, or an average of a small-signal parameter, or an integral of a small-signal parameter.

The circuit has a first matching network with a first connection and a second connection. The circuit has a load connected to the first connection. A first load reflection factor that depends on the load is achieved at the first connection of the first matching network. A first source element is connected to the second connection of the first matching network, wherein the first source element has a first source reflection factor. The first source element is, for example, an amplifier or a signal line. The load is, for example, an amplifier input or an antenna. The first load reflection factor and the first source reflection factor are determined by measurement or starting from a measurement, preferably in an automated fashion.

In circuit design, it becomes necessary to tune to one another the impedance levels of subsections or components that follow one another in the signal path.

This is a function of separate, interposed functional blocks, called matching networks. As a matching structure, the matching network can have an L structure and/or a T structure and/or a pi structure, for example.

A transformed first load reflection factor into the second connection of the first matching network, and a transformed first source reflection factor into the first connection of the first matching network are achieved by means of the first matching network. Preferably, the first matching network is reciprocal and lossless.

The method for designing the electronic circuit can be carried out fully automatically—in particular, under computer control. To this end, measurement data of elements of the circuit, such as transistors, impedances, and the like, are determined by measurements. The measurement data are entered in a program execution for calculating the elements of the matching network of the electronic circuit. By this means, it is possible to calculate the, e.g. capacitive or inductive, elements of the matching network. Human intervention in the method is not necessary, however.

The method for designing the circuit has multiple steps. In a first step, a first value of the transformed first source reflection factor and a second value of the transformed first load reflection factor are determined. Multiple subsidiary steps are provided for the determination of the first value and second value. A number of first distances are determined. In this context, the first distances are not Euclidean distances, but instead are what are known as Poincaré distances.

For each first distance from among the number of first distances, a first circle is determined as the set of all points at a first distance from the complex conjugate of the first load reflection factor. The first circle is defined by $$P(y, a_{on}^*) = \operatorname{arctanh}\left(\frac{|y - a_{on}^*|}{|1 - y^* a_{on}^*|}\right) \equiv P_R \qquad (1)$$

Here, $P(y, a_{on}^*)$ is the Poincaré distance, y is a point on the first circle, y* is the complex conjugate of a point on the first circle, a* is the complex conjugate of the first load reflection factor, and $P_R$ is the first distance.

For each first distance from among the number of first distances, a second circle is determined as the set of all points at a first distance from the complex conjugate of the first source reflection factor. The second circle is defined by $$P(x, b_{on}^*) = \operatorname{arctanh}\left(\frac{|x - b_{on}^*|}{|1 - x^* b_{on}^*|}\right) \equiv P_R \qquad (2)$$

Here, $P(y, b_{on}^*)$ is the Poincaré distance, x is a point on the second circle, x* is the complex conjugate of a point on the second circle, b* is the complex conjugate of the first source reflection factor, and $P_R$ is the first distance.

In the method, an arbitrary or predefinable number of first point pairs is determined. A first pair point of each point pair is on the first circle. A second pair point of each point pair is on the second circle.

A value for the first parameter is determined for each first point pair. The first pair point is equal to a value of the transformed first source reflection factor. A second pair point is equal to a value of the transformed first load reflection factor.

An optimum of the first parameter is determined from all values of the first parameter that are associated with the first point pairs. A first value pair is determined from the first point pairs, wherein the optimum of the parameter is associated with the first value pair. The optimum is a local or global minimum or maximum of the parameter. It is advantageous to determine a suboptimum for each circle in an intermediate step. The optimum for all circles can subsequently be determined from the suboptima.

A first value of the transformed first source reflection factor equal to a first value point of the first value pair is determined. A second value of the transformed first load reflection factor equal to a second value point of the first value pair is determined. The determination can take place by means of calculation using models and/or measurements of the parameters of the circuit, for example.

In a subsequent step of the method, a determination of the first matching network takes place using the first value of the transformed first source reflection factor, the second value of the transformed first load reflection factor, the first source reflection factor, and the first load reflection factor. The step of determining the first matching network can likewise be performed in an automated fashion. For example, a topology, which is to say the arrangement of the capacitances and inductances of the first matching network, is selected. Subsequently, the capacitance values and the inductance values of the first matching network are calculated from the first value of the transformed first source reflection factor, the second value of the transformed first load reflection factor, the first source reflection factor, and the first load reflection factor.

The refinements described below also relate to the method described above.

According to an especially advantageous refinement, the method has additional steps. In this context, a first function is defined that describes the transforming action of the first matching network in the forward direction. The forward direction here is defined as proceeding from the source element toward the load. The first function is defined by $$f_{a_{on},a'_{on},\varphi}(z_1) = e^{i\varphi}\frac{z_1 - z_0}{1 - z_0^* z_1} \quad (3)$$

with $$z_0 = \frac{1 - |a_{on}|^2}{|a_{on}|^2|a'_{on}|^2 - 1}a'_{on}e^{-i\varphi} - \frac{1 - |a'_{on}|^2}{|a_{on}|^2|a'_{on}|^2 - 1}a_{on} \quad (4)$$

In the first function, $a_{on}$ is the first load reflection factor, $a_{on}'$ is the transformed first load reflection factor, and $\varphi \in [0 \ldots 2\pi[$ is a parameter. The imaginary number i is defined by $$i = \sqrt[2]{-1},$$

and $z_1$ is a first argument of the first function.

In addition, a second function is determined that describes the transforming action of the first matching network in the reverse direction. In this context, the reverse direction is defined as proceeding from the load toward the source element. The second function is defined by $$f^R_{a_{on},a'_{on},\varphi}(z_2) = e^{i\varphi}\frac{z_2 - z_0^R}{1 - z_0^{R*} z_2} \quad (5)$$

with $$z_0^R = \frac{1 - |a'^*_{on}|^2}{|a'^*_{on}|^2|a^*_{on}|^2 - 1}a^*_{on}e^{-i\varphi} - \frac{1 - |a^*_{on}|^2}{|a'^*_{on}|^2|a^*_{on}|^2 - 1}a'^*_{on} \quad (6)$$

Here, $a_{on}$ is the first load reflection factor, $a_{on}$* is the complex conjugate of the first load reflection factor, $a_{on}'$ is the transformed first load reflection factor, $a_{on}'$* is the complex conjugate of the transformed first load reflection factor, $\varphi \in [0 \ldots 2\pi[$ is once again the parameter already mentioned above, and $z_2$ is a second argument of the second function.

According to an embodiment of the method, the above-described method has additional steps. Here, a value of the parameter $\varphi \in [0 \ldots 2\pi[$ is determined for the optimum of the first parameter. The optimum is, for example, a minimum of the first parameter, when the first parameter is, e.g., a distortion factor. The optimum can also be a maximum of the first parameter—such as a power gain, for example.

To determine the value of the parameter, the number of first distances is equal to one. The first distance is determined between the transformed first load reflection factor and the complex conjugate of the first source reflection factor. In this refinement, the transformed first load reflection factor is predetermined or fixed.

The first distance here is defined as the Poincaré distance by $$P_{a'_{on},b^*_{on}} = \text{arctanh}\left(\frac{|a'_{on} - b^*_{on}|}{|1 - b_{on}a'_{on}|}\right) \equiv P_R \quad (7)$$

Here, $b_{on}$ is the first source reflection factor, $b_{on}$* is the complex conjugate of the first source reflection factor, $a_{on}'$ is the transformed first load reflection factor, and $P_R$ is the first distance.

The value of the parameter is determined, wherein, for the value of the parameter, the second function with the first source reflection factor as its second argument assumes the first value of the transformed first source reflection factor as the function value.

The first value of the transformed first source reflection factor is determined as a point on the first circle, wherein the first parameter is an optimum at the point. To this end, for example, the parameter is determined for each of a number of points on the first circle. For example, the point associated with the maximal parameter is determined as the transformed first source reflection factor.

Thereafter, the value of the parameter is determined. For the value of the parameter, the second function with the first source reflection factor as its second argument assumes the first value determined of the transformed first source reflection factor as the function value. In this case, the following applies:

$$f^R_{a_{on},a_{on}',\varphi_{opt}}(b_{on}) = b_{on}'{}_{opt} \quad (8)$$

Subsequently, the first matching network is determined using the first function for the value of the parameter. Here, the particular transforming action is sought that uniquely describes the matching network that maps the first load reflection factor onto the transformed first load reflection factor and maps the first source reflection factor onto the transformed first source reflection factor. In this context, the transformed first load reflection factor and the transformed first source reflection factor may be identical to the first value determined or the second value determined, respectively.

In an embodiment, the first parameter is the mismatch between the first transformed source reflection factor and the first load reflection factor.

According to another embodiment, a predetermined mismatch between the first transformed source reflection factor and the first load reflection factor is a part of the first parameter as boundary condition.

Accordingly, a method is provided for designing an electronic circuit to optimize a second parameter of the circuit. The second parameter can match the first parameter or can be different therefrom. The second parameter is, for example, an S-parameter, or a small-signal noise figure, or an effective input reflection factor, or an effective output reflection factor, or an effective output resistance, or a Rollett stability factor, or a power gain, or an nth order intermodulation product, or an nth order harmonic distortion, or a distortion factor, or an efficiency of the power gain, or a noise figure, or a compression point, or a compression gain, or a compression of the power gain, or an average of a small-signal parameter, or an integral of a small-signal parameter.

The terms second, third, etc., used hereinafter have the sole purpose of better clarity, and do not presuppose a first connection, first element, etc.

The circuit has a second matching network with a third connection and a fourth connection.

The circuit has, connected to the third connection, a variable load with a first operating state and a second operating state. The variable load has a third load reflection factor in the first operating state and a second load reflection factor in the second operating state.

The circuit preferably has a second source element with a second source reflection factor connected to the fourth connection.

By means of the second matching network, a transformed third load reflection factor into the fourth connection is achieved in the first operating state, and a transformed second load reflection factor is achieved in the second operating state. Preferably, the transformed second source reflection factor into the third connection is achieved by means of the second matching network.

For example, the transformed second load reflection factor, and the transformed third load reflection factor, and the second load reflection factor are predetermined by requirements from the circuit—for example, matching the second source reflection factor.

The method has multiple steps. In the method, a third value of the third load reflection factor and a fourth value of the second load reflection factor are determined. To this end, a third distance between the transformed second load reflection factor and the transformed third load reflection factor is determined first. The third distance is defined by $$P_3 = \operatorname{arctanh}\left(\frac{|c'_{off} - c'_{on}|}{|1 - c'^*_{off} c'_{on}|}\right) \quad (9)$$

Here, $c_{on}'$ is the transformed second load reflection factor, $c_{off}'$ is the transformed third load reflection factor, $c_{on}'^*$ is the complex conjugate of the transformed second load reflection factor, and $P_3$ is the third distance.

Thereafter, a third circle is determined as the set of all points at the third distance from the second load reflection factor. The third circle is defined by $$P(z, c_{on}) = \operatorname{arctanh}\left(\frac{|z - c_{on}|}{|1 - z^* c_{on}|}\right) \equiv P_3 \quad (10)$$

Here, $P(z, c_{on})$ is the Poincaré distance, z is a point on the third circle, $z^*$ is the complex conjugate of the point on the third circle, $c_{on}$ is the second load reflection factor, $c_{on}^*$ is the complex conjugate of the second load reflection factor, and $P_3$ is the third distance.

In the method, a number of second point pairs is determined. A second pair point of each point pair is a point on the third circle.

A value for the second parameter is determined for each second point pair. A value of the third load reflection factor is equal to the second pair point. A value of the second load reflection factor is equal to the first pair point. For the determination, the value of the second parameter is calculated, for example.

In the method, an optimum of the second parameter is determined from all values of the second parameter. In so doing, the values of the second parameter are associated with the point pairs. The optimum is a local or global minimum or maximum of the parameter.

Thereafter, a second point pair associated with the optimum is determined. The third value of the third load reflection factor is determined as equal to a second pair point, associated with the optimum, of the second point pair associated with the optimum. The fourth value of the second load reflection factor is determined as equal to a first pair point, associated with the optimum, of the second point pair associated with the optimum.

In a subsequent step of the method, a determination of the second matching network takes place using the third value of the third load reflection factor, the fourth value of the second load reflection factor, the transformed second load reflection factor, and the transformed third load reflection factor. The step of determining the second matching network can likewise be performed in an automated fashion. For example, a topology, which is to say the arrangement of the capacitances and inductances of the second matching network, is selected. Subsequently, the capacitance values and the inductance values of the second matching network are calculated from the third value of the third load reflection factor, the fourth value of the second load reflection factor, the transformed second load reflection factor, and the transformed third load reflection factor.

Accordingly, a method is provided for designing an electronic circuit. The circuit has a first operating state and a second operating state. The circuit has a first source element with a first source output and a second source element with a second source output. Preferably, the first source element is a first amplifier and the second source element is a second amplifier. Preferably, the first amplifier and the second amplifier are components of a Doherty amplifier. The first amplifier and/or the second amplifier preferably have an LDMOS transistor for gain.

In the first operating state, the first source element has a first source reflection factor into the first source output.

The circuit has a load with a load input. The load has a load input reflection factor into the load input. Accordingly, the load has a load impedance.

The circuit has a T-section with a first input, a second input, and an output. The load input of the load is connected to the output of the T-section. The T-section is preferably a T-shaped conductor that preferably is made of metal. The T-section is integrated on a semiconductor chip, for example.

The T-section has a first load reflection factor into the first input in the second operating state. The T-section has a second load reflection factor into the second input in the first operating state. The T-section has a third load reflection factor into the second input in the second operating state.

The circuit has a first matching network with a first connection and a second connection. The first connection is connected to the first input of the T-section. The second connection is connected to the first source output of the first source element.

In the first operating state, the first matching network has a transformed first source reflection factor into the first connection. In the second operating state, the first matching network has a transformed first load reflection factor into the second connection.

The circuit has a second matching network with a third connection and a fourth connection. The third connection is connected to the second input of the T-section.

The fourth connection of the second matching network is connected to the second source output.

In the first operating state, the second matching network has a transformed second load reflection factor into the fourth connection. In the second operating state, the second matching network has a transformed third load reflection factor into the fourth connection.

A first value of the transformed first load reflection factor is determined for optimizing a parameter of the circuit in that a measurement is carried out in the second operating state. A second value of the transformed second load reflection factor is determined for optimizing the parameter of the circuit in that a measurement is carried out in the first operating state. A third value of the transformed third load reflection factor is determined for optimizing the parameter of the circuit in that a measurement is carried out in the second operating state.

In the method, the first load reflection factor is set to a first initial value. The first initial value can be set arbitrarily or using the load input reflection factor, for example. Likewise, the second load reflection factor is set to a second initial value. The second initial value can be set arbitrarily or using the load input reflection factor, for example.

The method has multiple steps. In one step, a first distance between the first value and the complex conjugate of the first source reflection factor is determined by $$P_1 = \operatorname{arctanh}\left(\frac{|a^*_{on\,opt} - b^*_{off}|}{|1 - b^*_{off} a^{\prime*}_{on\,opt}|}\right) \quad (11)$$

Here, $b_{off}$ is the first source reflection factor, $b_{off}^*$ is the complex conjugate of the first source reflection factor, $a'_{on\,opt}$ is the first value of the transformed first load reflection factor, and $P_1$ is the first distance.

In another step, a first circle is determined as the set of all points at the calculated first distance from the complex conjugate of the first load reflection factor by $$P(y, a^*_{on}) \operatorname{arctanh}\left(\frac{|y - a^*_{on}|}{|1 - y^* a^*_{on}|}\right) \equiv P_1 \quad (12)$$

Here, y is a point on the first circle, y* is the complex conjugate of the point on the first circle, $a_{on}^*$ is the complex conjugate of the first load reflection factor, and $P_1$ is the first distance.

In another step, a third distance between the second value and the third value is determined by $$P_3 = \operatorname{arctanh}\left(\frac{|c'_{on\,opt} - c'_{off\,opt}|}{|1 - c^{\prime*}_{on\,opt} c'_{off\,opt}|}\right) \quad (13)$$

Here, $c'_{off\,opt}$ is the second value of the transformed second load reflection factor, $c'_{on\,opt}$ is the third value of the transformed third load reflection factor, and $c^{\prime*}_{on\,opt}$ is the complex conjugate of the third value of the transformed third load reflection factor.

In another step, a third circle is determined as the set of all points at the third distance from the third load reflection factor by $$P(z, c_{on}) = \operatorname{arctanh}\left(\frac{|z - c_{on}|}{|1 - z^* c_{on}|}\right) \equiv P_3 \quad (14)$$

Here, z is a point on the third circle, z* is the complex conjugate of the point on the third circle, $c_{on}$ is the third load reflection factor, $c_{on}^*$ is the complex conjugate of the third load reflection factor, and $P_3$ is the third distance.

In the method, a modified first circle is determined. This modified first circle can also be called an image circle. In this context, the modified first circle is determined as the set of all modified reflection factors, wherein an overall impedance is associated with each of the modified reflection factors. Each overall impedance is determined from a first parallel circuit of a load impedance of the load and an impedance associated with a reflection factor on the first circle. Here, the load impedance is associated with the load input reflection factor of the load.

In the method, at least one fourth value of the second load reflection factor is determined, wherein a sum of squares of the distances between the fourth value and the third circle and between the fourth value and the modified first circle is minimized for the at least one fourth value.

In the method, a fifth value of the transformed first source reflection factor is determined for each fourth value of the second load reflection factor. In this process a fourth impedance is determined, wherein the fourth impedance is associated with the fourth value of the second load reflection factor. A fifth impedance is determined so that a second parallel circuit of the fifth impedance with the load impedance is equal to the fourth impedance, wherein the fifth value of the transformed first source reflection factor is associated with the fifth impedance.

In the method, the first matching network is determined using the first load reflection factor, the first value of the transformed first load reflection factor, the first source reflection factor, and the fifth value of the transformed first source reflection factor.

In the method, the second matching network is determined using the second value of the transformed second load reflection factor, the third value of the transformed third load reflection factor, the third load reflection factor, and the fourth value of the second load reflection factor.

Accordingly, a method for designing an electronic circuit is provided. The circuit has a first source element with a first source output and with a first source reflection factor.

The circuit has a second source element with a second source output and with a second source reflection factor. The circuit also has a load. The load can be composed of one or more elements. The circuit has a T-section with a first input, and a second input, and an output.

The T-section has a first load reflection factor into the first input. The T-section has a second load reflection factor into the second input. The output of the T-section is connected to the load.

The circuit has a first matching network with a first connection and a second connection. The second connection of the first matching network is connected to the first source output of the first source element. The first connection of the first matching network is connected to the first input of the T-section.

By means of the first matching network, a transformed first load reflection factor into the second connection and a transformed first source reflection factor into the first connection are achieved.

The circuit has a second matching network with a third connection and a fourth connection. The fourth connection of the second matching network is connected to the second source output of the second source element. The third connection of the second matching network is connected to the second input of the T-section.

By means of the second matching network, a transformed second load reflection factor into the fourth connection and a transformed second source reflection factor into the third connection are achieved.

A first value of the transformed first load reflection factor is determined. The first source element has a first optimum of a first parameter for the first value of the transformed first load reflection factor acting at the first source output. Thus, if the first source output is precisely terminated with the first transformed load reflection factor, the first parameter is minimal or maximal, for example. In accordance with a boundary condition, the first value of the transformed first load reflection factor differs from the complex conjugate of the first source reflection factor.

A second value of the transformed second load reflection factor is determined. The second source element has a second optimum of a second parameter for the second value of the transformed second load reflection factor acting at the second source output. Here, the second value of the transformed second load reflection factor differs from the complex conjugate of the second source reflection factor. Preferably the first parameter and the second parameter are equal.

Under the stated boundary conditions, the steps of the method are a significant part of the invention. The method for designing the electronic circuit is carried out fully automatically—in particular, under computer control. To this end, measurement data of elements of the circuit, such as transistors, impedances, and the like, are determined by measurements. The measurement data are entered in a program execution for calculating the elements of the matching networks of the electronic circuit. By this means, it is possible to calculate the, e.g. capacitive or inductive, elements of the matching network. Human intervention in the method is not necessary, however. The matching networks are subsequently integrated onto a chip together with other circuit components, for example.

The method for designing the electronic circuit has multiple steps.

In one step, a distance value, and a third value of the transformed first load reflection factor, and a fourth value of the transformed second load reflection factor are determined. To this end, a first distance between the first value and the transformed first load reflection factor is defined by $$P_1 = \operatorname{arctanh}\left(\frac{|a'_{opt} - a'|}{|1 - a'^* a'_{opt}|}\right) \quad (15)$$

Here, $P_1$ is the first distance, a' is the transformed first load reflection factor, a'* is the complex conjugate of the transformed first load reflection factor, and $a'_{opt}$ is the first value.

To this end, a second distance between the second value and the transformed second load reflection factor is defined by:

$$P_2 = \operatorname{arctanh}\left(\frac{|c'_{opt} - c'|}{|1 - c'^* c'_{opt}|}\right) \quad (16)$$

Here, $P_2$ is the second distance, c' is the transformed second load reflection factor, c'* is the complex conjugate of the transformed second load reflection factor, and $c'_{opt}$ is the second value.

To this end, a third distance between the transformed first load reflection factor and the complex conjugate of the first source reflection factor is defined by:

$$P_3 = \operatorname{arctanh}\left(\frac{|a' - b^*|}{|1 - ba'|}\right) \quad (17)$$

Here, $P_3$ is the third distance, b is the first source reflection factor, b* is the complex conjugate of the first source reflection factor, and a' is the transformed first load reflection factor.

To this end, a fourth distance between the transformed second load reflection factor and the complex conjugate of the second source reflection factor is defined by:

$$P_4 = \operatorname{arctanh}\left(\frac{|c' - d^*|}{|1 - dc'|}\right) \quad (18)$$

Here, $P_4$ is the fourth distance, d is the second source reflection factor, d* is the complex conjugate of the second source reflection factor, and c' is the transformed second load reflection factor. The first distance, the second distance, the third distance, and the fourth distance can also be referred to as Poincaré distances.

In another step, the distance value, and the third value, and the fourth value are defined in that a minimum of the geometric mean of the first distance and second distance is determined under the boundary condition that the third distance is equal to the fourth distance and is not zero. For determining the minimum, the transformed first load reflection factor and the transformed second load reflection factor are varied. In contrast therewith, the complex conjugate of the first source reflection factor, the complex conjugate of the second source reflection factor, the first value, and the second value have fixed values.

Here, for example, for determining the minimum, the following applies:

$$\sqrt{P_1^2 + P_2^2} = \min \tag{19}$$

In addition, the value of the third distance associated with the minimum is set as the distance value, and the value of the transformed first load reflection factor associated with the minimum is set as the third value, and the value of the transformed second load reflection factor associated with the minimum is set as the fourth value.

In another step, a fifth value of the transformed first source reflection factor and a sixth value of the transformed second source reflection factor are determined. To this end, a first circle with a real center point is determined that intersects a real reflection factor value of one third and a real reflection factor value of minus one.

In addition, a second circle as the set of all points with a distance from the real reflection factor value of one third equal to the distance value is determined by:

$$P\left(y, \frac{1}{3}\right) = \operatorname{arctanh}\left(\frac{\left|y - \frac{1}{3}\right|}{\left|1 - y\frac{1}{3}\right|}\right) \equiv P_{aus} \tag{20}$$

Here, y is a point on the second circle, and $P_{aus}$ is the distance value of the third distance.

In addition, the fifth value is determined as equal to a first point of intersection between the first circle and the second circle, and the sixth value is determined as equal to a second point of intersection between the first circle and the second circle different from the first point of intersection.

In another step, the first matching network is determined using the first source reflection factor, and the transformed first source reflection factor, and the third value of the transformed first load reflection factor.

In another step, the second matching network is determined using the second source reflection factor, and the transformed second source reflection factor, and the fourth value of the transformed second load reflection factor.

In one step, the first matching network is determined using the first source reflection factor, and the fifth value (of the transformed first source reflection factor, and the first load reflection factor, and the third value of the transformed first load reflection factor.

In one step, the second matching network is determined using the second source reflection factor, and the sixth value of the transformed second source reflection factor, and the second load reflection factor, and the fourth value of the transformed second load reflection factor.

The invention has the additional object of specifying a circuit that has been improved to the greatest extent possible.

Accordingly, an electronic circuit with at least one source, with at least one load, and with at least one matching network is provided. The matching network is designed in accordance with one of the methods explained above.

In an embodiment, the circuit has a first matching network and a second matching network. The circuit has a first operating state and a second operating state. The circuit has a first source element with a first source output and a second source element with a second source output. Preferably, the first source element is a first amplifier, and the second source element is a second amplifier. Preferably, the first amplifier and the second amplifier are components of a Doherty amplifier. The first amplifier and/or the second amplifier preferably has an LDMOS transistor for gain.

In the first operating state, the first source element has a first source reflection factor into the first source output.

The circuit has a load with a load input. The load has a load input reflection factor into the load input. Accordingly, the load has a load impedance.

The circuit has a T-section with a first input, a second input, and an output. The load input of the load is connected to the output of the T-section. The T-section is preferably a T-shaped conductor that preferably is made of metal. The T-section is integrated on a semiconductor chip, for example.

The T-section has a first load reflection factor into the first input in the second operating state. The T-section has a second load reflection factor into the second input in the first operating state. The T-section has a third load reflection factor into the second input in the second operating state.

The circuit has the first matching network with a first connection and a second connection. The first connection is connected to the first input of the T-section. The second connection is connected to the first source output of the first source element.

In the first operating state, the first matching network has a transformed first source reflection factor into the first connection. In the second operating state, the first matching network has a transformed first load reflection factor into the second connection.

The circuit has the second matching network with a third connection and a fourth connection. The third connection is connected to the second input of the T-section.

The fourth connection of the second matching network is connected to the second source output.

In the first operating state, the second matching network has a transformed second load reflection factor into the fourth connection. In the second operating state, the second matching network has a transformed third load reflection factor into the fourth connection.

A first value of the transformed first load reflection factor is determined for optimizing a parameter of the circuit in that a measurement is carried out in the second operating state. A second value of the transformed second load reflection factor is determined for optimizing the parameter of the circuit in that a measurement is carried out in the first operating state. A third value of the transformed third load reflection factor is determined for optimizing the parameter of the circuit in that a measurement is carried out in the second operating state.

In this context, the matching networks are designed in that the first load reflection factor is set to a first initial value. The first initial value can be set arbitrarily or using the load input reflection factor, for example. Likewise, the second load reflection factor is set to a second initial value. The second initial value can be set arbitrarily or using the load input reflection factor, for example.

A first distance between the first value and the complex conjugate of the first source reflection factor is determined by:

$$P_1 = \operatorname{arctanh}\left(\frac{|a'_{on\,opt} - b^*_{off}|}{|1 - b^*_{off} a'^*_{on\,opt}|}\right) \tag{21}$$

Here, $b_{off}$ is the first source reflection factor, $b^*_{off}$ is the complex conjugate of the first source reflection factor, $a'_{on\,opt}$ is the first value of the transformed first load reflection factor, and $P_1$ is the first distance.

A first circle is determined as the set of all points at the calculated first distance from the complex conjugate of the first load reflection factor by:

$$P(y, a_{on}^*) = \operatorname{arctanh}\left(\frac{|y - a_{on}^*|}{|1 - y^* a_{on}^*|}\right) \equiv P_1 \quad (22)$$

Here, y is a point on the first circle, y* is the complex conjugate of the point on the first circle, $a_{on}^*$ the complex conjugate of the first load reflection factor, and $P_1$ is the first distance.

A third distance between the second value and the third value is determined by:

$$P_3 = \operatorname{arctanh}\left(\frac{|c'_{onopt} - c'_{offopt}|}{|1 - c'^*_{onopt} c'_{offopt}|}\right) \quad (23)$$

Here, $c'_{offopt}$ is the second value of the transformed second load reflection factor, $c'_{on\,opt}$ is the third value of the transformed third load reflection factor, and $c'_{on\,opt}^*$ is the conjugated complex of the third value of the transformed third load reflection factor.

A third circle is determined as the set of all points at the third distance from the third load reflection factor by:

$$P(z, c_{on}) = \operatorname{arctanh}\left(\frac{|z - c_{on}|}{|1 - z^* c_{on}|}\right) \equiv P_3 \quad (24)$$

Here, z is a point on the third circle, z* is the complex conjugate of the point on the third circle, $c_{on}$ is the third load reflection factor, $c_{on}^*$ is the complex conjugate of the third load reflection factor, and $P_3$ is the third distance.

A modified first circle is determined. This modified first circle can also be called an image circle. In this context, the modified first circle is determined as the set of all modified reflection factors, wherein an overall impedance is associated with each of the modified reflection factors. Each overall impedance is determined from a first parallel circuit of a load impedance of the load and an impedance associated with a reflection factor on the first circle. Here, the load impedance is associated with the load input reflection factor of the load.

At least one fourth value of the second load reflection factor is determined, wherein a sum of squares of the distances between the fourth value and the third circle and between the fourth value and the modified first circle is minimized for the at least one fourth value.

A fifth value of the transformed first source reflection factor is determined for each fourth value of the second load reflection factor. In this process, a fourth impedance is determined, wherein the fourth impedance is associated with the fourth value of the second load reflection factor. A fifth impedance is determined so that a second parallel circuit of the fifth impedance with the load impedance is equal to the fourth impedance, wherein the fifth value of the transformed first source reflection factor is associated with the fifth impedance.

The first matching network is designed using the first load reflection factor, the first value of the transformed first load reflection factor, the first source reflection factor, and the fifth value of the transformed first source reflection factor.

The second matching network is designed using the second value of the transformed second load reflection factor, the third value of the transformed third load reflection factor, the third load reflection factor, and the fourth value of the second load reflection factor.

The second source element is designed to output a signal with a center frequency. The load has a load impedance. The second matching network has line-like series elements that carry the signal. The line-like series elements only have line impedances less than the load impedance.

A sum of the electrical lengths of such line-like series elements, each of which has a line impedance greater than the load impedance, is less than one quarter of a conducted wavelength associated with the signal.

The variant refinements described above are especially advantageous, both singly and in combination. All variant refinements may be combined with one another. Some possible combinations are explained in the description of the exemplary embodiments from the figures. The possible combinations of variant refinements shown therein are not exhaustive, however.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein:

FIG. 12 is a schematic circuit diagram of a Doherty load-modulation amplifier arrangement;

FIG. 13 is another schematic representation of two Poincaré circles;

FIG. 14 is another schematic representation of two Poincaré circles;

FIG. 22 is a schematic circuit diagram of an amplifier arrangement;

FIG. 23 is another schematic representation of two Poincaré circles;

FIG. 24 is a schematic diagram with a first parameter;

FIG. 25 is a schematic diagram with a second parameter;

FIGS. 28 to 31 illustrate structure of a matching network; and

DETAILED DESCRIPTION

Figure 1:
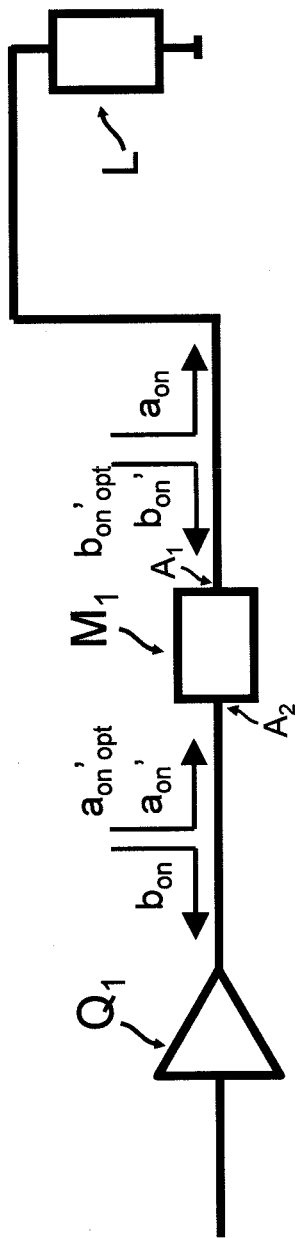
FIG. 1 is a series circuit arrangement such as is suitable for high-frequency applications.

In FIG. 1, a circuit is schematically represented as a block diagram. The circuit has a first matching network $M_1$ with a first connection $A_1$ and a second connection $A_2$. The circuit has a load L connected to the first connection $A_1$.

A first load reflection factor $a_{on}$ that depends on the load L is achieved at the first connection $A_1$ of the first matching network $M_1$.

The circuit has, connected to the second connection $A_2$ of the first matching network $M_1$, a first source element $Q_1$ with a first source reflection factor $b_{on}$. In the exemplary embodiment in FIG. 1, a source output $QA_1$ of the first source element $Q_1$ is connected to the second connection $A_2$ of the first matching network $M_1$.

By means of the first matching network $M_1$, a transformed first load reflection factor $a_{on}'$ into the second connection $A_2$ and a transformed first source reflection factor $b_{on}'$ into the first connection $A_1$ are achieved.

Figure 2:
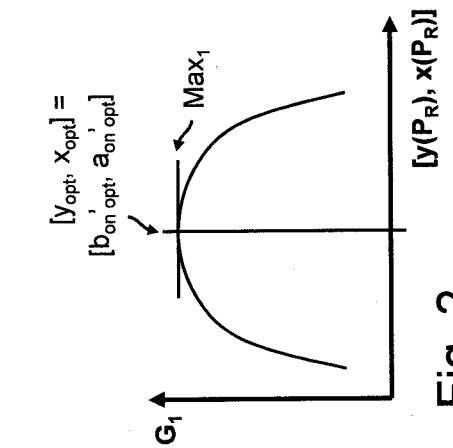
FIG. 2 is a schematic diagram with a first parameter.

FIG. 2 shows a diagram with a first parameter G1 of the circuit from FIG. 1. In the method explained below, the electronic circuit is designed to optimize the first parameter G1. The first parameter G1 in the exemplary embodiment in FIG. 2 depends on the point pair $[y(P_R), y(P_R)]$ and has a maximum $Max_1$ for the values $[y_{opt}, x_{opt}]$ or $[b_{on\,opt}', a_{on\,opt}']$ as an optimum. A first value $b_{on\,opt}'$ of the transformed first source reflection factor $b_{on}'$ and a second value $a_{on\,opt}'$ of the transformed first load reflection factor $a_{on}'$ are determined first.

Figure 3:
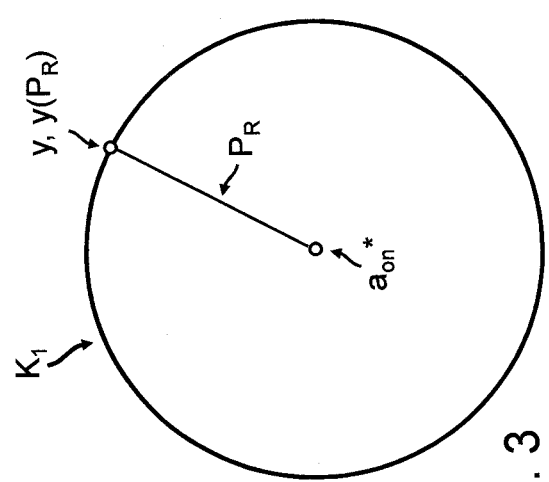
FIG. 3 is a schematically represented Poincaré circle.

In FIG. 3, a first circle $K_1$ is shown schematically as the set of all points at the first distance $P_R$ from the complex conjugate $a_{on}^*$ of the first load reflection factor $a_{on}$. The first circle is determined by:

$$P(y, a_{on}^*) = \operatorname{arctanh}\left(\frac{|y - a_{on}^*|}{|1 - y^* a_{on}^*|}\right) \equiv P_R \qquad (25)$$

Here, y is a point on the first circle $K_1$, $y^*$ is the complex conjugate of the point y on the first circle $K_1$, $a_{on}^*$ is the complex conjugate $a_{on}^*$ of the first load reflection factor $a_{on}$, and $P_R$ is the first distance $P_R$. The first circle $K_1$ is determined here for each first distance $P_R$ among a number of first distances $P_R$.

Figure 4:
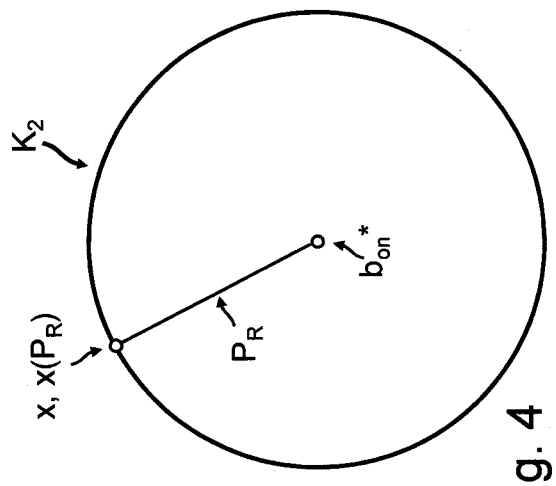
FIG. 4 is another schematically represented Poincaré circle.

In FIG. 4, a second circle $K_2$ is shown schematically as the set of all points at the first distance $P_R$ from the complex conjugate $b_{on}^*$ of the first source reflection factor $b_{on}$. The second circle $K_2$ is determined by:

$$P(x, b_{on}^*) = \operatorname{arctanh}\left(\frac{|x - b_{on}^*|}{|1 - x^* b_{on}^*|}\right) \equiv P_R \qquad (26)$$

Here, x is a point on the second circle $K_2$, $x^*$ is the complex conjugate of the point x on the second circle $K_2$, $b_{on}^*$ is the complex conjugate $b_{on}^*$ of the first source reflection factor $b_{on}$, and $P_R$ is the first distance $P_R$. The second circle $K_2$ is determined here for each first distance $P_R$ among a number of first distances $P_R$.

In the method, a number of first point pairs $[y(P_R), x(P_R)]$ are determined. Here, as is shown in FIG. 3, a first pair point $y(P_R)$ of each point pair $[y(P_R), x(P_R)]$ is on the first circle $K_1$. As is shown in FIG. 4, a second pair point $x(P_R)$ of each point pair $[y(P_R), x(P_R)]$ is on the second circle $K_2$.

In the method, a value for the first parameter G1 is determined for every first point pair $[y(P_R), x(P_R)]$ with the first pair point $y(P_R)$ equal to a value of the transformed first source reflection factor $b_{on}'$ and with the second pair point $x(P_R)$ equal to a value of the transformed first load reflection factor $a_{on}'$.

The optimum $Max_1$ of the first parameter $G_1$ is determined from all values of the first parameter $G_1$, that are associated with the first point pairs $[y(P_R), x(P_R)]$. In this process, a first value pair $[y_{opt}, x_{opt}]$ is determined from the first point pairs $[y(P_R), x(P_R)]$, wherein the optimum $Max_1$ is associated with the first value pair $[y_{opt}, x_{opt}]$.

The first value $b_{on\,opt}'$ of the transformed first source reflection factor $b_{on}'$ is equal to a first value point $y_{opt}$ of the first value pair $[y_{opt}, x_{opt}]$. The second value $a_{on\,opt}'$ of the transformed first load reflection factor $a_{on}'$ is equal to a second value point $x_{opt}$ of the first value pair $[y_{opt}, x_{opt}]$.

The first matching network $M_1$ in FIG. 1 is determined using the first value $b_{on\,opt}'$ of the transformed first source reflection factor $b_{on}'$, and the second value $a_{on\,opt}'$ of the transformed first load reflection factor $a_{on}'$, and the first source reflection factor $b_{on}$, and the first load reflection factor $a_{on}$.

FIG. 1 shows the electronic circuit 1 by way of example as an amplifier chain having a first amplifier as the first source element $Q_1$ with the source reflection factor b1, the matching network M1 with the first connection A1 and the second connection A2, and a load element L with the load reflection factor a1. The load element L is, e.g., a second amplifier that is connected at the input side to the first matching network M1. The first connection A1 is connected to the load element L, and the second connection A2 is connected to the source element Q1.

When an electrical signal, considered as, for example, a voltage wave, passes through a discontinuity in the impedance of the signal-carrying channel, Kirchhoff's laws require that a part of the forward-traveling wave is reflected back. If the source element Q1 operates with an output impedance into the load L with an input impedance, the source element Q1 sees neither the load L nor the input impedance, but only the reflected part of the signal returning to the source element Q1.

Consequently, the quantity of primary importance for high-frequency behavior is not so much the actual impedance as the relevant reflection factor. Accordingly, in the exemplary embodiments impedances and reflection factors are used, which can be converted into one another through one-to-one mapping.

Figures 9, 10, 11:
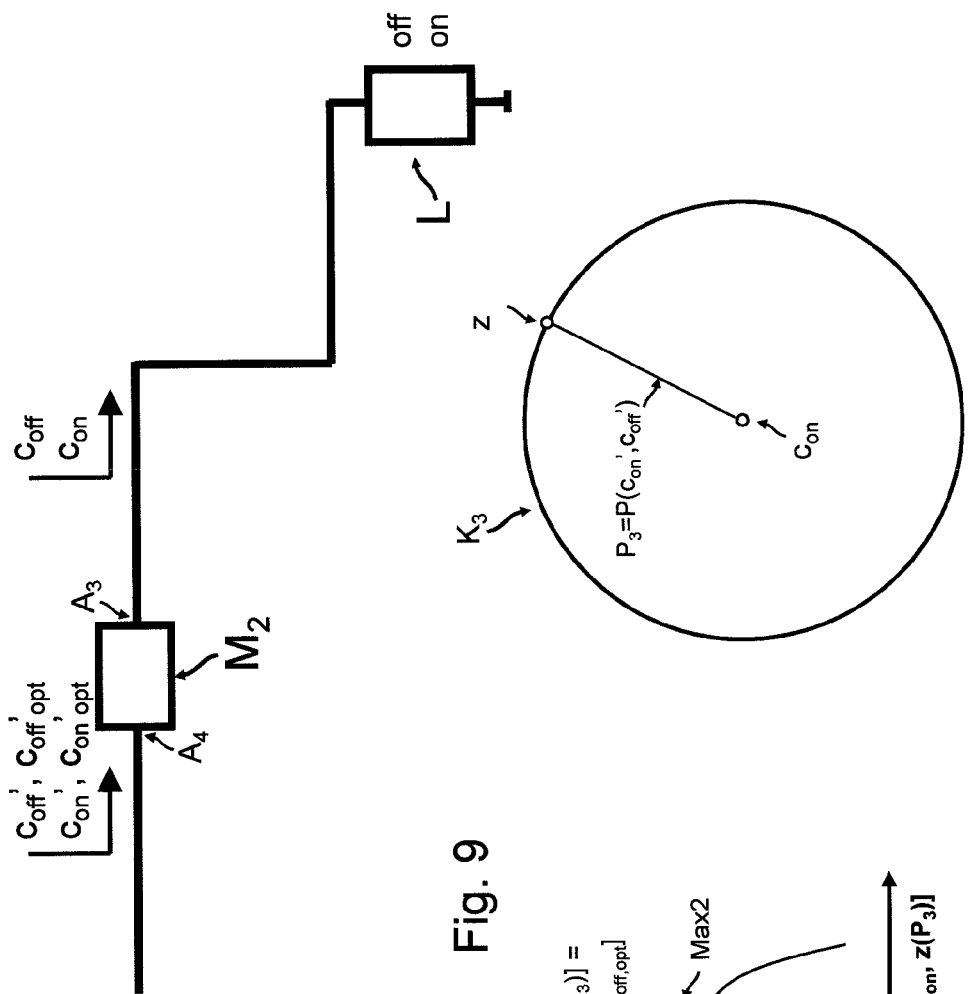
FIG. 9 is a circuit diagram with a variable load.
FIG. 10 is a schematic diagram with a second parameter.
FIG. 11 is another schematically represented Poincaré circle.

FIG. 9 shows a circuit that is to be designed for high-frequency signals, for example. The circuit has a second matching network $M_2$ with a third connection $A_3$ and a fourth connection $A_4$. The circuit has a variable load L with a first operating state off and a second operating state on, connected to the third connection $A_3$. At the third connection $A_3$, a second load reflection factor $c_{on}$ is achieved in the second operating state on, and a third load reflection factor $c_{off}$ is achieved in the first operating state off. By means of the second matching network $M_2$, a transformed second load reflection factor $c_{on}'$ into the fourth connection $A_4$ is achieved in the second operating state, and a transformed third load reflection factor $c_{off}'$ is achieved in the first operating state.

FIG. 10 shows a schematic diagram of a second parameter $G_2$ of the circuit from FIG. 9. In a method for designing the electronic circuit from FIG. 9, the second parameter $G_2$ of the circuit is to be optimized. For example, the optimum, as shown in FIG. 10, is a maximum $Max_2$ of the second parameter $G_2$.

In FIG. 11, a third circle K3 about a second load reflection factor $c_{on}$ is shown schematically. In a method for designing the electronic circuit from FIG. 9, a third value $c_{off,opt}$ of the third load reflection factor $c_{off}$ and a fourth value $c_{on,opt}$ of the second load reflection factor $c_{on}$ are determined.

To this end, a third distance $P_3$ between the transformed second load reflection factor $c_{on}'$ and the transformed third load reflection factor $c_{off}'$ is determined by:

$$P_3 = \operatorname{arctanh}\left(\frac{|c'_{off} - c'_{on}|}{|1 - c'^*_{off} c'_{on}|}\right) \quad (27)$$

Here, $c_{on}'$ is the transformed second load reflection factor $c_{on}'$, $c_{off}'$ is the transformed third load reflection factor $c_{off}'$, $c_{off}'^*$ is the complex conjugate $c_{off}'^*$ of the transformed third load reflection factor $c_{off}'$, and $P_3$ is the third distance $P_3$.

In FIG. 11, a third circle $K_3$ is shown schematically. The third circle $K_3$ is determined as the set of all points at the third distance $P_3$ from the second load reflection factor $c_{on}$ by:

$$P(z, c_{on}) = \operatorname{arctanh}\left(\frac{|z - c_{on}|}{|1 - z^* c_{on}|}\right) \equiv P_3 \quad (28)$$

Here, z is a point on the third circle $K_3$, z* is the complex conjugate z* of the point z on the third circle $K_3$, $c_{on}$ is the second load reflection factor $c_{on}$, $c_{on}$* is the complex conjugate $c_{on}$* of the second load reflection factor $c_{on}$, and $P_3$ is the third distance $P_3$.

A number of second point pairs $[c_{on}, z(P_3)]$ are determined. Here, a second pair point $z(P_3)$ of each second point pair $[c_{on}, z(P_3)]$ is a point on the third circle $K_3$, which is shown schematically in FIG. 11. In accordance with FIG. 10, a value of the second parameter $G_2$ is determined for every second point pair $[c_{on}, z(P_3)]$. In FIG. 10, the behavior of the second parameter $G2$ is shown schematically as a function of the second point pairs $[c_{on}, z(P_3)]$. A value of the third load reflection factor $c_{off}$ here is equal to the second pair point $z(P_3)$. A value of the second load reflection factor $c_{on}$ is equal to the first pair point $c_{on}$.

The optimum $Max_2$ of the second parameter $G_2$ shown in FIG. 10 is determined from all values of the second parameter $G_2$ that are associated with the second point pairs $[c_{on}, z(P_3)]$.

In accordance with FIG. 10, a second point pair $[c_{on,opt}, C_{off,opt}]$ is determined that is associated with the optimum $Max_2$. The third value $C_{off,opt}$ of the third load reflection factor $c_{off}$ is determined as equal to a second pair point $c_{off,opt}$ associated with the optimum $Max_2$, of the second point pair $[c_{on,opt}, c_{off,opt}]$ associated with the optimum $Max_2$. The fourth value $c_{on,opt}$ of the second load reflection factor $c_{on}$ is determined as equal to a first pair point $c_{on}$, associated with the optimum $Max_2$, of the second point pair $[c_{on,opt}, C_{off,opt}]$ associated with the optimum $Max_2$.

The second matching network $M_2$ in the exemplary embodiment in FIG. 9 is determined using the third value $c_{off,opt}$ of the third load reflection factor $c_{off}$, and the fourth value $C_{on,opt}$ of the second load reflection factor $c_{on}$, and the transformed second load reflection factor $c_{on}'$, and the transformed third load reflection factor $c_{off}'$.

FIG. 12 shows an electronic circuit of an exemplary embodiment that is to be designed. The circuit has a first operating state off and a second operating state on. In FIG. 12, the reflection factors are labeled in accordance with the associated operating state.

The circuit has a first source element $Q_1$ with a first source output $QA_1$, and a second source element $Q_2$ with a second source output $QA_2$. In the first operating state off, the first source element $Q_1$ has a first source reflection factor $b_{off}$ into the first source output $QA_1$.

The circuit has a load L with a load input LE. The load L has a load input reflection factor r into the load input LE.

The circuit [has] a T-section T with a first input $E_1$, and a second input $E_2$, and an output $E_3$. The load input LE of the load L is connected to the output $E_3$ of the T-section T. The T-section T has a first load reflection factor $a_{on}$ into the first input $E_1$ in the second operating state on. The T-section T has a second load reflection factor $c_{off}$ into the second input $E_2$ in the first operating state off. The T-section T has a third reflection factor $c_{on}$ into the second input $E_2$ in the second operating state on. The first load reflection factor $a_{on}$ is set to a first initial value. The second load reflection factor $c_{on}$ is set to a second initial value.

The circuit has a first matching network $M_1$ with a first connection $A_1$ and a second connection $A_2$. The first connection $A_1$ of the first matching network $M_1$ is connected to the first input $E_1$ of the T-section T. The second connection $A_2$ of the first matching network $M_1$ is connected to the first source output $QA_1$. The first matching network $M_1$ has a transformed first source reflection factor $b_{off}'$ into the first connection $A_1$ in the first operating state off. The first matching network $M_1$ has a transformed first load reflection factor $a_{on}'$ into the second connection $A_2$ in the second operating state on.

The circuit has a second matching network $M_2$ with a third connection $A_3$ and a fourth connection $A_4$. The third connection $A_3$ of the second matching network $M_2$ is connected to the second input $E_2$ of the T-section T. The fourth connection (A4) of the second matching network $M_2$ is connected to the second source output $QA_2$. The second matching network $M_2$ has a transformed second load reflection factor $c_{off}'$ into the fourth connection $A_4$ in the first operating state off. The second matching network $M_2$ has a transformed third load reflection factor $c_{on}'$ into the fourth connection $A_4$ in the second operating state on.

A first value $a_{on}'_{opt}$ of the transformed first load reflection factor $a_{on}'$ is determined for optimizing a parameter $G_1$ of the circuit—such as is shown in FIG. 2, for example—by measurement in the second operating state on. In addition, a second value $c_{off}'_{opt}$ of the transformed second load reflection factor $c_{off}'$ is determined for optimizing the parameter $G_1$ of the circuit by measurement in the first operating state off. In addition, a third value $c_{on}'_{opt}$ of the transformed third load reflection factor $c_{on}'$ is determined for optimizing the parameter $G_1$ of the circuit by measurement in the second operating state on.

Of course, the exemplary embodiment in FIG. 12 allows for applications and insights extending far beyond the specific embodiment. Thus, the method in the exemplary embodiment in FIG. 12, in combination with load modulation, allows an equivalent substitution of the load reflection factor acting at the second input $E_1$ of the T-section T (as the reflection factor of a parallel circuit of the load impedance with an impedance corresponding to a point on the first circle) by an effective load reflection factor at the first input $E_1$ of the T-section T that results from the influence of the load modulation due to the signal from the first source element $Q_1$, in order to significantly enlarge the area of application of the exemplary embodiment in FIG. 12 yet further.

FIG. 13 shows a first distance $P_1$. The first distance $P_1$ between the first value $a_{on}{'}_{opt}$ and the complex conjugate $b_{off}^*$ of the first source reflection factor $b_{off}$ is determined by:

$$P_1 = \operatorname{arctanh}\left(\frac{|a'_{onopt} - b^*_{off}|}{|1 - b^*_{off} a'_{onopt}|}\right) \quad (29)$$

Here, $b_{off}$ is the first source reflection factor $b_{off}$, $b_{off}^*$ is the complex conjugate $b_{off}^*$ of the first source reflection factor $b_{off}$, $a_{on}{'}_{opt}$ is the first value $a_{on}{'}_{opt}$ of the transformed first load reflection factor $a_{on}{'}$, and $P_1$ is the first distance $P_1$.

In FIG. 13, a first circle $K_1$ is shown. The first circle $K_1$ is determined as the set of all points at a first distance $P_1$ from the complex conjugate $a_{on}^*$ of the first load reflection factor $a_{on}$ by:

$$P(y, a^*_{on}) = \operatorname{arctanh}\left(\frac{|y - a^*_{on}|}{|1 - y^* a^*_{on}|}\right) \equiv P_1 \quad (30)$$

Here, y is a point on the first circle $K_1$, y* is the complex conjugate y* of the point y on the first circle $K_1$, $a_{on}^*$ is the complex conjugate $a_{on}^*$ of the first load reflection factor $a_{on}$, and $P_1$ is the first distance $P_1$.

FIG. 13 shows a modified first circle $K_1{'}$. The modified first circle $K_1{'}$ is determined as the set of all modified reflection factors y'. In this context, an overall impedance is associated with each of the modified reflection factors y', wherein each overall impedance is determined from a first parallel circuit of a load impedance of the load (L) and an impedance associated with a reflection factor y on the first circle $K_1$, wherein the load impedance is associated with the load input reflection factor $\Gamma$ of the load L. The following applies here:

$$y' = y \| \Gamma \quad (31)$$

In FIG. 14, a third distance $P_3$ is shown. The third distance $P_3$ between the second value $c_{off}{'}_{opt}$ and the third value $c_{on}{'}_{opt}$ is determined by:

$$P_3 = \operatorname{arctanh}\left(\frac{|c'_{onopt} - c'_{offopt}|}{|1 - c'^*_{onopt} c'_{offopt}|}\right) \quad (32)$$

Here, $c_{off}{'}_{opt}$ is the second value $c_{off}{'}_{opt}$ of the transformed second load reflection factor $c_{off}{'}$, $c_{on}{'}_{opt}$ is the third value $c_{on}{'}_{opt}$ of the transformed third load reflection factor $c_{on}{'}$, and $c_{on}{'}_{opt}^*$ is the complex conjugate $c_{on}{'}_{opt}^*$ of the third value $c_{on}{'}_{opt}$ of the transformed third load reflection factor $c_{on}{'}$.

In FIG. 14, a third circle $K_3$ is shown. The third circle $K_3$ is determined as the set of all points at the third distance $P_3$ from the third load reflection factor $c_{on}$ by:

$$P(z, c_{on}) = \operatorname{arctanh}\left(\frac{|z - c_{on}|}{|1 - z^* c_{on}|}\right) \equiv P_3 \quad (33)$$

Here, z is a point on the third circle $K_3$, z* is the complex conjugate z* of the point z on the third circle $K_3$, $C_{on}$ is the third load reflection factor $c_{on}$, $c_{on}^*$ is the complex conjugate $c_{on}^*$ of the third load reflection factor $c_{on}$, and $P_3$ is the third distance $P_3$.

In FIG. 14, two fourth values $c_{off,1}$, $c_{off,2}$ are shown as points of intersection between the third circle $K_3$ and the modified first circle $K_1{'}$. At least one fourth value $c_{off,1}$, $C_{off,2}$ of the second load reflection factor $c_{off}$ is determined. Here, for the at least one fourth value $c_{off,1}$, $c_{off,2}$ a sum of squares of the distances between the fourth value $c_{off,1}$, $c_{off,2}$ and the third circle $K_3$ and between the fourth value $c_{off,1}$, $c_{off,2}$ and the modified first circle $K_1{'}$ is minimized. In the exemplary embodiment in FIG. 14, the distances are minimal (zero) at the points of intersection.

A fifth value $b_{off}{'}_1$, $b_{off}{'}_2$ of the transformed first source reflection factor $b_{off}{'}$ is determined for each fourth value $c_{off,1}$, $c_{off,2}$ of the second load reflection factor $c_{off}$. In this process, a fourth impedance is determined, wherein the fourth impedance is associated with the fourth value $c_{off,1}$, $c_{off,2}$ of the second load reflection factor $c_{off}$. A fifth impedance is determined so that a second parallel circuit of the fifth impedance with the load impedance is equal to the fourth impedance, with the fifth value $b_{off}{'}_1$, $b_{off}{'}_2$ of the transformed first source reflection factor $b_{off}{'}$ being associated with the fifth impedance.

The first matching network $M_1$ of the exemplary embodiment in FIG. 12 is determined below using the first load reflection factor $a_{on}$, and the first value $a_{on}{'}_{opt}$ of the transformed first load reflection factor $a_{on}{'}$, and the first source reflection factor $b_{off}$, and the fifth value $b_{off}{'}_1$, $b_{off}{'}_2$ of the transformed first source reflection factor $b_{off}{'}$.

The second matching network $M_2$ of the exemplary embodiment in FIG. 12 is determined below using the second value $c_{off}{'}_{opt}$ of the transformed second load reflection factor $c_{off}{'}$, and the third value $c_{on}{'}_{opt}$ of the transformed third load reflection factor $c_{on}{'}$, and the third load reflection factor $c_{on}$, and the fourth value $c_{off,1}$, $c_{off,2}$ of the second load reflection factor $c_{off}$.

The input quantities of the method in the exemplary embodiment in FIG. 12 are, firstly, measurable quantities: The first source reflection factor $b_{off}$, the load input reflection factor $\Gamma$, as well as, typically determined in load pull measurements, the first value $a_{on}{'}_{opt}$ of the transformed first load reflection factor $a_{on}{'}$, which optimizes the source and circuit characteristics in the second operating state on, the second value $c_{off}{'}_{opt}$ of the transformed second load reflection factor $c_{off}{'}$, which optimizes the source and circuit characteristics in the first operating state off, and the third value $c_{on}{'}_{opt}$ of the transformed third load reflection factor $c_{on}{'}$, which optimizes the source and circuit characteristics in the second operating state on.

Additional input quantities of the method in the exemplary embodiment in FIG. 12 are the quantities of the first load reflection factor $a_{on}$ and third load reflection factor $c_{on}$, which are determined independently in the second operating state on of the circuit.

Proceeding from the aforementioned input quantities, the method is used to determine the pairs of mathematical transformation properties—a maximum of two pairs aside from pathological cases—that are compatible with the input quantities.

The mathematical transformation properties determined permit largely lossless, non-reciprocal matching networks that exhibit the mathematical transformation properties that have been determined. One example for the design of a reciprocal, largely lossless matching network, proceeding from known transformation properties, is found in an approach for the matching network in the form of an adequately flexible circuit topology—for example, a number of series-connected microstriplines whose particular trace widths and lengths are unspecified—with subsequent numerical optimization of the trace widths and lengths.

The mathematical transformation properties determined for the exemplary embodiment in FIG. 12 also make it possible to determine the transformed source reflection factors $b_{on}'$, $d_{on}'$ from the source reflection factors $b_{on}$, $d_{on}$ of the first and second source elements $Q_1$, $Q_2$ in the second operating state on of the circuit, which are accessible from the measurement. Together with the load input reflection factor $\Gamma$, all termination conditions for the T-section T are thus known.

Methods are available—for example, circuit simulation with S-parameter ports—for determining the transformation properties of a T-section T that is assumed to be ideal or is implemented in microstrip technology from its termination conditions, e.g., in the form of a scattering matrix.

Moreover, the knowledge of the scattering matrix makes it possible to superpose a first forward time-domain sinusoidal signal coming from the first output $A_1$ and a second forward time-domain sinusoidal signal coming from the third output $A_3$ at the T-section T, and to specify a first time-domain sinusoidal signal reflected from the first input $E_1$ and a second time-domain sinusoidal signal reflected from the second input $E_2$. Here, the first and the second forward time-domain sinusoidal signals have the same frequency for a given relative phase position and a given amplitude ratio between the first and the second forward time-domain sinusoidal signals. The forward and reflected time-domain sinusoidal signals are in turn transformed into new, so-called effective load reflection factors on $\tilde{a}_{on}$, $\tilde{c}_{on}$, which may match or differ from the respective load reflection factors $a_{on}$, $c_{on}$ that were determined independently at the outset.

For each given relative phase position and each given amplitude ratio between the first and the second forward time-domain sinusoidal signals, the superposition loss of the two signals at the T-section T can be determined. The superposition loss is the difference between the power output to the load and the sum of the powers of the forward time-domain sinusoidal signals. Accordingly, it is possible to determine for each given amplitude ratio a singular relative phase position between the first and the second forward time-domain sinusoidal signals that minimizes the superposition loss, including the effective load reflection factors associated with this singular relative phase position.

Using FIG. 20 and FIG. 21, an example for determining the singular relative phase position and the associated effective load reflection factors is described below, starting from the termination conditions of the T-section and the amplitudes and relative phase position of the forward time-domain sinusoidal signals. The example makes use of a simulation program. The simulation program makes a widely used tool available for high-frequency circuit engineering. Among other things, the simulation program offers as a predefined circuit element a circulator for which different reference impedances can be chosen at the three inputs, hereinafter called a three-port circulator. The three-port circulator of the simulation program is thus an ideal impedance-transforming component.

Figures 20, 21:
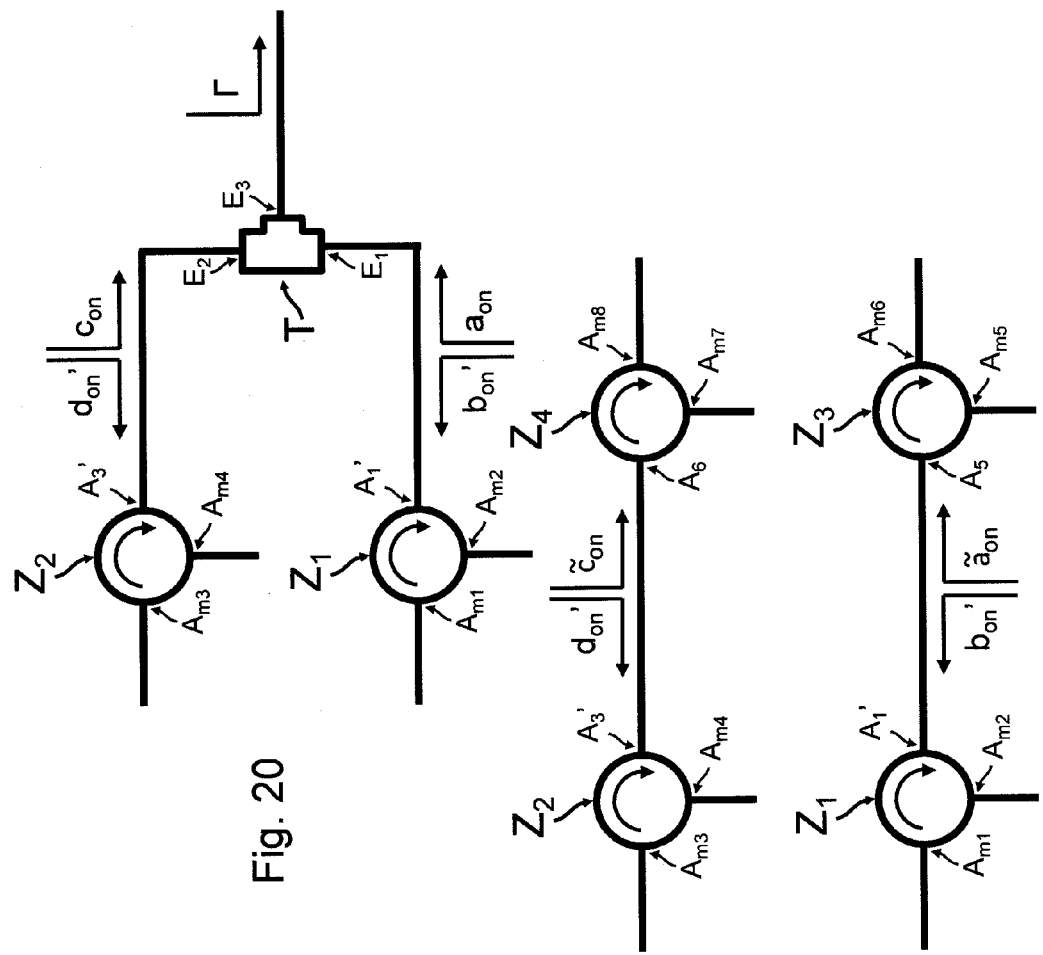
FIG. 20 is a schematic equivalent circuit with a T-section.
FIG. 21 is a schematic equivalent circuit with circulators.

FIG. 20 shows a first equivalent circuit for the terminated T-section T, which is used below in determining the effective load reflection factors $\tilde{a}_{on}$, $\tilde{c}_{on}$. The first equivalent circuit contains a first three-port circulator $Z_1$ and a second three-port circulator $Z_2$.

The first three-port circulator $Z_1$ has a first circulator port $A_1'$, a second circulator port $A_{m1}$, and a third circulator port $A_{m2}$. The first three-port circulator $Z_1$ exhibits the first transformed source reflection factor $b_{on}'$ into the first circulator port $A_1'$.

The second three-port circulator $Z_2$ has a fourth circulator port $A_3'$, a fifth circulator port $A_{m3}$, and a sixth circulator port $A_{m4}$. The second three-port circulator $Z_2$ exhibits the third transformed source reflection factor $d_{on}'$ into the fourth circulator port $A_3'$.

The first equivalent circuit contains a T-section T. The T-section T has a first input $E_1$, a second input $E_2$, and a third input $E_3$. The first input $E_1$ is connected to the first circulator port $A_1'$ and is accordingly terminated with the first transformed source reflection factor $b_{on}'$. The second input $E_1$ is connected to the fourth circulator port $A_3'$ and is accordingly terminated with the third transformed source reflection factor $d_{on}'$. The third input $E_3$ is terminated with the load reflection factor F. The T-section T can be implemented as a line node or as a microstrip T-section, for example.

In technical terms, the termination of the first input $E_1$ is implemented with the first transformed source reflection factor $b_{on}'$ through the selection of an impedance associated with the first transformed source reflection factor $b_{on}'$ as reference impedance for the first three-port circulator $Z_1$ at the first circulator port $A_1'$. In the exemplary embodiment in FIG. 20, a value of 50Ω is chosen for each of the reference impedances for the first three-port circulator $Z_1$ at the second circulator port $A_{m1}$ and at the third circulator port $A_{m2}$.

In technical terms, the termination of the second input $E_2$ is implemented with the third transformed source reflection factor $d_{on}'$ through the selection of an impedance associated with the third transformed source reflection factor $d_{on}'$ as reference impedance for the second three-port circulator $Z_1$ at the fourth circulator port $A_3'$. In the exemplary embodiment in FIG. 20, a value of 50Ω is chosen for each of the reference impedances for the second three-port circulator $Z_1$ at the fifth circulator port $A_{m3}$ and at the sixth circulator port $A_{m4}$.

A first time-domain sinusoidal signal of a given frequency, phase, and amplitude is applied to the second circulator port $A_{m1}$, and a second time-domain sinusoidal signal of the given frequency with a given relative phase with respect to the phase of the first time-domain sinusoidal signal and a given relative amplitude with respect to the amplitude of the first time-domain sinusoidal signal is applied to the fifth circulator port $A_{m3}$.

In the simulation, a first reflected current is measured at the third circulator port $A_{m2}$, and the third circulator port $A_{m2}$ is terminated reflection-free. In the simulation, a first effective current and a first effective voltage are accessed at the first circulator port $A_1'$.

In the simulation, a second reflected current is measured at the sixth circulator port $A_{m4}$, and the sixth circulator port $A_{m4}$ is terminated reflection-free. In the simulation, a second effective current and a second effective voltage are accessed at the fourth circulator port $A_3'$.

A first effective load reflection factor $\tilde{a}_{on}$ from the relative phase and the relative amplitude and a second effective load reflection factor $\tilde{c}_{on}$ from the relative phase and the relative amplitude are determined using the first equivalent circuit from FIG. 20 and a second equivalent circuit from FIG. 21, with said first effective load reflection factor $\tilde{a}_{on}$ acting into the first input $E_1$ and said second effective load reflection factor $\tilde{c}_{on}$ acting into the second input $E_2$.

FIG. 21 shows a second equivalent circuit for the terminated T-section, which is used below in determining the effective load reflection factors $\tilde{a}_{on}$, $\tilde{c}_{on}$. The second equivalent circuit contains a third three-port circulator $Z_3$, a fourth three-port circulator $Z_4$, a fifth three-port circulator $Z_5$, and a sixth three-port circulator $Z_6$.

The third three-port circulator $Z_3$ has a seventh circulator port $A_1''$, an eighth circulator port $A_{m1}'$, and a ninth circulator port $A_{m2}'$. The third three-port circulator $Z_3$ exhibits the first transformed source reflection factor $b_{on}'$ into the seventh circulator port $A_1''$.

The fourth three-port circulator $Z_4$ has a tenth circulator port $A_3''$, an eleventh circulator port $A_{m3}'$, and a twelfth circulator port $A_{m4}'$. The fourth three-port circulator $Z_4$ exhibits the third transformed source reflection factor $d_{on}'$ into the tenth circulator port $A_3''$.

The fifth three-port circulator $Z_5$ has a thirteenth circulator port $A_5$, a fourteenth circulator port $A_{m5}$, and a fifteenth circulator port $A_{m6}$. The fifth three-port circulator $Z_5$ exhibits a first variable effective load reflection factor into the thirteenth circulator port $A_5$.

The sixth three-port circulator $Z_6$ has a sixteenth circulator port $A_6$, a seventeenth circulator port $A_{m7}$, and an eighteenth circulator port $A_{m8}$. The sixth three-port circulator $Z_6$ exhibits a second variable effective load reflection factor $\tilde{c}_{on}'$ into the sixteenth circulator port $A_6$.

In technical terms, the property of the third three-port circulator $Z_3$ of exhibiting the first transformed source reflection factor $b_{on}'$ into the seventh circulator port $A_1''$ is implemented through the selection of an impedance associated with the first transformed source reflection factor $b_{on}'$ as reference impedance for the third three-port circulator $Z_3$ at the seventh circulator port $A_1''$. In the exemplary embodiment in FIG. 21, a value of 50Ω is chosen for each of the reference impedances for the third three-port circulator $Z_3$ at the eighth circulator port $A_{m1}'$ and at the ninth circulator port $A_{m2}'$.

In technical terms, the property of the fourth three-port circulator $Z_4$ of exhibiting the third transformed source reflection factor $d_{on}'$ into the tenth circulator port $A_3''$ is implemented through the selection of an impedance associated with the third transformed source reflection factor $d_{on}'$ as reference impedance for the fourth three-port circulator $Z_4$ at the tenth circulator port $A_3''$. In the exemplary embodiment in FIG. 21, a value of 50Ω is chosen for each of the reference impedances for the fourth three-port circulator $Z_4$ at the eleventh circulator port $A_{m1}'$ and at the twelfth circulator port $A_{m4}'$.

A value of 50Ω is chosen for each of the reference impedances for the fifth three-port circulator $Z_5$ at the fourteenth circulator port $A_{m5}$ and at the fifteenth circulator port $A_{m6}$. A value of 50Ω is chosen for each of the reference impedances for the sixth three-port circulator $Z_6$ at the seventeenth circulator port $A_{m7}$ and at the eighteenth circulator port $A_{m8}$.

A signal equal to the first time-domain sinusoidal signal is applied at the eighth circulator port $A_{m1}'$, and a signal equal to the second time-domain sinusoidal signal is applied at the eleventh circulator port $A_{m3}'$.

In the simulation, a third reflected current is measured at the ninth circulator port $A_{m2}'$, and the ninth circulator port $A_{m2}'$ is terminated reflection-free. In the simulation, a third effective current and a third effective voltage are accessed at the seventh circulator port $A_1''$.

In the simulation, a fourth reflected current is measured at the twelfth circulator port $A_{m4}'$, and the sixth circulator port $A_{m4}$ is terminated reflection-free. In the simulation, a fourth effective current and a fourth effective voltage are accessed at the tenth circulator port $A_3''$.

The fourteenth circulator port $A_{m5}$, the fifteenth circulator port $A_{m6}$, the seventeenth circulator port $A_{m7}$, and the eighteenth circulator port $A_{m8}$ are terminated reflection-free.

In a simulation of the first equivalent circuit, values for the first forward current, the second forward current, the first effective voltage, the second effective voltage, the first effective current, and the second effective current are obtained.

In simulations of the second equivalent circuit, the first variable effective load reflection factor $\tilde{a}_{on}'$ and the second variable effective load reflection factor $\tilde{c}_{on}'$ are optimized such that:

the third reflected current is equal in magnitude and direction to the first reflected current, the fourth reflected current is equal in magnitude and direction to the second reflected current, the third effective current is equal in magnitude and direction to the first effective current, the fourth effective current is equal in magnitude and direction to the second effective current, the third effective voltage is equal in magnitude to the first effective voltage, and the fourth effective voltage is equal in magnitude to the second effective voltage.

The value found by means of the optimization for the first variable effective load reflection factor $\tilde{a}_{on}'$ then matches the value sought for the first effective load reflection factor $\tilde{a}_{on}$, and the value found by means of the optimization for the second variable effective load reflection factor $\tilde{c}_{on}'$ matches the value sought for the first effective load reflection factor $\tilde{c}_{on}$.

The effective reflection factors acting into the first input $E_1$ and the second input $E_2$ are determined from the termination conditions at the inputs $E_1$, $E_2$, $E_3$ of the T-section T and the input signals at all three inputs $E_1$, $E_2$, $E_3$ of the T-section T—of which, in the exemplary embodiment in FIGS. 20 and 21, the input signal entering the third input $E_3$ of the T-section T has zero magnitude.

The comparison of the sum of the power of the first time-domain sinusoidal signal and the power of the second time-domain sinusoidal signal with the power output at the third input $E_3$ of the T-section T provides a method for determining the summation loss in the T-section T, in particular as a function of the relative phase.

In one possible application, efforts are made to minimize the summation loss. This is accomplished by repeating the method for different values of the relative phase so as to arrive at a singular relative phase position through which the summation loss is minimized.

For example, if an amplitude ratio is provided through a ratio of the compression points of both source elements, then the method from the exemplary embodiment teaches the determination, from a first pair of independently determined load reflection factors, of a new pair of load reflection factors in the form of the pair of effective load reflection factors associated with the singular relative phase position, and thus permits an improvement over a first pair of load reflection factors by a derived second pair of load reflection factors.

As compared to the method of pure trial and error, this is, for example, the successive execution of a large number of iterations. For such a continued iteration, the great iteration theorem suggests the existence of a fixed point pair, both of whose pair points lie within the closed unit disk in the reflection factor plane. The iteration is dependent on a pair of load reflection factors as an initial value. According to the great iteration theorem, the iteration converges to the fixed point pair with every pair of load reflection factors as the starting point. However, the design method for Doherty amplifiers, as a special case of the load-modulation amplifier, provides an obvious pair of load reflection factors as an initial value (at least for real load input reflection factors). As an initial value, the obvious pair of load reflection factors in both entries is the reflection factor associated with twice the load impedance.

Thus, the above-described method teaches, in particular, the reaching of a closed solution for the singular phase position, the minimal summation losses, and the effective load reflection factors associated therewith from measurable input quantities—the first source reflection factor $b_{off}$ in the first operating state off, the source reflection factors $b_{on}$, $d_{on}$ of the first source element $Q_1$ and the second source element $Q_2$ in the second operating state on, the load input reflection factor $\Gamma$, and the first value $a_{on'opt}$, the second value $c_{off'opt}$, and the third value $c_{on'opt}$—as well as reaching the associated pair of two mathematically permissible transforming actions of the first and the second matching network $M_1$, $M_2$.

FIG. 22 shows another exemplary embodiment of a circuit that is being designed. The circuit has a first source element $Q_1$ with a first source output $QA_1$ and with a first source reflection factor b. The circuit has a second source element $Q_2$ with a second source output $QA_2$ and with a second source reflection factor d. The circuit also has a load L.

The circuit has a T-section T with a first input $E_1$, a second input $E_2$, and an output $E_3$. The T-section T has a first load reflection factor a into the first input $E_1$, as is shown schematically in FIG. 22 by means of an arrow. The T-section T has a second load reflection factor c into the second input $E_2$, as is likewise shown schematically in FIG. 22 by means of an arrow. In the exemplary embodiment in FIG. 22, the output $E_3$ of the T-section T is connected to the load L.

The circuit has a first matching network $M_1$ with a first connection $A_1$ and a second connection $A_2$. The second connection $A_2$ is connected to the first source output $QA_1$. The first connection $A_1$ is connected to the first input $E_1$ of the T-section T. By means of the first matching network $M_1$, a transformed first load reflection factor a' is achieved into the second connection $A_2$ and a transformed first source reflection factor b' is achieved into the first connection $A_1$. The transformed first load reflection factor a' and the transformed first source reflection factor b' are shown schematically in FIG. 22 by means of arrows.

The circuit has a second matching network $M_2$ with a third connection $A_3$ and a fourth connection $A_4$. The fourth connection $A_4$ is connected to the second source output $QA_2$. The third connection $A_3$ is connected to the second input $E_2$ of the T-section T. By means of the second matching network $M_2$, a transformed second load reflection factor c' is achieved into the fourth connection $A_4$. Moreover, by means of the second matching network $M_2$, a transformed second source reflection factor d' is achieved into the third connection $A_3$. The transformed second load reflection factor c' and the transformed second source reflection factor d' are shown schematically in FIG. 22 by means of arrows.

In FIG. 22, a first value $a'_{opt}$ of the transformed first load reflection factor a' and a second value $c'_{opt}$ of the transformed second load reflection factor c' are shown schematically by means of arrows. In one method, the first value $a'_{opt}$ of the transformed first load reflection factor a' is determined. In this method, the first source element $Q_1$ has a first optimum $Max_1$ of a first parameter $G_1$ for the first value $a'_{opt}$ of the transformed first load reflection factor a' acting at the first source output $QA_C$, as is shown schematically by way of example in FIG. 24. The first value $a'_{opt}$ of the transformed first load reflection factor a' differs from the complex conjugate of the first source reflection factor b here.

In one method, the second value $c'_{opt}$ of the transformed second load reflection factor c' is determined. In this method, the second source element $Q_2$ has a second optimum $Max_2$ of a second parameter $G_2$ for the second value $c'_{opt}$ of the transformed second load reflection factor c' acting at the second source output $QA_2$, as is shown schematically by way of example in FIG. 25. Here, the second value $c'_{opt}$ of the transformed second load reflection factor c' differs from the complex conjugate of the second source reflection factor d.

FIG. 23 shows a distance value $P_{aus}$, and a third value $a'_{est}$ of the transformed first load reflection factor a', and a fourth value $c'_{est}$ of the transformed second load reflection factor c'. These values are determined in a method explained below. In this method, the distance value $P_{aus}$, and the third value $a'_{est}$ of the transformed first load reflection factor a', and the fourth value $c'_{est}$ of the transformed second load reflection factor c' are determined by the means that a first distance $P_1$, and a second distance $P_2$, and a third distance $P_3$, and a fourth distance $P_4$ are determined. The distances $P_1$, $P_2$, $P_3$, and $P_4$ are shown schematically in FIG. 23.

A first distance $P_1$ between the first value $a'_{opt}$ and the transformed first load reflection factor a' is defined by:

$$P_1 = \operatorname{arctanh}\left(\frac{|a'_{opt} - a'|}{|1 - a'^* a'_{opt}|}\right) \quad (34)$$

Here, $P_1$ is the first distance $P_1$, a' is the transformed first load reflection factor a', a'* is the complex conjugate a' of the transformed first load reflection factor a', and $a'_{opt}$ is the first value $a'_{opt}$.

A second distance $P_2$ between the second value $c'_{opt}$ and the transformed second load reflection factor c' is defined by:

$$P_2 = \operatorname{arctanh}\left(\frac{|c'_{opt} - c'|}{|1 - c'^* c'_{opt}|}\right) \quad (35)$$

Here, $P_2$ is the second distance $P_2$, c' is the transformed second load reflection factor c', c'* is the complex conjugate c'* of the transformed second load reflection factor c', and $c'_{opt}$ is the second value $c'_{opt}$.

A third distance $P_3$ between the transformed first load reflection factor a' and the complex conjugate b* of the first source reflection factor b is defined by:

$$P_3 = \operatorname{arctanh}\left(\frac{|a' - b^*|}{|1 - ba'|}\right) \quad (36)$$

Here, $P_3$ is the third distance $P_3$, b is the first source reflection factor b, b* is the complex conjugate b* of the first source reflection factor b, and a' is the transformed first load reflection factor a'.

A fourth distance $P_4$ between the transformed second load reflection factor c' and the complex conjugate d* of the second source reflection factor d is defined by:

$$P_4 = \operatorname{arctanh}\left(\frac{|c' - d^*|}{|1 - dc'|}\right) \tag{37}$$

Here, $P_4$ is the fourth distance $P_4$, d is the second source reflection factor d, d* is the complex conjugate d* of the second source reflection factor d, and c' is the transformed second load reflection factor c'.

The distance value $P_{aus}$, and the third value $a'_{est}$, and the fourth value $c'_{est}$ are determined by the means that a minimum of the geometric mean of the first distance $P_1$ and the second distance $P_2$ is determined under the boundary condition that the third distance $P_3$ is equal to the fourth distance $P_4$ and is not zero. The minimum of the geometric mean is determined by the means that the transformed first load reflection factor a' and the transformed second load reflection factor c' are varied, and the complex conjugate b* of the first source reflection factor b, and the complex conjugate d* of the second source reflection factor d, and the first value $a'_{opt}$ and the second value $c'_{opt}$ have a fixed value, as is shown schematically in the exemplary embodiment in FIG. 23.

The value of the third distance $P_3$ associated with the minimum is set as the distance value $P_{aus}$. The value of the transformed first load reflection factor a' associated with the minimum is set as the third value $a'_{est}$. The value of the transformed second load reflection factor c' associated with the minimum is set as the fourth value $c'_{est}$.

Figure 26:
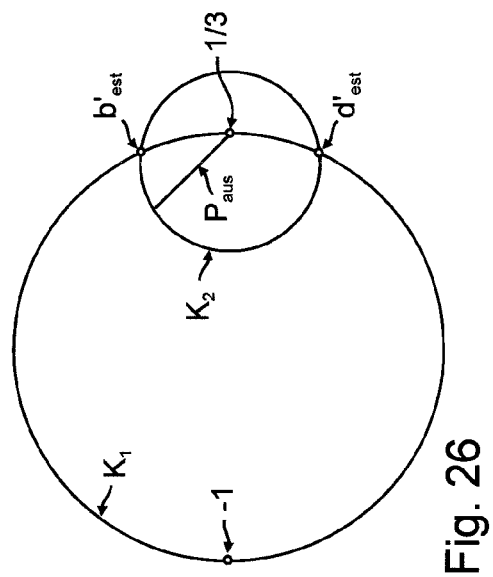
FIG. 26 is a schematic representation of two Poincaré circles.

In FIG. 26, a first circle $K_1$, and a second circle $K_2$, and a fifth value $b'_{est}$, and a sixth value $d'_{est}$ are shown schematically. The fifth value $b'_{est}$ of the transformed first source reflection factor b' and the sixth value $d'_{est}$ of the transformed second source reflection factor d' are determined by the means that the first circle $K_1$ with a real center point that intersects a real reflection factor value of ⅓ and a real reflection factor value of −1 is determined. In addition, the second circle $K_2$ is determined as the set of all points y with a distance from the real reflection factor value of ⅓ equal to the distance value $P_{aus}$ by:

$$P\left(y, \frac{1}{3}\right) = \operatorname{arctanh}\left(\frac{\left|y - \frac{1}{3}\right|}{\left|1 - y\frac{1}{3}\right|}\right) \equiv P_{aus} \tag{38}$$

Here, y is a point y on the second circle $K_2$, and $P_{aus}$ the distance value $P_{aus}$ of the third distance $P_3$.

The fifth value $b'_{est}$ is determined as equal to the value of a first point of intersection between the first circle $K_1$ and the second circle $K_2$, and the sixth value $d'_{est}$ is determined as equal to the value of a second point of intersection between the first circle $K_1$ and the second circle $K_2$ different from the first point of intersection.

In the exemplary embodiment in FIG. 22, the first matching network $M_1$ is determined using the first source reflection factor b, and the fifth value $b'_{est}$ of the transformed first source reflection factor b', and the first load reflection factor a, and the third value $a'_{est}$ of the transformed first load reflection factor a'.

Moreover, in the exemplary embodiment in FIG. 22, the second matching network $M_2$ is determined using the second source reflection factor d and the sixth value $d'_{est}$ of the transformed second source reflection factor d' and the second load reflection factor c and the fourth value $c'_{est}$ of the transformed second load reflection factor c'.

In the exemplary embodiment in FIG. 22, two source elements $Q_1$, $Q_2$ drive a common load L, each through a matching network $M_1$, $M_2$ and the two inputs $E_1$, $E_2$ of a T-section T. In this regard, the circuit situation of the exemplary embodiment from FIG. 22 resembles the doubled use of the exemplary embodiment in FIG. 1 in one circuit. As has already been the case with the exemplary embodiment from FIG. 12, however, in the exemplary embodiment in FIG. 22 the parameters $G_1$, $G_2$ on which the optimization is based can likewise only be formulated as a characteristic of the overall circuit under consideration.

Whereas in the exemplary embodiment in FIG. 12 an optimal value of the second image impedance that is compatible with the mathematical boundary conditions for reciprocal, lossless matching networks $M_1$, $M_2$ is determined from, e.g., two fixed counter-image impedances and one fixed image impedance, in the exemplary embodiment in FIG. 22, proceeding from given source and load impedances and a known optimal pair of transformed load impedances, a pair of varied transformed load impedances is determined that best approximates the optimal pair of transformed load impedances, taking into account the mathematical limitations due to the reciprocity and losslessness of the matching networks.

For reasons of improved clarity, the exemplary embodiment in FIG. 22 is described with the aid of a load L assumed to be real, and with at least implicit reference to two source elements $Q_1$, $Q_2$ of the same type that generate signals of equal signal amplitude and frequency at the two inputs $E_1$, $E_2$ of the T-section T. Of course, the application of the embodiment of the method described in the exemplary embodiment in FIG. 22 extends mutatis mutandis to a considerably broader range of load reflection factors, source elements, and source signals. In turn, the load impedances can be effective load impedances that take into account the influence of load modulation by the respective other signal source.

All exemplary embodiments that will be explained are based on a two-stage procedure: First, desirable pairs of image impedances and counter-image impedances are determined, and subsequently a direct attempt is made to synthesize a matching network that maps the counter-image impedances onto the image impedances. The method uses mathematical relationships for an important class of matching networks (reciprocal, lossless) to first derive an optimal transforming action of the matching network being sought that is compatible with termination conditions, in order to thereafter derive a suitable matching network, for example from this transforming action.

The application of the method in the above-described exemplary embodiments to two circuit topologies (series and parallel circuits) that are significantly different from one another, in two embodiments that are significantly different from one another, spans the full range of application of the novel and generally useful principle:

For the case of the series circuit, in the exemplary embodiment in FIG. 9 both counter-image impedances and both image impedances are in each case located on the same side of the matching network, for example, while in the exemplary embodiment in FIG. 1 one first counter-image impedance and one second image impedance are located on one side of the matching network $M_1$ but one second counter-image impedance and one first image impedance are located on the opposite side of the matching network $M_1$.

For the case of the parallel circuit, the exemplary embodiment in FIG. 12 shows the optimization of a load impedance (or a transformed load impedance) with the other load impedance (transformed load impedance) being held constant, while an optimal pair of two variable transformed load impedances is determined using the exemplary embodiment in FIG. 22.

If, as for example in FIG. 12 or FIG. 22, two source elements $Q_1$, $Q_2$ operate in parallel with one another (for example, through a T-section T) into the same load L, then a first component of a signal coming from the first source element $Q_1$ is reflected back into the first source element $Q_1$, and a second component goes into the load L, but a third component goes into the output of the second source element $Q_2$. The second source element $Q_2$ cannot distinguish, among the signal components reaching it, between the signal component arising from its own reflected signal and the signal component originating from the first source element $Q_1$. All that the second source element $Q_2$ experiences is another signal reflected to it. The first source element $Q_1$ thus modifies the load impedance perceived by the second source element $Q_2$. The load reflection factor perceived by the second source element $Q_2$, which is associated with the perceived load impedance, can also be referred to as the effective load reflection factor.

A transformation of a "physical" load reflection factor into the "effective" load reflection factor is called load modulation (or "active load pull"). When reference is made hereinafter to a reflection factor that is measured into an input of a T-section T, then this reflection factor can be a physical reflection factor or an effective reflection factor unless explicitly specified.

A special case is the lossless addition of the output signals of two identical source elements $Q_1$, $Q_2$ at the symmetrical T-section T, as is explained in detail in the description of the equivalent circuit diagrams from FIG. 12 ff.

The exemplary embodiments are explained for a simple understanding of real effective load reflection factors. Since every impedance can be represented with both a real and a complex reflection factor through an appropriate selection of a complex reference impedance, the simplification for real effective load reflection factors takes place without restricting generality: Accordingly, applicability of the method is not restricted to real impedances on account of the explanation using real reflection factors.

The operation of complex conjugation is indicated in the formulas by appending an asterisk to a quantity to be conjugated. For example, the complex conjugate of a is a*. Except where explicitly stated otherwise, the following description of the exemplary embodiments is directed to power-preserving, reciprocal matching networks $M_1$, $M_2$.

Except where explicitly stated otherwise, a matching network $M_1$, $M_2$ is hereinafter provided as a circuit section with a first connection $A_1$—for example, as output—and a second connection $A_2$—for example, as input. An arbitrary direction of passage (here, for a signal wave)—typically defined from the source element to the load—through the matching network $M_1$, $M_2$—for example, from the input to the output—is referred to hereinafter as the forward direction. The opposite direction of passage is referred to as the reverse direction. A matching network $M_1$, $M_2$ traversed in the reverse direction is referred to as the reverted matching network associated with this matching network $M_1$, $M_2$.

If the transforming action of a matching network $M_1$, $M_2$ is mathematically described by a function f, which operates on the reflection factor plane, then f is called the describing function of the matching network $M_1$, $M_2$. A describing function $f^R$ of the reverted matching network is called the reverted describing function $f^R$.

In cases where an extreme of the parameter serves as the optimum, the extremal property changes from "minimal" to "maximal" and vice versa with an additional factor of −1 in the definition of the parameter. The designation (Max) for the maximum as optimum in an exemplary embodiment is accordingly a minimum (Min) as optimum in a different exemplary embodiment without a detailed explanation being required.

The designation chosen hereinafter for individual quantities, such as "load reflection factor" and "source reflection factor," or "load element" and "source element," does not specify in a restrictive manner how the designated quantities are arranged in a specific arrangement relative to one another in the direction of signal flow or opposite to the direction of a signal flow in the circuit under discussion.

In order to be able to refer explicitly to a non-Euclidean nature of a distance under consideration when specifying geometric quantities that have the nature of a distance or are determined by distance, a radius is referred to as a "Poincaré radius" for example, and a circle as a "Poincaré circle," when the circle is the locus of all points at a fixed Poincaré distance—equal to the Poincaré radius—from a center point.

As is evident using the symmetry of the transformation paths in the Smith chart, for a non-resistive, reciprocal matching network $M_1$, $M_2$ with a load input and a source input, freedom from reflection with respect to a real load L at the load output $A_1$ of the matching network $M_1$ is equivalent to complex conjugate matching at the source input $A_2$ of the matching network $M_1$.

In general, for a series circuit having two circuit elements $Q_1$ or $Q_2$ and L connected together by a matching network $M_1$, $M_2$, it is only possible in special cases to design the matching network $M_1$, $M_2$ such that the input reflection factor of the first circuit element in a first direction relative to the signal flow is mapped by the matching network $M_1$, $M_2$ to a load reflection factor that is as optimally matched as possible for the second circuit element, while an output reflection factor of the second circuit element in a second direction relative to the signal flow is simultaneously mapped by the matching network $M_1$, $M_2$, traversed in the reverse direction, to a source reflection factor that is as optimally matched as possible for the first circuit element.

In general, impedances and reflection factors are complex-valued; accordingly, every impedance value/reflection factor value is uniquely specified by specifying two real degrees of freedom. The aforementioned mathematical boundary conditions for the transforming action of reciprocal, lossless matching networks $M_1$, $M_2$ are such that a single real degree of freedom for the transforming action of the matching network $M_1$, $M_2$ remains after specifying a counter-image impedance and an image impedance under the transformation of the matching network $M_1$, $M_2$ traversed in one direction. This is not enough to be able to freely specify the image impedance for a second counter-image impedance under the matching network $M_1$, $M_2$ traversed in the same direction or the opposite direction. In fact, as explained below, the second image impedance value is restricted to the boundary of a circle.

In a method for designing an electronic circuit, two pairs of counter-image impedances and image impedances that are optimal within the scope of the mathematical boundary conditions under a reciprocal, non-resistive matching network $M_1$, $M_2$ are sought, wherein the mapping of one counter-image impedance onto the associated image impedance by means of the matching network $M_1$, $M_2$ takes place in a first direction, and the mapping of the second counter-image impedance onto the associated image impedance takes place in the opposite direction.

A series circuit of two circuit elements connected together by a matching network $M_1$, $M_2$ is likewise possible. Two pairs of counter-image impedances and image impedances that are optimal within the scope of the mathematical boundary conditions under a reciprocal, non-resistive matching network $M_1$, $M_2$ are sought, wherein the mapping of both counter-image impedances onto the respective associated image impedances by means of the matching network $M_1$, $M_2$ takes place in the same direction of traversal.

The method for designing an electronic circuit can be applied to a circuit topology in which the signals of two source elements $Q_1$, $Q_2$ are conducted to a common load L through a T-section T.

The fundamentals common to the explained exemplary embodiments are explained in detail below.

The Schwarz-Pick Theorem

In circuit design, it is frequently necessary to match the impedance levels of subassemblies or components that follow one another in the signal path. This is the task of separate, interposed functional blocks, the so-called matching networks, e.g., $M_1$, $M_2$ in FIG. 12.

FIG. 1 shows an electronic circuit in the form of a chain having a first amplifier as source element $Q_1$ with a source reflection factor $b_{on}$, a first matching network $M_1$ with a first connection $A_1$ and a second connection $A_2$, and, for example, a second amplifier as load element L with a load reflection factor $a_{on}$, wherein the first connection $A_1$ is connected to the load element L and the second connection $A_2$ is connected to the first source element $Q_1$. With the aid of the matching network $M_1$, a transformed first load reflection factor $a_{on}'$ into the matching network $M_1$ measured at the second connection $A_2$ is achieved, and a transformed first source reflection factor $b_{on}'$ into the first matching network $M_1$ at the first connection $A1$ is achieved.

The design of the matching network M1 from reactive elements within the amplifier chain Q1, L, as is shown in the form of the circuit 1 in FIG. 1, is based on the following assumption: If the matching network $M_1$ maps the source reflection factor $b_{on}$ onto a given transformed first source reflection factor $b_{on}'$—wherein, e.g., an efficiency of the power gain of the load element L can be optimized by a desired given transformed first source reflection factor $b_{on}'$, for example—then the transformed first load reflection factor $a_{on}'$ that the source element $Q_1$ experiences lies on a circle in the Smith chart, hereinafter referred to as the load circle. The load circle does not depend on the specific first matching network $M_1$, but instead depends (for a given first source reflection factor $b_{on}$) only on the transformed first source reflection factor $b_{on}'$ of the first amplifier stage $Q_1$ and the first load reflection factor $a_{on}$ (i.e., the input reflection factor of the second amplifier stage).

In the course of further investigations by the applicant, it has been shown that the counter-image of the load circle also represents a circle in the Smith chart, hereinafter referred to as the counter-image circle, among the set of all reciprocal, lossless matching networks that map the given source reflection factor $b_{on}$ onto the given transformed source reflection factor $b_{on}'$ for a given first load reflection factor $a_{on}$.

In general, the transforming action of electronic matching networks $M_1$, $M_2$ is described mathematically by Möbius transformations. One property of Möbius transformations is the preservation of circles: circles are always mapped onto circles, in particular the mapping of the counter-image circle onto the load circle:

Every point on the counter-image circle is mapped onto a point on the load circle by all reciprocal, lossless matching networks $M_1$, $M_2$, that map the given source reflection factor $b_{on}$ onto the given transformed source reflection factor $b_{on}'$.

In the course of further investigations by the applicant, the application of a theorem of function theory in the field of electrical engineering has been developed:

The Schwarz-Pick theorem. If f: D|→D| is a holomorphic mapping of the unit disk D| onto itself, then it is generally true for all $z_1$, $z_2$ ∈D|

$$\left|\frac{f(z_1) - f(z_2)}{1 - f(z_1)^* f(z_2)}\right| \leq \frac{|z_1 - z_2|}{|1 - z_1^* z_2|}, \tag{39}$$

with equality for all $z_1$, $z_2$ ∈D| specifically when f is an analytic automorphism of the unit disk D|, and thus a Möbius transformation that isomorphically maps the unit disk D| onto itself.

In the Poincaré model of hyperbolic geometry, the Poincaré distance between two points $z_1$, $z_2$ on the unit disk is in general measured as:

$$P(z_1, z_2) = \operatorname{arctanh}\left(\frac{|z_1 - z_2|}{|1 - z_1^* z_2|}\right). \tag{40}$$

The Schwarz-Pick theorem thus has the consequence that the matching networks $M_1$, $M_2$, which are automorphisms of the unit disk, preserve the Poincaré distance.

Now, the matching networks $M_1$, $M_2$ that are considered within the scope of the design of power amplifiers are non-resistive, i.e., power preserving. Accordingly, such a matching network $M_1$, $M_2$ does not transform any active point in the Smith chart to a passive point or vice versa: The transforming action of a non-resistive (and reciprocal) matching network $M_1$, $M_2$ is an automorphism of the unit disk D|.

As is shown above, the following is also the case: A matching network $M_1$ that transforms a source impedance present at an input $A_2$ into a complex conjugate of a load impedance exhibited at an output $A_1$ of the matching network $M_1$ when traversed in a first direction, maps the load impedance onto the complex conjugate of the source impedance when traversed in the opposite direction. The same applies to the reflection factors on account of the transforming action.

Lastly, together with the transforming action of a matching network $M_1$ traversed in a first direction, the transforming action of the matching network $M_1$ traversed in the opposite direction is also always an automorphism of the unit disk D|.

To summarize, the following theorem thus applies: if
a) M is a non-resistive, reciprocal matching network $M_1$,
b) f: D|→D| describes the transforming action of the matching network $M_1$ traversed in a first direction,
c) $f^R$: D|→D| describes the transforming action of the matching network $M_1$ traversed in the opposite direction (=reverted);
d) and it is also true that f(a)=a' for two points a, a' ∈D| then it follows that:

a. i) $f^R(a_{on}'^*) = a_{on}^*$ (41)

b. ii) $P(a_{on}, b_{on}) = P(f(a_{on}), f(b_{on}))$ (42)

c. iii) $P(a_{on}'^*, b_{on}) = P(f^R(a_{on}'^*), f^R(b_{on}))$ (43)

wherein $P(a_{on}'^*, b_{on})$ designates the Poincaré distance between the two points $a_{on}'^*$ and $b_{on}$ (reflection factors).

Figure 5:
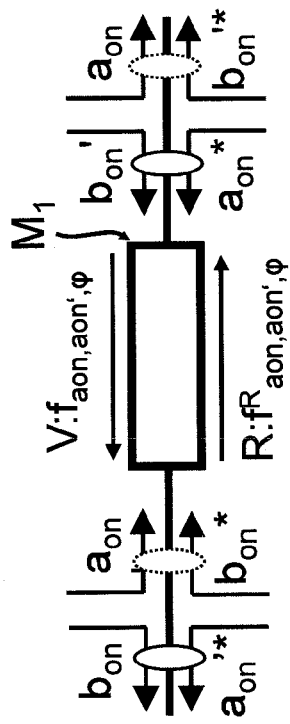
FIG. 5 is a schematic representation of load reflection factors with regard to a matching network.

In FIG. 5, an exemplary embodiment for the relationship expressed in the above theorem is illustrated graphically in the form of a diagram, which is hereinafter referred to as the matching constellation:

in an assumed forward direction from right to left, the matching network $M_1$ maps the load reflection factor $a_{on}$ onto the transformed load reflection factor $a_{on}'$. This relationship is represented in FIG. 5 by the angled arrows labeled with $a_{on}$ and $a_{on}'$. The assumed forward direction V is indicated by an arrow labeled with the formula symbol of the describing function $f_{aon,aon',\phi}$.

According to lemma i) of the above theorem, the reverted matching network $M_1$ maps the complex conjugate $a_{on}'^*$ of the transformed load reflection factor $a_{on}'$ onto the complex conjugate $a_{on}^*$ of the load reflection factor $a_{on}$, represented by the angled arrows labeled with $a_{on}'^*$ and $a_{on}^*$. The transformation direction R of the reverted matching network $M_1$ is indicated by an arrow labeled with the formula symbol of the reverted describing function $f^R_{aon,aon',\phi}$.

The matching network $M_1$, traversed in the reverse direction R, also maps the source reflection factor $b_{on}$ onto the transformed source reflection factor $b_{on}'$, represented by the angled arrows labeled with $b_{on}$ and $b_{on}'$. The reverse direction R is indicated by an arrow labeled with the formula symbol of the reverted describing function $f^R_{aon,aon',\phi}$.

Lemma i), applied to the describing function $f^R_{aon,aon',\phi}$ of the matching network $M_1$ traversed in the reverse direction, states that the complex conjugate $b_{on}'^*$ of the transformed source impedance $b_{on}'$ is mapped onto the complex conjugate $b_{on}^*$ of the source impedance $b_{on}$ by the matching network $M_1$ traversed in the forward direction, indicated by the angled arrows labeled with $b_{on}'^*$ and $b_{on}^*$.

The statement of lemmas ii) and iii)—the preservation of the Poincaré distance under the describing function and under the reverted describing function—is indicated in FIG. 5 by a pair of ellipses for each: The preservation of the Poincaré distance between the complex conjugate $a_{on}'^*$ of the transformed load reflection factor $a_{on}'$ and the source reflection factor $b_{on}$ under the reverted describing function $f^R_{aon,aon',\phi}$ (lemma iii)) is shown schematically by a first solid ellipse, which connects the angled arrows with reference symbols $a_{on}'^*$ and $b_{on}$, and a second solid ellipse, which connects the angled arrows with reference symbols $b_{on}'$ and $a_{on}^*$.

The preservation of the Poincaré distance between the complex conjugate $b_{on}'$ of the transformed source reflection factor $b_{on}'$ and the load reflection factor $a_{on}$ under the describing function $f_{aon,aon',\phi}$ (lemma ii)) is shown schematically by a first dashed ellipse, which connects the angled arrows with reference symbols $a_{on}$ and $b_{on}'^*$, and a second dashed ellipse, which connects the angled arrows with reference symbols $a_{on}'$ and $b_{on}^*$.

Furthermore, on account of the symmetry of the definition of the Poincaré distance under the operation of complex conjugation, the Poincaré distances between the complex conjugate $a_{on}'^*$ of the transformed load reflection factor $a_{on}'$ and the source reflection factor $b_{on}$, and between the complex conjugate $b_{on}'$ of the transformed source reflection factor $b_{on}'$ and the load reflection factor $a_{on}$, which belong to the relevant pairs of ellipses in FIG. 5, are equal.

If one maps a source reflection factor $b_{on}$ onto a specific value of the transformed source reflection factor $b_{on}'$, then in accordance with the matching constellation from FIG. 5, the transformed load reflection factor $a_{on}'$ is restricted to a Poincaré circle about the complex conjugate $b_{on}^*$ of the source reflection factor $b_{on}$. Here, a Poincaré radius is equal to the Poincaré distance between the complex conjugate $a_{on}^*$ of the load reflection factor $a_{on}$ and the determined value of the transformed source reflection factor $b_{on}'$.

A value is now sought from among the values of the transformed load reflection factor $a_{on}'$ on the previously defined circle for which a given parameter of the circuit—for example a power gain—takes on an optimal value. The optimal value of the parameter depends on the determined value of the transformed source reflection factor $b_{on}'$.

If one maps the load reflection factor $a_{on}$ (with the aid of the matching network $M_1$, now traversed in the opposite direction) onto the optimal value for the transformed load reflection factor $a_{on}'$, then, likewise in accordance with the matching constellation from FIG. 5, the transformed source reflection factor $b_{on}'$ lies on another Poincaré circle of the same radius, but about the complex conjugate $a_{on}^*$ of the load reflection factor $a_{on}$. An optimum of the parameter can in turn be found on the additional circle, now for the transformed source reflection factor $b_{on}'$. The optimum depends on the optimal value, which for its part is defined with respect to the determined value of the transformed source reflection factor $b_{on}'$.

An iteration provides a pair having a specific value of the transformed load reflection factor $a_{on}'$ and a specific value of the transformed first source reflection factor $b_{on}'$, by means of which the parameter of the circuit is optimized, under the boundary condition of a given Poincaré distance $P_R$ between the complex conjugate $a_{on}^*$ of the first load reflection factor $a_{on}$ and the transformed first source reflection factor $b_{on}'$. This Poincaré distance $P_R$ is equal to the Poincaré distance between the complex conjugate $b_{on}^*$ of the source reflection factor $b_{on}$ and the transformed load reflection factor $a_{on}'$.

In a simplified method for the exemplary embodiment from FIG. 1, pairs that optimize the parameter of the circuit are determined: Proceeding from a number of Poincaré radii $P_R$, optimal reflection factor pairs on circles of the same Poincaré radius within two concentric families of Poincaré circles about the complex conjugate $b_{on}^*$ of the first source reflection factor $b_{on}$ and the complex conjugate $a_{on}^*$ of the first load reflection factor $a_{on}$ are found. This method is explained below using FIG. 6 and FIG. 7.

Figure 6:
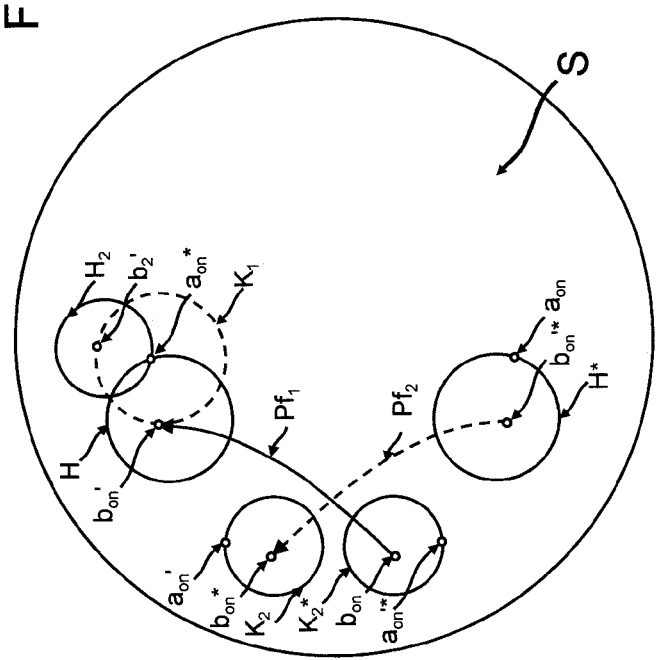
FIG. 6 is a Smith chart with Poincaré circles.

FIG. 6 shows in a schematic Smith chart S:
a first load reflection factor $a_{on}$,
a first source reflection factor $b_{on}$,
the complex conjugate $a_{on}^*$ of the first load reflection factor $a_{on}$,
the complex conjugate $b_{on}^*$ of the first source reflection factor $b_{on}$,
a transformed first source reflection factor $b_{on}'$,
a transformed first load reflection factor $a_{on}'$,
the complex conjugate $b_{on}'^*$ of the transformed first source reflection factor $b_{on}'$,
the complex conjugate $a_{on}'^*$ of the transformed first load reflection factor $a_{on}'$,
another transformed source reflection factor $b_2'$.

In addition to the reflection factors, FIG. 6 shows
a first Poincaré circle $K_1$ about the complex conjugate $b_{on}^*$ of the first source reflection factor $b_{on}$,
a second Poincaré circle $K_2$ about the complex conjugate $a_{on}^*$ of the first load reflection factor $a_{on}$,
the complex conjugate $K_1^*$ of the first Poincaré circle $K_1$,
an auxiliary Poincaré circle $H_1$ about the transformed first source reflection factor $b_{on}'$,
the complex conjugate $H_1^*$ of the auxiliary Poincaré circle $H_1$, and
an additional auxiliary Poincaré circle $H_2$ about the additional transformed source reflection factor $b_2'$.

With the exception of the unit circle as the edge of the Smith chart S, all circles shown in FIG. 6 have the same Poincaré radius, which Poincaré radius is given as the Poincaré distance between the transformed first source reflection factor $b_{on}'$ and the complex conjugate $a_{on}^*$ of the first load reflection factor $a_{on}$, so that the first load reflection factor $a_{on}$ lies on the complex conjugate $H_1^*$ of the auxiliary Poincaré circle $H_1$, the complex conjugate $a_{on}^*$ of the first load reflection factor $a_{on}$ lies on the auxiliary Poincaré circle $H_1$ and on the additional auxiliary Poincaré circle $H_2$, the transformed first load reflection factor $a_{on}'$ lies on the first Poincaré circle $K_1$, and the complex conjugate $a_{on}'^*$ of the transformed first load reflection factor $a_{on}'$ lies on the complex conjugate $K_1^*$ of the first Poincaré circle $K_1$.

A solid arrow indicates the mapping of the first source reflection factor $b_{on}$ onto the transformed first source reflection factor $b_{on}'$ by means of the matching network $M_1$, and a dashed arrow indicates the mapping of the complex conjugate $b_{on}'$ of the transformed first source reflection factor $b_{on}'$ onto the complex conjugate $b_{on}^*$ of the first source reflection factor $b_{on}$ by the reverted matching network $M_1$.

On account of the preservation of the Poincaré distance under the describing function $f_{aon,aon',\phi}$ of the matching network $M_1$, during the mapping of the first source reflection factor $b_{on}$ onto the transformed first source reflection factor $b_{on}'$, the complex conjugate $K_1^*$ of the first Poincaré circle $K_1$ about the source reflection factor $b_{on}$ is mapped onto the auxiliary Poincaré circle $H_1$ about the transformed first source reflection factor $b_{on}'$. In contrast, if the first source reflection factor $b_{on}$ is transformed into the additional transformed source reflection factor $b_2'$ by means of the matching network $M_1$, then the complex conjugate $K_1^*$ of the first Poincaré circle $K_1$ about the first source reflection factor $b_{on}$ is mapped onto the additional auxiliary Poincaré circle $H_2$ about the additional transformed source reflection factor $b_2'$.

At the same time, on account of the preservation of the Poincaré distance under the reverted describing function $f^R_{aon,aon',\phi}$ of the matching network $M_1$ traversed in the reverse direction, in the mapping of the complex conjugate $b_{on}'^*$ of the transformed first source reflection factor $b_{on}'$ onto the complex conjugate $b_{on}^*$ of the first source reflection factor $b_{on}$, the complex conjugate $H_1^*$ of the auxiliary Poincaré circle $H_1$ about the complex conjugate $b_{on}'^*$ of the transformed first source reflection factor $b_{on}'$ is mapped onto the first Poincaré circle $K_1$ about the complex conjugate $b_{on}^*$ of the first source reflection factor $b_{on}$.

Accordingly, for every value of the transformed first source reflection factor $b_{on}'$, all possible values of the transformed first load reflection factor $a_{on}'$ lie on the first Poincaré circle $K_1$. For the transformed first source reflection factor $b_{on}'$, a value of the transformed first load reflection factor $a_{on}'$ on the first Poincaré circle $K_1$ is determined for which the parameter of the circuit takes on a (local) optimum.

In addition, permissible values of the transformed first load reflection factor $a_{on}'$ on the first Poincaré circle $K_1$ are limited by the determination of the transformed additional source reflection factor $b_2'$ on the second Poincaré circle $K_2$ and (at the same Poincaré distance from the complex conjugate $a_{on}^*$ of the first load reflection factor $a_{on}$) of the transformed first source reflection factor $b_{on}'$.

For the additional transformed source reflection factor $b_2'$, an additional value of the transformed first load reflection factor $a_{on}'$ on the first Poincaré circle $K_1$ is determined for which the parameter of the circuit takes on a (local) optimum.

In a completely analogous manner, all values of the transformed first source reflection factor $b_{on}'$ for which the transformed first load reflection factor $a_{on}'$ is restricted to the first Poincaré circle $K_1$ actually lie on the second Poincaré circle $K_2$.

Accordingly, the determination of the pairs of a transformed first source reflection factor $b_{on}'$ and a transformed first load reflection factor $a_{on}'$ that optimize the parameter is limited to pairs for which the Poincaré distance of the transformed first load reflection factor $a_{on}'$ from the complex conjugate $b_{on}^*$ of the first source reflection factor $b_{on}$ is equal to the Poincaré distance of the transformed first source reflection factor $b_{on}'$ from the complex conjugate $a_{on}^*$ of the first load reflection factor $a_{on}$.

Figure 7:
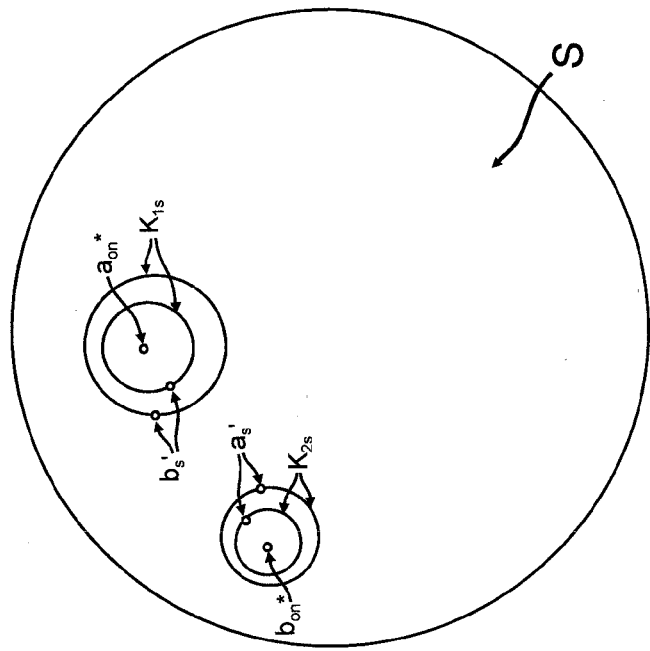
FIG. 7 is a Smith chart with Poincaré circles.

This state of affairs is highlighted in a separate illustration in FIG. 7. In a Smith chart S, FIG. 7 shows the complex conjugate $a_{on}^*$ of the first load reflection factor $a_{on}$, the complex conjugate $b_{on}^*$ of the first source reflection factor $b_{on}$, a first family of points $b_s'$ of two transformed source reflection factors, a second family of points $a_s'$ of two transformed load reflection factors, and In addition to the reflection factors, FIG. 7 shows:

a first family of circles $K_{1s}$ of two first Poincaré circles about the complex conjugate $b_{on}^*$ of the first source reflection factor $b_{on}$, which first family $K_{1s}$ contains a Poincaré circle with a first Poincaré radius, and a Poincaré circle with a second Poincaré radius, and a second family of circles $K_{2s}$ of second Poincaré circles about the complex conjugate $a_{on}^*$ of the load reflection factor $a_{on}$, which second family $K_{2s}$ contains a Poincaré circle with the first Poincaré radius and a Poincaré circle with the second Poincaré radius.

Each transformed source reflection factor $b_s'$ from the first family of points $b_s'$ lies on one Poincaré circle from the first family of circles $K_{1s}$, and each transformed load reflection factor $a_s'$ from the second family of points $a_s'$ lies on one Poincaré circle from the second family of circles $K_{2s}$.

For a set of given Poincaré distances, pairs are formed, each having one transformed first load reflection factor $a_{on}'$ at a first Poincaré distance from the complex conjugate $b_{on}^*$ of the first source reflection factor $b_{on}$ and one transformed first source reflection factor $b_{on}'$ at the first Poincaré distance from the complex conjugate $a_{on}^*$ of the first load reflection factor $a_{on}$, and one pair is determined among the pairs of reflection factors thus determined such that the parameter takes on an optimum.

Möbius transformations and the automorphisms of the unit disk

A Möbius transformation is a mapping f of the complex number plane onto itself, of the form:

$$f(z) = \frac{\alpha z + \beta}{\gamma z + \delta}, \tag{44}$$

where z is a point on the complex number plane and $\alpha$, $\beta$, $\gamma$, $\delta$ are arbitrary complex constants.

While the group of Möbius transformations thus has six real degrees of freedom (the fraction can be shortened by 6, for example, without changing the mapping, so that the four constants and $\alpha$, $\beta$, $\gamma$, $\delta$ only represent three complex degrees of freedom), the automorphism group of the unit disk is a proper subgroup of the Möbius transformations: The automorphisms of the unit disk can be represented as:

$$f(z) = e^{i\phi}\frac{z - z_0}{1 - z_0^* z}, \quad |e^{i\phi}| = 1 \tag{45}$$

With a complex automorphism parameter $z_0$ and a cyclic degree of freedom $\phi$, the automorphism group, and thus the group of transforming actions of non-resistive reciprocal matching networks, have only three degrees of freedom (for a given frequency).

If one requires a matching network $M_1$ to transform a first reflection factor $a_{on}$ into a second reflection factor $b_{on}*$ different from the first, $$f(a_{on}) = b_{on}*, \tag{46}$$

where f describes the transforming action of the matching network $M_1$ traversed in the forward direction V, there remain for the set N of transforming actions of all such matching networks $M_1$ only the cyclic degree of freedom $\phi$: image and counter-image of an arbitrary reflection factor among the set N are closed curves.

The Schwarz-Pick theorem requires the form of Poincaré circles for the closed curves. Hence, the image $N(a_{on}')$ of a third reflection factor $a_{on}'$ among the set N is a Poincaré circle about the second reflection factor $b_{on}*$ with a Poincaré radius equal to the Poincaré distance $P(a_{on}, a_{on}')$ between the first reflection factor $a_{on}$ and the third reflection factor $a_{on}'$.

It follows, in particular, that one can choose the image $f(a_{on}')$ of the third reflection factor $a_{on}'$ under the transforming action f of the matching network $M_1$ (for reciprocal, power-preserving matching networks) only on a fixed Poincaré circle defined by the first and the second reflection factors $b_{on}*$. Furthermore, it follows that the transforming action f of the matching network $M_1$ is uniquely defined by the choice of one such image $f(a_{on}')$ on the given Poincaré circle.

Lastly, if one solves the above representation of the automorphisms for $f(a_{on}) = a_{on}'$ for $z_0$, one obtains:

$$f(z_1) = e^{i\varphi} \frac{z_1 - z_0}{1 - z_0^* z_1}, \quad f(a_{on}) = a_{on}' \tag{47}$$

$$\Rightarrow z_0 = \frac{1 - |a_{on}|^2}{|a_{on}|^2 |a_{on}'|^2 - 1} a_{on}' e^{-i\varphi} - \frac{1 - |a_{on}'|^2}{|a_{on}|^2 |a_{on}'|^2 - 1} a_{on} \tag{48}$$

This shows explicitly that the set of all describing functions for non-resistive, reciprocal matching networks that map a given load reflection factor $a_{on}$ onto a given transformed load reflection factor $a_{on}'$ have only one real degree of freedom.

Figure 8:
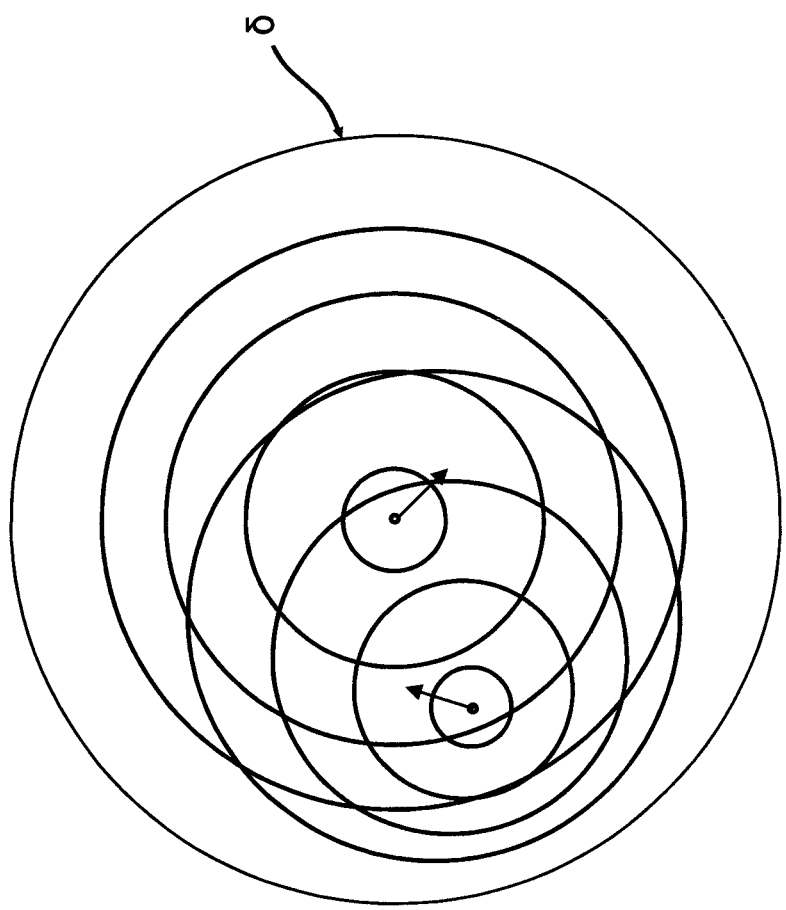
FIG. 8 is a Smith chart with two concentric families of Poincaré circles.

The effects of the state of affairs described are illustrated in FIG. 8. FIG. 8 shows, in the interior of the unit circle 5, two families of circles inscribed inside one another. A first family forms a family of concentric and equidistant circles about the origin in the sense of the Euclidean metric of the (Cartesian) plane. These circles are also concentric circles in the framework of hyperbolic geometry of the plane and measured in Poincaré distance.

The second family of circles about a point differing from the origin is equidistant and concentric in the Poincaré sense, but not when measured with the Euclidean metric of the plane.

FIG. 8 also shows two direction arrows, a first proceeding from the origin, a second proceeding from the point differing from the origin.

If the set of describing functions of all reciprocal, non-resistive matching networks is limited to the subset F of the functions that map the origin onto the point differing from the origin, then the image of one of the circles from the first family with a specific Poincaré radius in the subset F is that circle from the second family with the specific Poincaré radius.

If, in addition to the origin and the point differing from the origin into which the origin is transformed by means of the matching network $M_1$, a (single) additional pair is defined as having a reflection factor on a Poincaré circle (for a given Poincaré radius) about the origin, and its image under the matching network $M_1$ (if necessary, on a Poincaré circle of the same Poincaré radius about the point differing from the origin), then the transforming action of the matching network $M_1$ in the entire Smith chart is known, and the describing function is thus uniquely defined.

The same applies when a second direction proceeding from the image point is known in addition to a counter-image point and an image point under the describing function of the matching network $M_1$ for a first direction proceeding from the counter-image point.

The describing functions of reverted matching networks

A reverted matching network for a matching network $M_1$ transforming a counter-image reflection factor m (e.g. $m = a_{on}$) into an image reflection factor n (e.g. $n = a_{on}'$) is described by a reverted describing function $$f^R_{mn\phi} = f_{n^*m^*\phi R} \tag{49}$$

with automorphism parameter $z_0^R$ where the equals sign applies on account of symmetry. If one expresses the describing function of the matching network $M_1$ as $$f(z) = e^{i\phi} \frac{z - z_0}{1 - z_0^* z} \tag{50}$$

with $z_0 = \frac{1 - |m|^2}{|m|^2 |n|^2 - 1} n e^{-i\phi} - \frac{1 - |n|^2}{|m|^2 |n|^2 - 1} m,$ \tag{51} it follows that $$z_0^R = -e^{-i\phi R} Z_0^*, \tag{52}$$

and further:

$$\begin{cases} f_{mn\phi}(z_2^*) = & z_1^* = e^{i\phi} \dfrac{z_2^* - z_0(\phi)}{1 - z_0(\phi)^* z_2^*} \\ f^R_{mn\phi}(z_1) = f_{n^*m^*\phi R} \; (z_1) = z_2 = e^{i\phi R} \dfrac{z_1 - z_0^R(\phi_R)}{1 - z_0^R(\phi_R)^* z_1} \end{cases}, \tag{53}$$

$$\xrightarrow{z_0^R = -e^{-i\phi R} z_0^*} z_1^* = e^{i\phi} e^{i\phi R} z_1^*, \tag{54}$$

or $\phi = \phi_R$, $f^R_{mn\phi} = f_{n^*m^*\phi}$ \tag{55}

The describing function f of the matching network $M_1$ traversed in the forward direction uniquely determines the describing function $f^R$ of the reverted matching network; the operation of reversion is mathematically well-defined.

The knowledge of the describing function f (and likewise of the equivalent reverted describing function $f^R$), the application of which is used for designing matching networks that optimize circuit properties, creates great freedom in determining concrete matching networks whose transforming action physically implements the describing function f at a given operating frequency.

As has been shown, the transforming action of a non-resistive, reciprocal matching network has three real degrees of freedom at an operating frequency. If an image reflection factor and a counter-image reflection factor (different from the image reflection factor) associated with this image reflection factor under the matching network $M_1$ are defined, then only a single real degree of freedom remains. In consequence, the image or counter-image of every additional reflection factor under the matching network $M_1$ or the associated reverted matching network is limited to a circle. Accordingly, if a second pair having an image and a counter-image reflection factor—which can no longer be freely chosen independently from one another—is defined, the transformation properties of the matching network $M_1$ are largely known.

In the physical design of a matching network $M_1$, the unambiguous knowledge of the describing function f makes it possible to freely choose which two pairs of image and counter-image reflection factors are used for the determination, and in which direction of passage which of the two counter-images is transformed into its image.

While a uniquely determined describing function f belongs to each matching network $M_1$ at a fixed operating frequency, a large class/set of an extremely wide variety of matching networks and matching network topologies fit a given describing function f: A describing function can be implemented in many ways in the form of the matching network $M_1$ whose transforming action is given by the describing function f.

A physical matching network $M_1$ is designed from given transformation properties. For example, an adequately flexible circuit topology for a matching network $M_1$ is given. The topology is converted into an equation with the component values as variables. The equation is solved in accordance with the desired transforming action.

Another method is to carry out a circuit optimization with a circuit topology and variable component values with the aid of a computer program for circuit simulation in order to implement the desired transforming action with the aid of the circuit topology used.

Furthermore, the describing function f additionally opens up extensive possibilities in the investigation of parameters of a circuit. In particular, all transformation properties of the reciprocal, non-resistive matching network $M_1$ characterized by the describing function f at an operating frequency can be derived exclusively from the describing function f—even before design or knowledge of the matching network $M_1$ itself.

An extremely important advantage and advancement is:

The method presented makes it possible from the outset, from among all conceivable transforming actions of non-resistive, reciprocal matching networks, to limit oneself to those that are mathematically implementable in designing the circuit. The prior trial-and-error method is no longer necessary.

Furthermore, the method presented here makes it possible to take into account all effects of the transformation behavior on the parameter of the circuit even without knowledge of a concrete implementation of the transformation behavior defined by the describing function f.

Hence, instead of having to determine the transformation properties for a large number of previous, concrete matching networks so as to be able to investigate their effect on the circuit parameters, it is possible with the method described to seek out, from among all mathematically possible transforming actions, those through which the parameter of the circuit is optimized. The subsequent implementation is limited to physical matching networks with these few transformation properties.

The advance achieved by the method is explained below using an especially simple exemplary application. In this context, the amplifier chain as represented in FIG. 1 is used as a starting point.

So that the impedance levels transform in a trivial manner in a signal line occurring in a physical implementation of the circuit, the matching network $M_1$ is frequently designed in such a manner that it has an impedance of 50Ω at its end facing the signal line. To this end, a vector network analyzer is used, for example. Using test connections of the network analyzer introduced into the circuit, the mismatch from 50Ω of the connections of the matching network $M_1$ facing the signal line is minimized.

In addition to the obvious task of this optimization method, namely making the first and the second matching networks independent from one another, the prior art already implicitly accomplishes a second task: When non-resistive and reciprocal matching networks are used, the amplifiers are terminated at their connections with the complex conjugate of the relevant connection impedance terminated, and thus the small-signal power gain of the circuit is maximized.

Even without the above observations regarding the Schwarz-Pick theorem, one can directly convince oneself of the following using the symmetry properties of the transformation path of the matching network M1 made up of lumped-constant reactive elements in the Smith chart: Applied to an output impedance, the matching network M1, traversed in the forward direction, results in a target impedance. In contrast, with the reactive elements in reverse order, the matching network M1 traversed in the reverse direction maps the complex conjugate of the target impedance onto the complex conjugate of the output impedance. The sequential execution of the reversion of the matching network M1 and the complex conjugation of the impedances results in a mirroring of the transformation path on the real axis, including a change in the direction of traversal.

If the output impedance is real, for example equal to 50Ω, freedom from reflections at the end of the matching network M1 distant from the amplifier thus results in complex conjugate matching at its amplifier end. This matching is frequently designed for maximum power gain.

If it is not the small-signal power gain that is to be optimized, but instead, for example, the linear output power of an amplifier stage under the boundary condition of a given maximum mismatch between a 50Ω load and the impedance seen into the output of the matching network M1 distant from the amplifier, one has heretofore been largely dependent on trial and error: Until now, the matching network has been experimentally altered following the reflection-free design of the matching network at its output side until the required boundary conditions were met.

In so doing, the new method avoids the need to use costly and space-consuming non-reciprocal circuit elements in order to be able to access the transforming actions of the matching network independently in the direction of signal flow and in the opposite direction as well.

Another application of the method is the use and evaluation of load pull data in the determination of the parameter of the circuit as part of the development of matching networks: When applied with a real load reflection factor $a_{on}$, the method makes it possible to determine the output-side mismatch as a function of the transformed load reflection factor $a_{on}'$ for every given transformed load reflection factor $a_{on}'$.

Using the method it is possible, in particular for the case of a vanishingly small load reflection factor $a_{on}$, to specify a family of circles as loci of the transformed load reflection factors $a_{on}'$ that result in a given output-side mismatch when non-resistive, reciprocal matching networks are used. In this way, expanded possibilities are opened up for the use of load pull data in circuit design.

As follows from the preservation of the Poincaré distance, the transforming action of non-resistive, reciprocal matching networks is uniquely determined by specifying two pairs of one image factor and one counter-image reflection factor each. The two image reflection factors used to define the transformation properties can be located on the same side of the matching network.

As has been shown, mathematically specifying the transforming action of a non-resistive, reciprocal matching network $M_1$, for example using a describing function f, is equivalent to specifying the transforming action of the associated reverted matching network, for example using the reverted describing function $f^R$.

This can be used to go from the specification of the transformation properties using two image reflection factors on the same side of the matching network to a specification of the transformation properties using two image reflection factors on different sides of the matching network and vice versa.

It must always be kept in mind that identifiers containing terms such as "load" do not permit any implication as to the location of the quantities identified thereby relative to the matching network $M_1$ and measured with reference to the direction of the signal flow within the circuit. Hence, the situation is also encompassed in which, for example, the circuit element identified as the "variable load" can also be considered a source in electrical engineering terms.

In the other embodiment, the transformation of the two counter-image impedances takes place with passage through the matching network in the same direction. This is shown, for example, in FIG. 9 using a circuit by way of example.

In a method for designing this electronic circuit in the exemplary embodiment for FIG. 9, a second parameter $G_2$ of the circuit is to be optimized. The circuit has a second matching network $M_2$ with a third connection $A_3$ and a fourth connection $A_4$. The circuit has, connected to the third connection $A_3$, a variable load L with a first operating state off and a second operating state on. In accordance with the second and third load reflection factors $c_{off}$, $c_{on}$, the impedance of the load L is also different in the two operating states.

Matching in the case of parallel circuit of multiple circuit elements

What is important in the exemplary embodiment below is, firstly, to determine the transforming actions for the mathematically permissible, non-resistive reciprocal matching networks, using these transforming actions to ascertain the effect on parameters of the circuits, and only once an optimal transforming action has been found, to design a matching network or modify an existing matching network, for example for designing the matching networks of load-modulation amplifiers, in particular for the parallel circuit of two circuit elements (amplifiers).

For the type of load-modulation amplifier that is doubtless the most well-known in the technical field, the Doherty amplifier, the designation "peak branch" can be used for the path having a first source element $Q_1$ and a first matching network $M_1$, and the designation "main branch" can be used for the path having a second source element $Q_2$ and second matching network $M_2$.

In the interest of better understanding, the method for designing matching networks $M_1$, $M_2$ is explained below with particular reference to the special case of the Doherty amplifier. This is in no way intended to imply that the application of the method is limited to the circuit topology of the Doherty amplifier.

In order to emphasize that the method extends far beyond an application for the Doherty amplifier, the following exemplary application is explained:

Using the detail illustrations in FIG. 12 ff., the nomenclature will be clarified first and an introduction to the method of operation of a load-modulation amplifier will be presented.

FIG. 12 applies to a circuit topology of a load-modulation amplifier. For the application of the load-modulation amplifier, FIG. 12 shows, specifically:

a main amplifier $Q_2$ with a second (main) source reflection factor $d_{on}$, a peak amplifier $Q_1$ with a first (peak) source reflection factor $b_{off}$ at a low input signal level and a third (peak) source reflection factor $b_{on}$ at a high input signal level, a T-section T with a first connection $E_1$ as first input, a second connection $E_2$ as second input, and a third connection $E_3$ as output, wherein a load L with the load impedance $Z_L$ is connected to the third connection $E_3$ of the output, a first matching network $M_1$, which can also be designated as the peak matching network, with a first connection $A_1$ and a second connection $A_2$, wherein the first connection $A_1$ is connected to the first connection $E_1$ of the T-section T and wherein the second connection $A_2$ is connected to the peak amplifier $Q_1$ as first source element, and a second matching network $M_2$, which can also be designated as the main matching network $M_2$, with a third connection $A_3$ and a fourth connection $A_4$, wherein the third connection $A_3$ is connected to the second connection $E_2$ of the T-section T and wherein the fourth connection $A_4$ is connected to the main amplifier $Q_2$.

In FIG. 12 ff., the aforementioned reflection factors are labeled with the corresponding reference symbols.

Figure 19:
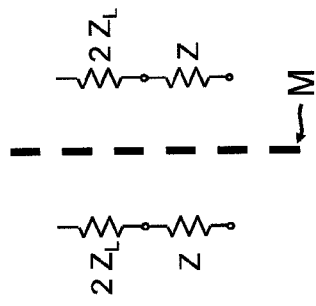
FIGS. 17 to 19 are schematic equivalent circuits for signal addition.
Figure 18:
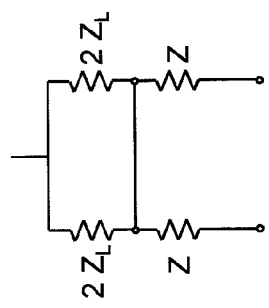
Figure 17:
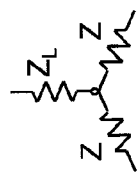

For ease of understanding, FIGS. 17, 18, 19 show equivalent circuits for a symmetrically driven T-section T in three detail illustrations. FIG. 17 shows a star circuit having a load impedance $Z_L$ and two identical source impedances Z. FIG. 18 shows a circuit equivalent hereto, by means of which the symmetry properties can be worked out more easily: The load impedance $Z_L$ has been replaced by a parallel circuit of two identical impedances with values $2Z_L$ twice that of the load impedance $Z_L$. When identical signals are applied to the connections of the source impedances Z that are distant from the load impedance $Z_L$, all relationships in the circuit become fully symmetrical. Maxwell's equations require a so-called magnetic wall M, as a result of which the circuit is virtually divided into two circuit sections, each of which includes a source impedance Z and a doubled load impedance $2Z_L$ in series connection. This situation is shown in FIG. 19.

Accordingly, if one of the two source impedances Z in FIG. 17 were replaced by an open circuit, the second source element $Q_2$ would "see" only the single load impedance $Z_L$. However, if both source elements $Q_1$, $Q_2$ output an identical signal, then the source elements $Q_1$, $Q_2$ share the admittance of the load impedance $Z_L$ equally, so that both source elements $Q_1$, $Q_2$ with the source impedance Z experience the doubled load impedance $2Z_L$, in accordance with FIG. 19.

In a Doherty amplifier, the peak branch is typically operated in class C. Thus, the peak branch is limited at low input signal levels. In a design of the first (peak) matching network $M_2$ suitable for this purpose, this matching network provides an open circuit at the first connection $A_1$ as the first transformed (peak) source reflection factor $b_{off}^t$ in a first operating state off; the main amplifier branch depends solely on the admittance of the load impedance In contrast, at high input signal levels in a second operating state on, the peak amplifier branch is dynamically driven on. It adds a signal, which is similar to the signal generated by the main amplifier branch at the second connection $E_2$ of the T-section T, at the first connection $E_1$ of the T-section T. The two amplifier branches share the admittance of the load impedance $Z_L$: Because of the dynamic driving-on of the peak amplifier branch operated in class C, the (second/third)

(main) load reflection factor $c_{off}$, $c_{on}$ acting for the main amplifier branch, and thus the (second/third) transformed (main) load reflection factor $c_{off}'$, $c_{on}'$, is modulated.

An intermediate result and the conclusions to be derived from the two intermediate results are explained below using FIG. 15.

Figure 15:
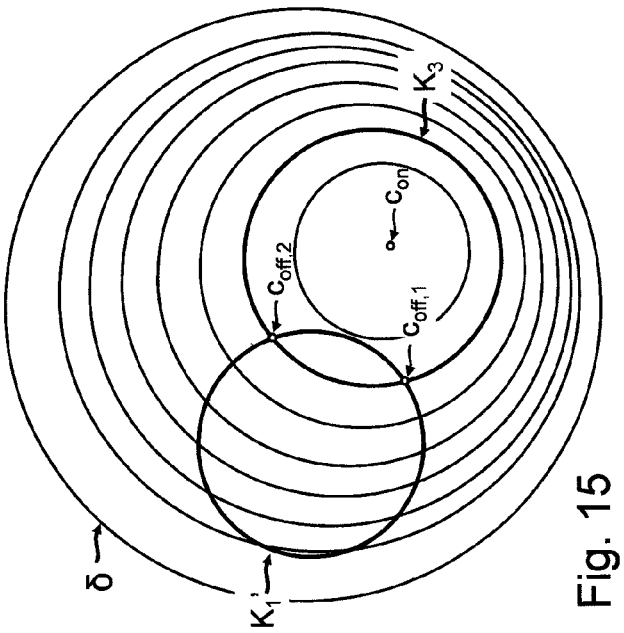
FIG. 15 is another Smith chart with Poincaré circles.

Specifically, FIG. 15 shows:

the edge δ of the unit circle in the reflection factor plane, the geometric locus $K_1'$ of all reflection factors that are determined by the parallel circuit of the load impedance $Z_L$ with one relevant additional impedance, wherein each additional impedance is associated with a reflection factor on the first Poincaré circle $K_1$ in accordance with FIG. 13; reference is made to FIG. 18 concerning the load impedance $Z_L$ and doubled load impedance $2Z_L$, the reflection factor $c_{on}$ that is associated with the doubled load impedance $2Z_L$, drawn in thin lines and with no reference symbol, a concentric, in the Poincaré sense, family of Poincaré circles about the reflection factor $c_{on}$ that is associated with the doubled load impedance $2Z_L$, highlighted with bold lines, a third Poincaré circle $K_3$ from the family of Poincaré circles, and two points of intersection $c_{off,1}$, $c_{off,2}$ between the third Poincaré circle $K_3$, highlighted with bold lines, from the family of Poincaré circles and the geometric locus $K_1'$, as explained above.

According to the first intermediate result, all permissible values y' for the first load reflection factor $a_{on}$ lie on the geometric locus $K_1'$ in accordance with FIG. 13, and moreover, lie on the third Poincaré circle $K_3$ in accordance with the second intermediate result.

When a transformed first (peak) load reflection factor $a_{on}'$ that is sought for the area of application of the peak amplifier $Q_1$ in FIG. 12 is known, this knowledge in combination with the load impedance $Z_L$ defines the geometric locus $K_1'$.

When the desired transformed second and third (main) load reflection factors $c_{off}'$, $c_{on}'$ for the desired area of application of the main amplifier $Q_1$ are known, this knowledge in combination with the value of the load impedance $Z_L$ also defines the third Poincaré circle $K_3$.

Only the two points of intersection $c_{off,1}$, $c_{off,2}$ of the defined geometric locus $K_1'$ and the defined third Poincaré circle $K_3$ result as permissible values for the second (main) load reflection factor $c_{off}$.

For example, the parameter of the circuit is a sum of squares of a first and second geometric distance. Here, the first geometric distance is defined between an arbitrary reflection factor and the third Poincaré circle $K_3$. In contrast, the second geometric distance is defined between the arbitrary reflection factor and the geometric locus $K_1'$. By this means, the second (main) load reflection factor $c_{off}$ is largely defined. As a result, the first cyclic degree of freedom associated with the main amplifier branch and the second cyclic degree of freedom associated with the peak amplifier branch, and consequently the complete describing functions of both matching networks $M_1$, $M_2$, are largely determined as well.

Figure 16:
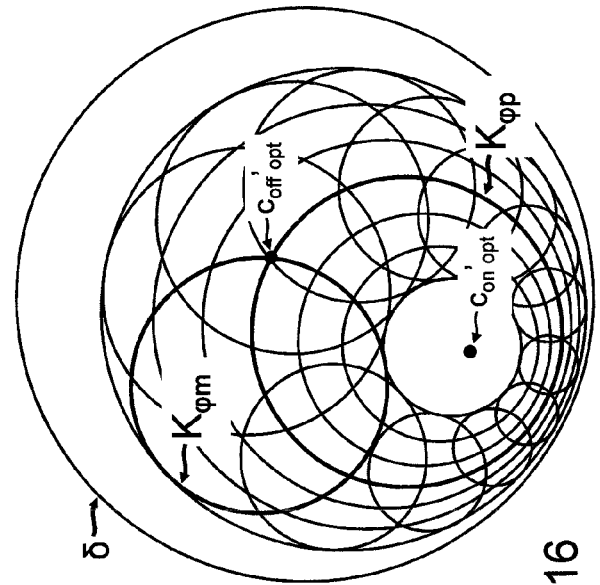
FIG. 16 is another Smith chart with Poincaré circles.

In addition to the limitations on possible value pairs having a transformed second (main) load reflection factor $c_{off}'$ and a transformed third (main) load reflection factor $c_{on}'$ resulting from the circumstances explained, the near-complete definition of the describing functions is explained in detail with the aid of FIG. 16.

FIG. 16 shows:

the edge δ of the unit circle in the reflection factor plane, a third value $c_{on'opt}$ of a transformed third (main) load reflection factor $c_{on}'$, drawn in thin lines and with no reference symbol, a first family of (in the Poincaré sense) concentric Poincaré circles about the third value $c_{on'opt}$, spanning an annular region in the interior of the unit circle, also drawn in thin lines, a second family of circles, each of which touches the inner and outer edges of the annular region, a second value $c_{off'opt}$ of a transformed second (main) load reflection factor $c_{off}'$, highlighted with bold lines, one circle $K_{\phi p}$ from the first family and one circle $K_{\phi m}$ from the second family, wherein the highlighted circles intersect at the second value $C_{off'opt}$.

The development of a load-modulation amplifier of the Doherty type starts with determining the effect of the values of the transformed load reflection factors on the main and peak amplifiers to be used. To this end, load pull measurements of quantities such as the curve of large-signal power gain with output power are performed. From the load pull measurements, it is possible to measure a compression behavior or an efficiency of the power gain at a given compression, for example, as a function of load reflection factor. Using these measurements, an optimal load under full drive can be defined, for example as a load by which a compression power is optimized at an operating frequency. Similarly, a target impedance that is to be used as a goal for the main amplifier under moderate input levels can be obtained from the measurement. This is, for example, a load by which an efficiency of the power gain at a given fraction of the maximum compression power is maximized at the given operating frequency. In the method for designing the matching networks in a Doherty amplifier, the goal in a first method step is to achieve the result in both amplifier paths that twice the (real) load impedance is transformed into the optimal load under full drive. In another step, by inserting a line of appropriate length with a line impedance equal to the load impedance between the peak matching network and the T-section, the transformed peak source impedance under low input signal levels is therefore turned into an open circuit to the extent possible. By this means, the losses that the signal of the main amplifier path experiences at the T-section are minimized. In this process, a part of the signal power into the output of the peak amplifier branch is lost. If one limits oneself to non-resistive, reciprocal matching networks in both the main and the peak amplifier branches, then each of the two has three degrees of freedom.

Using FIG. 12 to FIG. 15, the result for the prevalent case of real load impedances $Z_L$ of the load L is that the smallest possible circle from the family of concentric circles in FIG. 15 is sought, wherein the smallest possible circle ($K_3$) intersects the geometric locus $K_1'$. In this process, the Poincaré radius of the concentric circles in FIG. 15 is given by the third Poincaré distance $P_3$ between the transformed second and third (main) load reflection factors $c_{off}'$, $c_{on}'$.

In comparison to prior methods for designing load-modulation amplifiers in which the signal losses are minimized at low input levels, the advantage is obtained by means of the exemplary embodiment in FIGS. 12 to 16 that the achievable swing is not minimized at the same time.

A third Poincaré distance $P_3$ established between the transformed second and third (main) load reflection factors $c_{off}'$, $c_{on}'$ has—as explained above—the consequence of a defined set of possible values for the cyclic degree of freedom associated with the peak amplifier branch. The concentric circles in FIG. 16 each correspond to a fixed Poincaré distance between the transformed second and third (main) load reflection factors $c_{off}'$, $c_{on}'$ and hence correspond to a fixed value of the cyclic degree of freedom associated with the peak amplifier branch.

Accordingly, for a defined value of the third transformed (main) load reflection factor $c_{on}'$, and hence two exhausted degrees of freedom for the second (main) matching network $M_1$, the location of the possible values for the transformed second (main) load reflection factor $c_{off}'$ on a fixed circle among the concentric circles in FIG. 15, and thus a defined cyclic degree of freedom associated with the peak amplifier branch, is determined by the single cyclic degree of freedom associated with the main amplifier branch that remains in the matching system: Along the concentric circles, the cyclic degree of freedom associated with the peak amplifier branch is fixed in each case, and the cyclic degree of freedom associated with the main amplifier branch is variable.

The reverse applies for the second family of circles: Each of these corresponds to a fixed value of the cyclic degree of freedom associated with the main amplifier branch, while a locus along one of the circles of the second family is parameterized by the variable cyclic degree of freedom associated with the peak amplifier branch.

As compared to an experimental optimization, the present exemplary embodiment has the advantage of using all degrees of freedom.

In the present exemplary embodiment, optimal load impedances for the two operating cases (high and low input signal levels) are determined at the outset using load pull measurements. For a simpler explanation, but without limiting the method according to the invention hereto, the starting assumption in the following is that in designing the main and peak matching networks $M_2$, $M_1$ using the method from the exemplary embodiment, the values of the transformed load reflection factors at high input signal levels for a maximum peak power are likewise determined at the outset. In this process, the two cyclic degrees of freedom remain.

In the present exemplary embodiment from FIG. 16, both cyclic degrees of freedom are used so as to be able to freely determine the transformed second (main) load reflection factor $c_{off}'$ in the region spanned by the concentric circle family in FIG. 16. For example, the second (main) load reflection factor $c_{off}$ is determined in order to optimize an efficiency at a desired fraction of the maximum output power. This achieves the advantage that the efficiency increase achieved under low input signal levels far outweighs a reduction in efficiency resulting from additional losses due to a tolerated further deviation of the transformed first (peak) source reflection factor $b_{off}'$ from an open circuit.

Furthermore, an additional advantage is achieved by the method in the present exemplary embodiment: With the aid of the method, for any desired triplet of
  a transformed second (main) load reflection factor $c_{off}'$,
  a transformed third (main) load reflection factor $c_{on}'$, and
  a transformed first (peak) load reflection factor $a_{on}'$,
the complete transformation properties of the main and peak matching networks $M_2$, $M_1$ can be determined even before the knowledge of a physical implementation of these transformation properties in a concrete circuit.

Using the first and third (peak) source reflection factors $b_{off}$, $b_{on}$ accessible to measurement, as well as a second (main) source reflection factor $d_{on}$ that can also be ascertained by measurement methods, the impedance level at the T-section T, and hence the combination losses, can be ascertained computationally under both operating conditions when the describing functions of the (peak and main) matching networks $M_1$, $M_2$ are known.

Proceeding from load pull measurements of the electrical characteristics of the peak and the main amplifiers $Q_1$, $Q_2$, the method of the present exemplary embodiment accordingly makes it possible to determine the electrical characteristics—for example, gain and efficiency as a function of the output power—for a load-modulation amplifier made up of the peak and the main amplifiers $Q_1$, $Q_2$ as a function of the aforementioned arbitrary triplet of reflection factors.

Thus it is possible, even without specifying concrete implementations of the matching networks $M_1$, $M_2$, to first optimize the characteristics of the load-modulation amplifiers using the describing functions of the matching networks $M_1$, $M_2$. Only after a best possible pair of describing functions has been found does the design of the associated ideal pair of matching networks $M_1$, $M_2$ take place. The method is fully automated in this regard, for example based on an automatic load pull measurement system.

The limitation of the description using the explanatory figures to the symmetrical case serves only to simplify the description. The validity and applicability of the exemplary embodiments of the method for designing asymmetrical load-modulation amplifiers remains unaffected thereby. For example, the method of the exemplary embodiments is directly applicable to load-modulation amplifiers with unequal division ratios. It is also possible to apply the described exemplary embodiments to multipath load-modulation amplifiers.

A further exemplary embodiment of a method for designing matching networks for low-loss power addition is provided using FIG. 22. In a T-section T provided as a summing element, a first source element $Q_1$ with a first source reflection factor b is connected to a first connection $E_1$ of a T-section T through a first matching network $M_1$. A second source element $Q_2$ with a second source reflection factor d is connected to a second connection $E_2$ of the T-section T through a second matching network $M_2$. A load L with a load impedance is connected to a third connection $E_3$ of the T-section T.

In the case of identical source reflection factors b, d and excitation of the inputs of a T-section T with identical phase and power, the two inputs are isolated from one another by symmetry. Moreover, if the source impedances are equal to twice the load impedance of the load L, the power addition is reflection-free and lossless.

Continuing the above remarks, for a real load impedance $Z_L$ an identity of the source impedances and twice the load impedance is present precisely when two amplifier branches operated at the point of maximum small-signal power gain are used as sources.

For the lossless addition of, e.g., the output signals of two amplifier branches that are identical but are operated at their respective optimum powers, the most independent access to the transforming action of a matching network $M_1$, $M_2$ in the direction of the signal flow (forward direction V), and opposite to the signal flow (reverse direction R), is desirable. In this context, independent access means that the two matching networks $M_1$, $M_2$ are allowed to transform differently.

An additional, advantageous exemplary embodiment, which is explained below with reference to FIG. 22, permits access of this type that is independent to the greatest possible extent, and thus permits a design method for designing the matching networks $M_1$, $M_2$ of two parallel amplifier branches that are to be joined through a T-section T.

In a concrete possible application case for the method, the following are assumed:
  a first power amplifier as first source element $Q_1$,
  a second power amplifier as second source element $Q_2$,
  a first transformed load reflection factor a', and
  a second transformed load reflection factor c'.

The first value $a'_{opt}$ here is a target value for the first transformed load reflection factor a'. It can be determined, for example at the start of the design of the circuit, in that measurements are performed at the first source element $Q_1$ at a load pull measurement station. For example, a desirable value for the first transformed load reflection factor a', which is set as the first value $a'_{opt}$ and which optimizes an efficiency of a power gain of the first source element $Q_1$, is determined at a compression of the power gain over the output power of one decibel.

For example, the second value $c'_{opt}$ is determined as the target value of the second transformed load reflection factor c' using measurements at the second source element $Q_2$.

For the case that the first value $a'_{opt}$ differs from the complex conjugate b* of the first source reflection factor b (consequently, the first source element $Q_1$ is not to be operated at the maximum of its small-signal power gain), a reflection loss is produced for a signal output from the first source element $Q_1$ at the transition from the first matching network $M_1$ to the T-section T.

If the first and second source elements $Q_1$, $Q_2$ are not isolated from one another in the design of the first and the second matching networks $M_1$, $M_2$, then the signal output from the first source element $Q_1$ that is transmitted to the load L is attenuated in that a part of the signal power is lost in the second output. In designing the matching networks $M_1$, $M_2$ according to the exemplary embodiment described, these losses are minimized, while in addition there is only a slight deviation from the values $a'_{opt}$, $c'_{opt}$ that optimize the source characteristics.

Only through the present exemplary embodiment of determining the reflection factors "seen" into the output of a matching network $M_1$, $M_2$ in a manner on a Poincaré circle, is it possible to arrive at matching networks $M_1$, $M_2$ by design means. In this process, the losses are minimized by means of the matching networks $M_1$; $M_2$, while at the same time there is only a slight deviation from the reflection factor values $a'_{opt}$, $c'_{opt}$ that optimize the source characteristics.

With regard to the greatest possible simplicity of representation, the derivation is explained using a real input impedance of the load, without thereby limiting the method to real load impedances. For example, the (not necessarily real) load impedance is determined as the reference impedance of the reflection factors. In this case, it is generally advantageous to choose the quotient using the difference between an impedance and the reference impedance as the dividend, and the sum of the impedance and the complex conjugate of the reference impedance as the divisor. The reflection factor for the (not necessarily real) load impedance is real, so in the representation of the impedances of images with finite imaginary parts we can change over to individual reflection factors with vanishing imaginary parts.

One obtains a lossless power addition when the first source amplifier as the first source element $Q_1$ and the first matching network $M_1$, as well as the second source amplifier as the second source element $Q_2$ and the second matching network $M_2$, produce signals of equal phase and identical amplitude at the first and second inputs of the T-section T with application of appropriate signals, and the transformed first output impedance of the first source element $Q_1$ is equal to the transformed second output impedance of the second source element $Q_2$, which is equal to the doubled load impedance.

Freedom from reflections between the first output impedance of the first matching network $M_1$ and the input impedance measured into the first input of the T-section T prevails precisely when the first source amplifier $Q_1$ is operated at the maximum of its small-signal power gain on the output side.

In exactly the same way, freedom from reflections between the second output impedance of the second matching network $M_2$ and the input impedance measured into the second input of the T-section T prevails precisely when the second source amplifier $Q_2$ is operated at the maximum of its small-signal power gain on the output side.

In accordance with the foregoing, lossless power addition according to the prior art requires operation of the first and of the second source amplifiers at the respective maxima of their small-signal power gains.

Investigations by the applicant have shown that a first sinusoidal signal at a first signal level from a first source amplifier $Q_1$ and a second sinusoidal signal of the first signal level from a second source amplifier $Q_2$ can be losslessly superposed at a reciprocal T-section T with a suitable choice of the relative phase of the first and second sinusoidal signals precisely when the source conductances $1/Z1$, $1/Z2$ are first equal to half the load conductance $1/Z_L$, $$\text{Re}\left(\frac{1}{Z_1}\right) = \text{Re}\left(\frac{1}{Z_2}\right) = \text{Re}\left(\frac{1}{2Z_L}\right), \qquad (56)$$

while at the same time the imaginary parts of the admittances cancel out in the sum:

$$\text{Im}\left(\frac{1}{Z_1}\right) = -\text{Im}\left(\frac{1}{Z_2}\right). \qquad (57)$$

In both equations, $Z_1$ represents one source impedance experienced at the T-section, $Z_2$ represents the other source impedance experienced at the T-section, and $Z_L$ stands for the load impedance. In particular, $Z_1$ and $Z_2$ are complex conjugates of one another. In the borderline case of vanishingly small imaginary parts of sources and loads, the two formulas specialize on the solution for the impedances in accordance with the previous prior art. To be geometrically illustrative, the formulas mean that the two source impedances $Z_1$, $Z_2$ lie on a common conductance circle with the doubled load impedance.

For the given values of the source conductances $1/Z_1$, $1/Z_2$ and for an appropriate phase position of the two signals relative to one another, the input reflection factor of each input of the T-section T shifts to the value of the transformed source reflection factor as a result of load modulation by the signal of the other respective source branch: For lossless addition of the source signals in the T-section T, the part of the signal output from the first source element that is reflected back at the first input of the T-section T and the part of the signal output from the second source element $Q_2$ flowing through the first input of the T-section T into the first signal path cancel each another out. The total power output from both source elements $Q_1$, $Q_2$ is delivered to the load L. Hence, the two source elements $Q_1$, $Q_2$ preferably are operated at the maximum of their small-signal power gain to start with.

The first transformed source reflection factor b' and the second transformed source reflection factor d' have significantly different values, however. This characteristic is preserved when one continuously departs from complex conjugate matching at the output of the source elements $Q_1$, $Q_2$. For example, termination conditions at the output side are specified that optimize a source efficiency.

Due to the non-vanishing imaginary part of the transformed source reflection factors b', d' and the broken symmetry of the circuit including the T-section T, the first load reflection factor a also differs significantly from the reflection factor associated with the doubled load impedance $2Z_L$, just as it differs from the second load reflection factor c.

For the exemplary embodiment from FIG. 22, a new pair of slightly changed load reflection factors $a'_{est}$, $c'_{est}$ that differs only slightly from the known pair and is compatible with the mathematical limitations on the transforming action of non-resistive reciprocal matching networks $M_1$, $M_2$ is first determined from the source reflection factors b, d and the known pair of ascertained transformed load reflection factors a', c'. The new pair of varied load reflection factors $a'_{est}$, $c'_{est}$ permits a largely lossless power addition at the T-section T for a suitable choice of the relative phase positions of the superposed signals from the two source elements $Q_1$, $Q_2$.

For example, if the first matching network $M_1$ maps the first load reflection factor a onto the first value $a'_{est}$ (which optimizes the characteristics of the first source element $Q_1$), then the transformed first load reflection factor a' lies on a Poincaré circle about the complex conjugate b* of the first source reflection factor b. The same applies for the transformed second load reflection factor c'.

The goal is the most lossless power addition attainable. A prerequisite for this is that the transformed first and second source reflection factors b', d' are complex conjugates of one another. A further prerequisite is that both have the same Poincaré distance from the reflection factor that corresponds to the complex conjugate $2Z_L^*$ of the doubled load impedance $2Z_L$, wherein the first and second reflection factors are equal.

Because of the general characteristics of non-resistive, reciprocal matching networks shown in FIG. 5, this absolutely requires the third distance $P_3$—which is to say the Poincaré distance of the transformed first load reflection factor a' from the complex conjugate b* of the first source reflection factor b1—and the equal fourth distance $P_4$—which is to say the Poincaré distance of the transformed second load reflection factor c' from the complex conjugate b* of the second source reflection factor b.

In order to achieve the least possible difference of the transformed load reflection factors a', c' from the reflection factors that optimize the source characteristics, and at the same time to preserve largely lossless power addition at the T-section T, one must depend on a technical compromise:

In FIG. 23, the case where the third distance $P_3$ is equal to the fourth distance $P_4$ has been chosen for the illustration. For this value of the third and fourth distances $P_3$, $P_4$, a minimum distance results between the first value $a'_{opt}$ and the third value $a'_{est}$, for example, when the transformed first load reflection factor a' is determined at a first value $a'_{opt}$ and the complex conjugate b* of the first source reflection factor b is determined at a first distance $P_1$ from the first value $a'_{opt}$. The same applies to the determination of the transformed second load reflection factor c' and of the second value $c'_{opt}$.

The distance value $P_{aus}$, the first value $a'_{opt}$ of the transformed first load reflection factor a', and the second value $c'_{opt}$ of the transformed second load reflection factor c' are determined by variation of the third distance and the equal fourth distance, $P_3$, $P_4$. The determination of the first value and of the second value is carried out in that the geometric mean of the first and the second distances $P_1$, $P_2$ is minimized.

As explained above, by means of the additional method steps the losses are minimized while at the same time the minimum possible difference from the first value $a'_{opt}$ and second value $c'_{opt}$ is achieved.

For the exemplary embodiments for the method for designing matching networks, the essential steps can be summarized as follows:

Carrying out an estimate for a function describing the transforming action of the matching network $M_1$, $M_2$ as an isomorphism of the unit disk in the reflection factor plane, Utilizing the invariance of the Poincaré distance of two reflection factors under the matching networks $M_1$, $M_2$ encompassed by this estimate for defining a transforming action optimizing the circuit parameters, Determining a matching network $M_1$, $M_2$, that exhibits a transforming action optimizing the circuit parameters.

In electrical engineering terms, the first point reflects a limitation to non-resistive, reciprocal matching networks $M_1$, $M_2$.

The transforming action of non-reciprocal matching networks $M_1$, $M_2$ can have a finite defect, which is to say that it can map a non-trivial subspace of the reflection factor plane to zero. In this case, it is at most an isomorphism of a subspace of the reflection factor plane, but not of the unit circle. An example thereof is the mapping matrix describing the transforming action of a two-pole isolator, a 2×2 matrix with a one on the first main diagonal element and zeroes in the other three locations.

In contrast, resistive matching networks map individual reflection factors with a magnitude greater than one ("active points") into the unit disk ("passive points"). Therefore, the transforming action of resistive matching networks can still be bijective, but in general is not an isomorphism of the unit disk.

However, because of the Schwarz-Pick theorem, it is the case for all automorphisms of the complex unit disk that they preserve the Poincaré distance. As has been shown using multiple examples, this invariance can be employed advantageously to determine transformation properties of matching networks $M_1$, $M_2$ through which circuit parameters are optimized insofar as the circuit parameters depend on the transformation of more than one reflection factor by the matching network $M_1$, $M_2$.

Lastly, the use of the method of the exemplary embodiments automatically determines only those circuit-parameter-optimizing transforming actions that leave the Poincaré distances of two points invariant, so that the optimization extends only to transforming actions that can be implemented by non-resistive, reciprocal matching networks $M_1$, $M_2$. In the third point of the method, a matching network $M_1$, $M_2$ of this type is specified that is characterized by the desired transformation properties.

Accordingly, the matching networks obtained can be characterized in that using the invariance of the Poincaré distance of two reflection factors, circuit parameters that depend on the transformation of more than one of the reflection factors by the matching network $M_1$, $M_2$ are optimized.

In contrast to conventional load-modulation amplifiers of the Doherty type, the layouts of the matching networks achieved are much smaller. This is advantageous in particular when, for example, a frequency family of power amplifiers for mobile telephone base stations must each be accommodated in housings of the same size. With the method according to the invention for designing matching networks, a practicable alternative is available for the first time in 74 years. In particular, the method explained here renders unnecessary the impedance inversion used heretofore.

Figure 27:
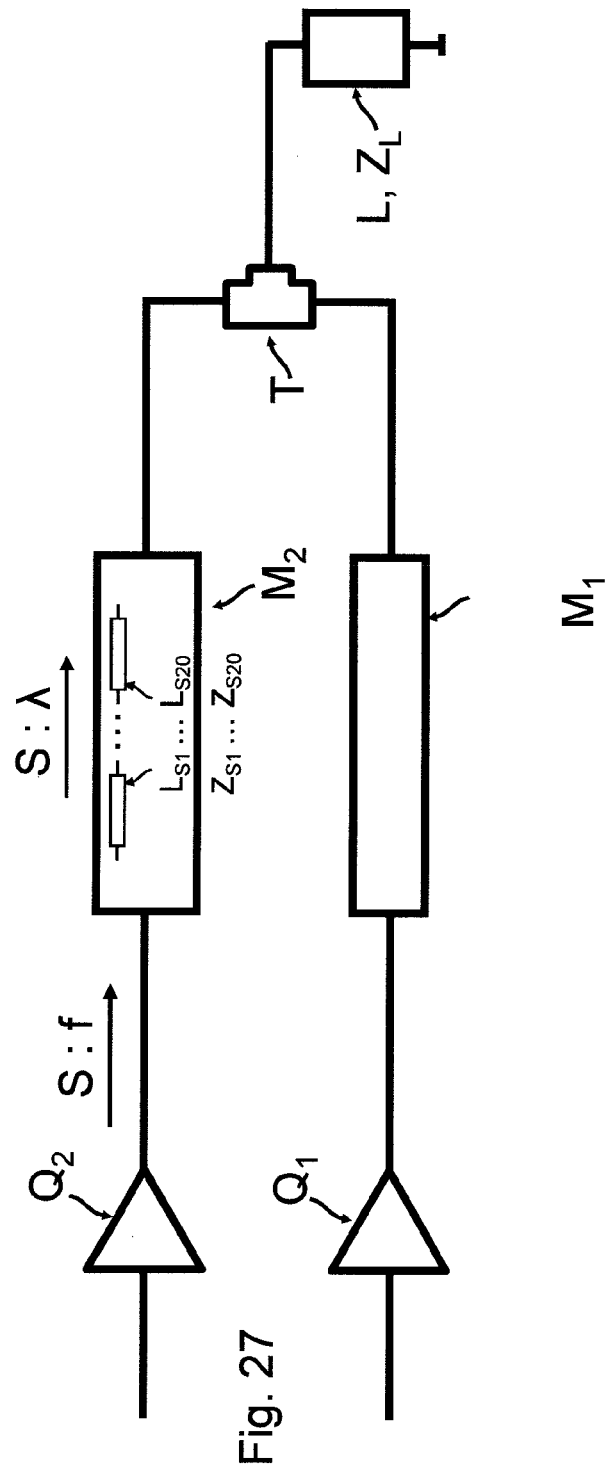
FIG. 27 is a schematic representation of an amplifier arrangement.

FIG. 27 shows an electronic circuit, in particular for a high-frequency signal. The circuit has a first source element $Q_1$, and a second source element $Q_2$, and a first matching network $M_1$, and a second matching network $M_2$.

The first matching network $M_1$ and the second matching network $M_2$ are designed according to the exemplary embodiment from FIG. 12.

The second source element $Q_2$ is designed to output a signal S with a center frequency f. The load L has a load impedance $Z_L$. The second matching network $M_2$ has line-like series elements $L_{S1} \ldots L_{S20}$ that carry the signal S.

In this case, either the line-like series elements $L_{S1} \ldots L_{S20}$ only have line impedances $Z_{S1} \ldots Z_{S20}$ less than the load impedance $Z_L$, or a sum of the electrical lengths of such line-like series elements $L_{S1} \ldots L_{S20}$, each of which has a line impedance $Z_{S1} \ldots Z_{S20}$ greater than the load impedance $Z_L$, is less than one quarter of a conducted wavelength $\lambda$ associated with the signal S. The wavelength of a signal of a given frequency on one of the line-like series elements $L_{S1} \ldots L_{S20}$ in this case depends on the physical implementation of the relevant line-like series elements $L_{S1} \ldots L_{S20}$.

Figure 29:
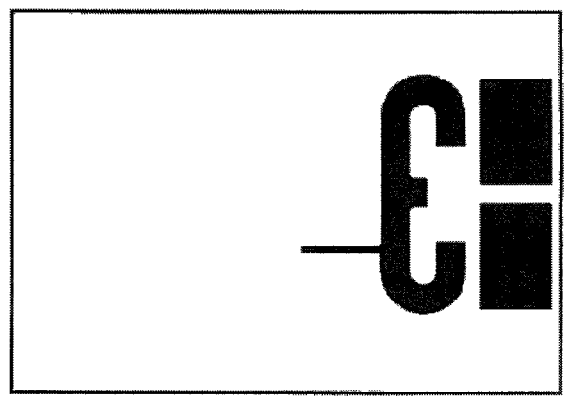
Figure 28:
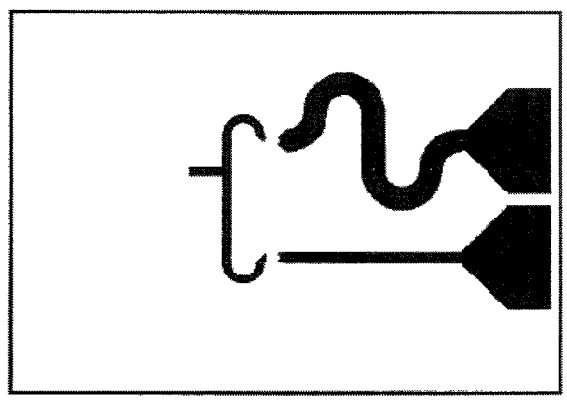
Figure 32:
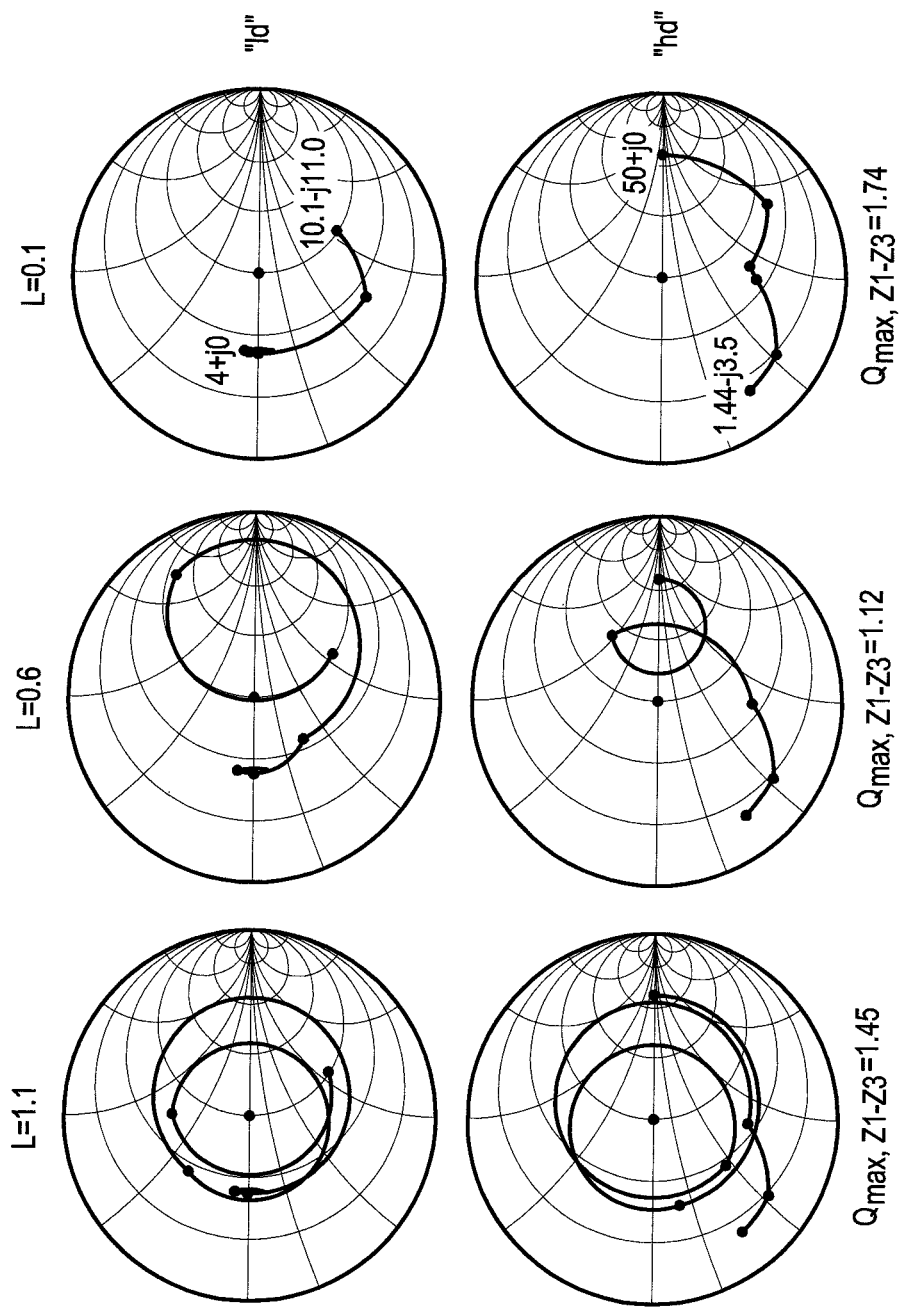
FIG. 32 is a diagram of implemented structures of matching networks.

Further exemplary embodiments of matching networks are shown in FIG. 28 ff. FIGS. 28 and 29 each show the matching structures created on the drain side, which essentially represent the first matching network $M_1$ and the second matching network $M_2$. In this context, FIG. 28 shows a layout for a load-modulation amplifier arrangement for an operating frequency von 1500 MHz and (at the same scale) FIG. 29 shows a Doherty design for the same operating frequency.

As is evident from FIG. 12, for example, the method generally permits two solutions for pairs having a cyclic degree of freedom associated with the peak amplifier branch and a cyclic degree of freedom associated with the main amplifier branch. Accordingly, the load-modulation amplifier arrangement encompasses two disjoint solutions for the transforming action of the matching networks $M_1$, $M_2$. Two matching networks associated with these two transforming actions are shown to scale in FIGS. 28 and 29. The considerably smaller electrical length required for the structures of the matching networks $M_1$, $M_2$ as compared to the prior art is especially advantageous. In fact, for one and the same desired transforming action, even with an identical estimate, families of matching networks are to be determined, each of which implement the desired transforming action. The structures differ from family to family in their electrical lengths by multiples of a half wavelength, however.

Figure 30:
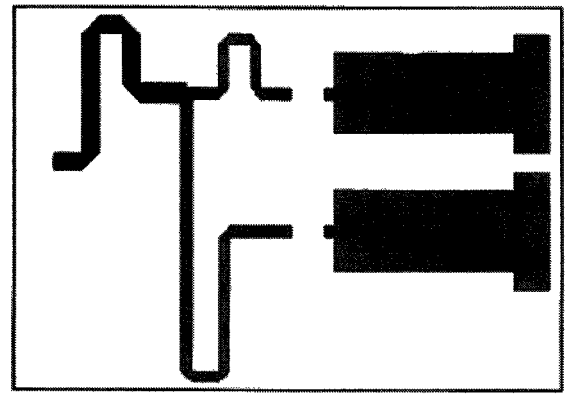

Structures of the matching network $M_1$ are shown to scale in FIG. 30 as exemplary embodiments. The structures are determined according to the exemplary embodiments explained above, and effect a mapping in the forward direction at 1500 MHz of the first counter-image impedance of $(10.1-j*11.0)$ Ω onto a first image impedance of 4Ω. Moreover, the structures effect a mapping in the forward direction of a second counter-image impedance of 50Ω onto a second image impedance of $(1.44-j*3.5)$ Ω.

The structures in the examples in FIG. 30 include four serial, homogenous microstriplines on a dielectric with a thickness of 20 mil and a dielectric constant of 3.5. In FIG. 30, the end of each structure facing the counter-image impedance is shown, while the structure at the bottom has the desired image impedance.

If one numbers the four homogenous microstriplines in FIG. 30 at the counter-image side connection consecutively from 1 to 4, the three matching structures have geometric lengths L and widths W of:

| | | | |
|---|---|---|---|
| W1 [mm]/L1 [mm] | 6.467/26.173 | 1.098/14.913 | 16/5 |
| W2 [mm]/L2 [mm] | 9.973/48.424 | 2.850/39.098 | 1/2.927 |
| W3 [mm]/L3 [mm] | 6.424/52.078 | 12.383/14.547 | 16/1.126 |
| W4 [mm]/L4 [mm] | 14.5/3.5 | 14.5/3.5 | 14.5/3.5 |

Because of the electrical lengths of the new structures of the matching networks $M_1$, $M_2$ in load-modulation amplifiers that typically are shorter by a half wavelength as compared to the prior art, the achievable relative bandwidth of the matching structures increases from a typical value of 5% for load-modulation amplifiers of the Doherty type to a typical value of 13% for load-modulation amplifier arrangements according to the two exemplary embodiments explained above.

The diagrams in FIG. 31 represent the transformation paths for three structures of the matching networks $M_1$, $M_2$ from FIG. 30 in Smith charts. The upper row shows the first counter-image impedance and image impedance, the lower row shows the second counter-image impedance and image impedance.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A method for designing an electronic circuit, the method comprising:
providing the circuit with a first matching network with a first connection and a second connection;
connecting a load of the circuit to the first connection, wherein a first load reflection factor that depends on the load is achieved at the first connection;
connecting a source element of the circuit with a first source reflection factor to the second connection, wherein a transformed first load reflection factor into the second connection and a transformed first source reflection factor into the first connection are achieved via the first matching network;
determining for each first distance from among a number of first distances a first circle as a set of all points at a first distance from a complex conjugate of the first load reflection factor by:

$$P(y, a_{on}^*) = \operatorname{arctanh}\left(\frac{|y - a_{on}^*|}{|1 - y^* a_{on}^*|}\right) \equiv P_R,$$

wherein y is a point on the first circle, y* is the complex conjugate of the point on the first circle, $a_{on}^*$ is the complex conjugate of the first load reflection factor, and $P_R$ is the first distance;
determining a second circle as the set of all points at a first distance from the complex conjugate of the first source reflection factor by:

$$P(x, b_{on}^*) = \operatorname{arctanh}\left(\frac{|x - b_{on}^*|}{|1 - x^* b_{on}^*|}\right) \equiv P_R,$$

wherein x is a point on the second circle, x* is the complex conjugate of the point on the second circle, $b_{on}^*$ is the complex conjugate of the first source reflection factor, and $P_R$ is the first distance;
determining a number of first point pairs, wherein a first pair point of each point pair is on the first circle, and wherein a second pair point of each point pair is on the second circle;
determining a value of a first parameter for each first point pair with the first pair point equal to a value of the transformed first source reflection factor and with the second pair point equal to a value of the transformed first load reflection factor;

determining an optimum of the first parameter from all values of the first parameter that are associated with the first point pairs;

determining a first value pair from among the first point pairs, wherein the optimum is associated with the first value pair;

setting a first value of the transformed first source reflection factor equal to a first value point of the first value pair;

setting a second value of the transformed first load reflection factor equal to a second value point of the first value pair; and determining the first matching network using the first value of the transformed first source reflection factor, the second value of the transformed first load reflection factor, the first source reflection factor, and the first load reflection factor.

2. The method according to claim 1, wherein the first parameter is a mismatch between the transformed first source reflection factor and the first load reflection factor.

3. The method according to claim 1, wherein a predetermined mismatch between the transformed first source reflection factor and the first load reflection factor is a part of the first parameter as a boundary condition.

4. An electronic circuit comprising:
at least one source element;
at least one load; and
at least one matching network that is designed according to the method of claim 1.

5. The method according to claim 1, further comprising:
determining a first function that describes the transforming action of the first matching network in a forward direction,
wherein the first function is defined by:

$$f_{a_{on},a'_{on},\varphi}(z_1) = e^{i\varphi}\frac{z_1 - z_0}{1 - z_0^* z_1}$$

with $$z_0 = \frac{1-|a_{on}|^2}{|a_{on}|^2|a'_{on}|^2-1}a'_{on}e^{-i\varphi} - \frac{1-|a'_{on}|^2}{|a_{on}|^2|a'_{on}|^2-1}a_{on},$$

wherein $a_{on}$ is the first load reflection factor, $a_{on}'$ is the transformed first load reflection factor, $\phi \in [0 \ldots 2\pi[$ is a parameter, $i=$ $$i = \sqrt[2]{-1},$$

and $z_1$ is a first argument of the first function;

determining a second function that describes the transforming action of the first matching network in a reverse direction,
wherein the second function is defined by:

$$f^R_{a_{on},a'_{on},\varphi}(z_2) = e^{i\varphi}\frac{z_2 - z_0^R}{1 - z_0^{R*} z_2}$$

with $$z_0^R = \frac{1-|a'^*_{on}|^2}{|a'^*_{on}|^2|a^*_{on}|^2-1}a_{on}^* e^{-i\varphi} - \frac{1-|a^*_{on}|^2}{|a'^*_{on}|^2|a^*_{on}|^2-1}a'^*_{on},$$

wherein $a_{on}$ is the first load reflection factor, $a_{on}^*$ is the complex conjugate of the first load reflection factor, $a_{on}'$ is the transformed first load reflection factor, $a_{on}'$ is the complex conjugate of the transformed first load reflection factor, $\phi \in [0 \ldots 2\pi[$ is the parameter, and $z_2$ is a second argument of the second function.

6. The method according to claim 5, further comprising:
determining a value of the parameter for an optimum of the first parameter, wherein a number of first distances is equal to one, and the first distance between the transformed first load reflection factor and the complex conjugate of the first source reflection factor is determined by:

$$P_{a'_{on},b_{on}^*} = \operatorname{arctanh}\left(\frac{|a'_{on} - b_{on}^*|}{|1 - b_{on}^* a'^*_{on}|}\right) \equiv P_R,$$

wherein $b_{on}$ is the first source reflection factor, $b_{on}^*$ is the complex conjugate of the first source reflection factor, $a_{on}'$ is the transformed first load reflection factor, and $P_R$ is the first distance), wherein the value of the parameter is determined when the second function with the first source reflection factor as its second argument assumes the first value of the transformed first source reflection factor as the function value, and determining the first matching network using the first function for the value of the parameter.

7. A method for designing an electronic circuit, the method comprising:
providing a second matching network with a third connection and a fourth connection;

connecting to the third connection, a variable load with a first operating state and a second operating state, wherein a second load reflection factor at the third connection is achieved in the second operating state and a third load reflection factor is achieved in the first operating state, and wherein a transformed second load reflection factor into the fourth connection in the second operating state and a transformed third load reflection factor in the first operating state are achieved via the second matching network;

determining a third distance between the transformed second load reflection factor and the transformed third load reflection factor by:

$$P_3 = \operatorname{arctanh}\left(\frac{|c'_{off} - c'_{on}|}{|1 - c'^*_{off} c'_{on}|}\right),$$

wherein $c_{on}'$ is the transformed second load reflection factor, $c_{off}'$ is the transformed third load reflection factor, $c_{off}'$ is the complex conjugate of the transformed third load reflection factor, and $P_3$ is the third distance;

determining a third circle as the set of all points at the third distance from the second load reflection factor by:

$$P(z, c_{on}) = \operatorname{arctanh}\left(\frac{|z - c_{on}|}{|1 - z^* c_{on}|}\right) \equiv P_3,$$

wherein z is a point on the third circle, z* is the complex conjugate of the point on the third circle, $c_{on}$ is the second load reflection factor, $c_{on}$* is the complex conjugate of the second load reflection factor, and $P_3$ is the third distance;

determining a number of second point pairs, wherein a second pair point of each second point pair is a point on the third circle;

determining a value of a second parameter for each second point pair, wherein a value of the third load reflection factor is equal to the second pair point, and wherein a value of the second load reflection factor is equal to the first pair point;

determining an optimum of the second parameter from all values of the second parameter that are associated with the second point pairs;

determining a second point pair associated with the optimum;

setting the third value of the third load reflection factor equal to a second pair point associated with the optimum of the second point pair associated with the optimum;

setting the fourth value of the second load reflection factor equal to a first pair point associated with the optimum of the second point pair associated with the optimum; and determining the second matching network using the third value of the third load reflection factor, the fourth value of the second load reflection factor, the transformed second load reflection factor), and the transformed third load reflection factor.

8. A method for designing an electronic circuit, the method comprising:

providing the circuit with a first operating state and a second operating state;

providing the circuit with a first source element with a first source output and a second source element with a second source output, the first source element having a first source reflection factor into the first source output in the first operating state;

providing the circuit with a load via a load input, the load having a load input reflection factor into the load input;

providing the circuit with a T-section with a first input, a second input, and an output, the load input being connectable to the output of the T-section, the T-section having a first load reflection factor into the first input in the second operating state, the T-section having a second load reflection factor into the second input in the first operating state, the T-section having a third load reflection factor into the second input in the second operating state;

providing the circuit with a first matching network having a first connection and a second connection, the first connection being connectable to the first input of the T-section, the second connection being connectable to the first source output, the first matching network having a transformed first source reflection factor into the first connection in the first operating state, the first matching network having a transformed first load reflection factor into the second connection in the second operating state;

providing the circuit with a second matching network having a third connection and a fourth connection, the third connection being connectable to the second input of the T-section, the fourth connection being connectable to the second source output, the second matching network having a transformed second load reflection factor into the fourth connection in the first operating state, the second matching network having a transformed third load reflection factor into the fourth connection in the second operating state;

determining a first value of the transformed first load reflection factor for optimizing a parameter of the circuit by measurement in the second operating state;

determining a second value of the transformed second load reflection factor for optimizing the parameter of the circuit by measurement in the first operating state;

determining a third value of the transformed third load reflection factor for optimizing the parameter of the circuit by measurement in the second operating state, wherein the first load reflection factor is set to a first initial value and the second load reflection factor is set to a second initial value;

calculating a first distance between the first value and the complex conjugate of the first source reflection factor by:

$$P_1 = \operatorname{arctanh}\left(\frac{|a_{on'\,opt} - b_{off}^*|}{|1 - b_{off}^* a_{on'\,opt}^*|}\right),$$

wherein $b_{off}$ is the first source reflection factor, $b_{off}^*$ is the complex conjugate of the first source reflection factor, $a_{on'\,opt}$ is the first value of the transformed first load reflection factor, and $P_1$ is the first distance;

determining a first circle as a set of all points at a first distance from the complex conjugate of the first load reflection factor by:

$$P(y, a_{on}^*) = \operatorname{arctanh}\left(\frac{|y - a_{on}^*|}{|1 - y^* a_{on}^*|}\right) \equiv P_1,$$

wherein y is a point on the first circle, y* is the complex conjugate of the point on the first circle, $a_{on}$* is the complex conjugate of the first load reflection factor, and $P_1$ is the first distance;

determining a third distances between the second value and the third value by:

$$P_3 \operatorname{arctanh}\left(\frac{|c_{on'\,opt} - c_{off'\,opt}|}{|1 - c_{on'\,opt}^* c_{off'\,opt}|}\right),$$

wherein $c_{off'\,opt}$ is the second value of the transformed second load reflection factor, $c_{on'\,opt}$ is the third value of the transformed third load reflection factor, $c_{on'\,opt}^*$ is the complex conjugate of the third value of the transformed third load reflection factor;

determining a third circle as the set of all points at the third distance from the third load reflection factor by:

$$P(z, c_{on}) = \text{arctanh}\left(\frac{|z - c_{on}|}{|1 - z^* c_{on}|}\right) \equiv P_3,$$

wherein z is a point on the third circle, z* is the complex conjugate of the point on the third circle, $c_{on}$ is the third load reflection factor, $c_{on}*$ is the complex conjugate of the third load reflection factor, and $P_3$ is the third distance, determining a modified first circle, wherein the modified first circle is determined as the set of all modified reflection factors, wherein an overall impedance is associated with each of the modified reflection factors, wherein each overall impedance is determined from a first parallel circuit of a load impedance of the load and an impedance associated with a reflection factor on the first circle, and wherein the load impedance is associated with the load input reflection factor of the load;

determining at least one fourth value of the second load reflection factor, wherein a sum of squares of the distances between the fourth value and the third circle and between the fourth value and the modified first circle is minimized for the at least one fourth value;

determining a fifth value of the transformed first source reflection factor for each fourth value of the second load reflection factor, wherein a fourth impedance is determined, wherein the fourth impedance is associated with the fourth value of the second load reflection factor, wherein a fifth impedance is determined so that a second parallel circuit of the fifth impedance with the load impedance is equal to the fourth impedance, and wherein the fifth value of the transformed first source reflection factor is associated with the fifth impedance;

determining the first matching network using the first load reflection factor, the first value of the transformed first load reflection factor, the first source reflection factor, and the fifth value of the of the transformed first source reflection factor; and determining the second matching network using the second value of the transformed second load reflection factor, the third value of the transformed third load reflection factor, the third load reflection factor, and the fourth value of the second load reflection factor.

9. The electronic circuit comprising:
a first source element;
a second source element;
a first matching network; and
a second matching network,
wherein the first matching network and the second matching network are designed according to the method of claim 8,
wherein the second source element is configured to output a signal with a center frequency,
wherein the load has a load impedance,
wherein the second matching network has line-like series elements that carry the signal,
wherein the line-like series elements only have line impedances less than the load impedance, or
wherein a sum of the electrical lengths of the line-like series elements, each of which has a line impedance greater than the load impedance, is less than one quarter of a wavelength associated with the signal.

10. A method for designing an electronic circuit, the method comprising:
determining a distance value and a third value of a transformed first load reflection factor, and a fourth value of a transformed second load reflection factor
wherein a first distance between a first value and the transformed first load reflection factor is defined by:

$$P_1 = \text{arctanh}\left(\frac{|a'_{opt} - a'|}{|1 - a'^* a'_{opt}|}\right),$$

wherein a second distance between a second value and a transformed second load reflection factor is defined by:

$$P_2 = \text{arctanh}\left(\frac{|c'_{opt} - c'|}{|1 - c'^* c'_{opt}|}\right),$$

wherein a third distance between the transformed first load reflection factor and the complex conjugate of the first source reflection factor is defined by:

$$P_3 = \text{arctanh}\left(\frac{|a' - b^*|}{|1 - ba'|}\right),$$

wherein a fourth distance between the transformed second load reflection factor and the complex conjugate of the second source reflection factor is defined by:

$$P_4 = \text{arctanh}\left(\frac{|c' - d^*|}{|1 - dc'|}\right),$$

defining the distance value, the third value, and the fourth value;

determining a fifth value of the transformed first source reflection factor and a sixth value of the transformed second source reflection factor, wherein a first circle with a real center point is determined that intersects a real reflection factor value of one third and a real reflection factor value of minus one, and wherein a second circle as the set of all points with a distance from the real reflection factor value of one third equal to the distance value is determined by:

$$P\left(y, \frac{1}{3}\right) = \text{arctanh}\left(\frac{\left|y - \frac{1}{3}\right|}{\left|1 - y\frac{1}{3}\right|}\right) \equiv P_{aus},$$

wherein y is a point on the second circle, and $P_{aus}$ is the distance value of the third distance;

determining a fifth value as equal to a value of a first point of intersection between the first circle and the second circle;

determining a sixth value as equal to a value of a second point of intersection between the first circle and the second circle that is different from the first point of intersection;

determining the first matching network using the first source reflection factor, the fifth value of the transformed first source reflection factor, the first load reflection factor, and the third value of the transformed first load reflection factor; and determining the second matching network using the second source reflection factor, the sixth value of the transformed second source reflection factor, the second load reflection factor, and the fourth value of the transformed second load reflection factor.

11. The method according to claim 10, wherein the circuit has a first source element with a first source output and with a first source reflection factor, wherein the circuit has a second source element with a second source output and with a second source reflection factor, wherein the circuit has a load, wherein the circuit has a T-section with a first input, a second input, and an output, wherein the T-section has a first load reflection factor into the first input, wherein the T-section has a second load reflection factor into the second input, wherein the output of the T-section is connected to the load, wherein the circuit has a first matching network with a first connection and a second connection, wherein the second connection is connected to the first source output and the first connection is connected to the first input of the T-section, wherein a transformed first load reflection factor into the second connection and a transformed first source reflection factor into the first connection are achieved via the first matching network, wherein the circuit has a second matching network with a third connection and a fourth connection, wherein the fourth connection is connectable to the second source output and the third connection is connectable to the second input of the T-section, wherein a transformed second load reflection factor into the fourth connection and a transformed second source reflection factor into the third connection are achieved via the second matching network, wherein a first value of the transformed first load reflection factor is determined, wherein the first source element has a first optimum of a first parameter for the first value of the transformed first load reflection factor acting at the first source output, wherein the first value of the transformed first load reflection factor differs from the complex conjugate of the first source reflection factor, wherein a second value of the transformed second load reflection factor is determined, wherein the second source element has a second optimum of a second parameter for the second value of the transformed second load reflection factor acting at the second source output, and wherein the second value of the transformed second load reflection factor differs from the complex conjugate of the second source reflection factor.

12. The method according to claim 10, wherein $P_1$ is the first distance, a' is a transformed first load reflection factor, a'* is a complex conjugate of the transformed first load reflection factor, and $a'_{opt}$ is the first value.

13. The method according to claim 10, wherein $P_2$ is the second distance, c' is the transformed second load reflection factor, c'* is the complex conjugate of the transformed second load reflection factor and $c'_{opt}$ is the second value.

14. The method according to claim 10, wherein $P_3$ is the third distance, b is the first source reflection factor, b* is the complex conjugate of the first source reflection factor, and a' is the transformed first load reflection factor.

15. The method according to claim 10, wherein $P_4$ is the fourth distance, d is the second source reflection factor, d* is the complex conjugate of the second source reflection factor, and c' is the transformed second load reflection factor.

16. The method according to claim 10, wherein the distance value, the third value, and the fourth value are defined in that:

a minimum of the geometric mean of the first distance and the second distance is determined under the boundary condition that the third distance is equal to the fourth distance and is not zero, the transformed first load reflection factor and the transformed second load reflection factor are varied, the complex conjugate of the first source reflection factor, the complex conjugate of the second source reflection factor, the first value, and the second value have fixed values, and the value of the third distance associated with the minimum is set as the distance value, the value of the transformed first load reflection factor associated with the minimum is set as the third value, and the value of the transformed second load reflection factor associated with the minimum is set as the fourth value,

* * * * *